United States Patent
Okumura et al.

(10) Patent No.: US 10,866,521 B2
(45) Date of Patent: Dec. 15, 2020

(54) EXPOSURE APPARATUS AND EXPOSURE METHOD

(71) Applicant: TOPPAN PRINTING CO., LTD., Tokyo (JP)

(72) Inventors: Akihito Okumura, Tokyo (JP); Yoshinori Motoda, Tokyo (JP); Hiroaki Miyaji, Tokyo (JP)

(73) Assignee: TOPPAN PRINTING CO.. LTD., Tokyo (JP)

( * ) Notice: Subject to any disclaimer, the term of this patent is extended or adjusted under 35 U.S.C. 154(b) by 0 days.

(21) Appl. No.: 16/722,403

(22) Filed: Dec. 20, 2019

(65) Prior Publication Data

US 2020/0124974 A1    Apr. 23, 2020

Related U.S. Application Data

(63) Continuation of application No. PCT/JP2018/026490, filed on Jul. 13, 2018.

(30) Foreign Application Priority Data

Jul. 25, 2017 (JP) ................................ 2017-143443
Jul. 25, 2017 (JP) ................................ 2017-143490

(51) Int. Cl.
G03F 7/20    (2006.01)

(52) U.S. Cl.
CPC .................................. *G03F 7/7015* (2013.01)

(58) Field of Classification Search
CPC ............... G03F 7/7015; G03F 7/70733; G03F 7/70258; G03F 7/70225

(Continued)

(56) References Cited

U.S. PATENT DOCUMENTS

| | | | | |
|---|---|---|---|---|
| 6,552,775 B1* | 4/2003 | Yanagihara | ......... | G03F 7/70225 250/492.2 |
| 2002/0012109 A1* | 1/2002 | Suzuki | ............... | G03F 7/70258 355/53 |
| 2004/0036846 A1* | 2/2004 | Nishi | .................. | G03F 7/70733 355/18 |

FOREIGN PATENT DOCUMENTS

| | | |
|---|---|---|
| JP | 10-62809 A | 3/1998 |
| JP | 11-160887 A | 6/1999 |
| | (Continued) | |

OTHER PUBLICATIONS

International Search Report for PCT/JP2018/026490 dated Oct. 9, 2018 (PCT/ISA/210).

*Primary Examiner* — Hung Nguyen
(74) *Attorney, Agent, or Firm* — Sughrue Mion, PLLC

(57) ABSTRACT

An exposure apparatus includes: a first light source that generates first exposure light, a diaphragm having plurality of openings positioned between the first light source and an exposure photomask, a plurality of first projection optical systems that individually project an optical image realized by the first exposure light transmitted through each of the plurality of openings on an exposure target, a second light source that generates second exposure light, and a correction stepper. The correction stepper irradiates a light amount correction region with the second exposure light so as to limit an irradiation range of the exposure target to be irradiated with the second exposure light transmitted through the exposure photomask, and the light amount correction region is a region extending in a first direction by a width of a multi-opening region in a second direction in a plan view.

12 Claims, 29 Drawing Sheets

(58) Field of Classification Search
USPC .................................. 355/52, 53, 55, 67–71
See application file for complete search history.

(56) References Cited

FOREIGN PATENT DOCUMENTS

| | | |
|---|---|---|
| JP | 2000-331909 A | 11/2000 |
| JP | 2002-258489 A | 9/2002 |
| JP | 2016-001258 A | 1/2016 |

\* cited by examiner

EXPOSURE APPARATUS AND EXPOSURE METHOD

CROSS REFERENCE TO RELATED APPLICATIONS

This application is a continuation application based on a PCT Patent Application No. PCT/JP2018/026490, filed Jul. 13, 2018, whose priority is claimed on Japanese Patent Application No. 2017-143443 filed on Jul. 25, 2017, and Japanese Patent Application No. 2017-143490 filed on Jul. 25, 2017, the contents of which are hereby incorporated by reference in their entirety.

BACKGROUND OF THE INVENTION

Field of the Invention

The present invention relates to an exposure apparatus and an exposure method.

Description of the Related Art

For example, scanning exposure apparatuses are known as apparatuses forming a pattern on a large-sized substrate used in liquid crystal apparatuses and the like.

Examples of such a scanning exposure apparatus include an exposure apparatus disclosed in Japanese Unexamined Patent Application, First Publication No. H11-160887 (hereinbelow, referred to as Patent Document 1).

In the exposure apparatus disclosed in Patent Document 1, a mask is illuminated with illumination light, and a plate which is an exposure subject is exposed to an image of a pattern formed on the mask using a plurality of projection optical systems.

The mask and the plate can move synchronously in an X direction with respect to the projection optical systems at the same velocity. The projection optical systems are individually constituted of upright equal-magnification actual image forming systems and are arranged in a staggered arrangement in a Y direction orthogonal to the X direction.

Illumination light passes through a plurality of field diaphragms arranged on optical axes of the projection optical systems and the mask is irradiated with the illumination light. Each field diaphragm has a shape of a parallelogram in which two sides face each other in the X direction. In each field diaphragm, opposite sides in the Y direction are disposed to have an overlapping positional relationship when viewed in the X direction (scanning direction).

Each projection optical system projects an image of the pattern formed on the mask on the plate as a plurality of parallelogrammic optical images arranged in a staggered arrangement in a plan view. However, the mask and the plate move in the X direction with respect to each of the projection optical systems, such that each optical image is scanned on a surface of the plate in the X direction. Therefore, when the scanning in the X direction ends, the plate has been subjected to an exposure using an image of the entire surface of the mask.

In such an exposure apparatus, a first region and a second region are generated in the scanning direction. In the first region, an exposure is performed using light which has passed through a single field diaphragm. In the second region, an exposure is performed using light which has passed through two field diaphragms adjacent to each other in the Y direction. The shape and the arrangement of each field diaphragm are set such that a scanning exposure amount in the first region and a scanning exposure amount in the second region become equivalent to each other.

In the exposure apparatus of Patent Document 1, an illumination intensity of illumination light is also controlled by an illuminance sensor such that light intensities become uniform on the field diaphragms.

In such an exposure apparatus, a pattern formed on a mask is exactly copied on a plate, and therefore the pattern on the mask is duplicated on the plate.

In a projection exposure method disclosed in Japanese Unexamined Patent Application, First Publication No. H10-62809 (hereinbelow, referred to as Patent Document 2), an object of a scanning exposure apparatus is to curb "image separation" caused by an overlapping error in projection regions of projection optical systems. Therefore, Patent Document 2 discloses that a pattern drawing position of a reticle and a transportation position of a substrate are shifted by a predetermined amount from each other in a direction perpendicular to optical axes of the optical systems and perpendicular to a scanning direction.

However, in the conventional scanning exposure apparatuses as described above, manufacturing errors occur between a pattern on a mask and an exposure pattern on a plate due to various factors.

For example, when a mask has a lattice pattern having high uniformity, even if there is a fluctuation which is unlikely to be visually recognized even if line widths of the individual patterns are compared to each other, there are cases where the line widths in a certain region have changed entirely. In this case, there is a possibility of occurrence of unevenness of gradations of color in the lattice pattern which can be easily visually recognized. For example, such unevenness is likely to be visually recognized particularly in a black matrix pattern or the like of a color filter used in liquid crystal apparatuses.

Therefore, it is preferable to curb a fluctuation in line width or the like of a pattern generated in a scanning direction of an exposure apparatus.

The inventors of this application have discovered a phenomenon in which unevenness of density of a pattern occurs at a pitch corresponding to a disposition pitch of field diaphragms even though exposure light amounts corresponding to the field diaphragms exactly match in a scanning exposure apparatus as described above. The inventors have intensively investigated this phenomenon and have found that this unevenness of density occurs because the line width of a pattern becomes slightly narrower in a belt-shaped region extending in the scanning direction. Moreover, it has also been found that a region in which unevenness of density occurs is a joining region where exposure regions of adjacent field diaphragms overlap each other.

This is a problem that is unique to a scanning exposure apparatus using a plurality of projection optical systems. For example, since the demand for higher definition of liquid crystal apparatuses is increasing, there is a strong demand for a technology in which such unevenness of line width is further reduced.

For example, unevenness of density in such a joining region is a phenomenon different from "image separation" in Patent Document 2, and it cannot be resolved by a method disclosed in Patent Document 2.

SUMMARY OF THE INVENTION

The present invention has been made in consideration of such a problem, and an object thereof is to provide an exposure apparatus and an exposure method in which unevenness of exposure caused by joining of exposure regions can be reduced when a plurality of projection optical systems arranged in a staggered arrangement are used.

In order to solve the foregoing problem, according to a first aspect of the present invention, there is provided an exposure apparatus including a first light source that generates first exposure light, a diaphragm having a plurality of openings that are formed thereon and arranged in a staggered arrangement with respect to a first axis as a center in a plan view, the plurality of openings being positioned between the first light source and an exposure photomask, a plurality of first projection optical systems that are disposed while respectively facing the plurality of openings of the diaphragm and individually project an optical image realized by the first exposure light transmitted through each of the plurality of openings on an exposure target, a second light source that is disposed adjacent to the first light source in a first direction along the first axis and generates second exposure light with which the exposure photomask is irradiated, and a correction stepper that is disposed on an optical path of the second exposure light between the exposure photomask and the exposure target. Opening widths of the plurality of openings in the first direction are uniform in a second direction along a second axis intersecting the first axis in a plan view. In the diaphragm, multi-opening regions in which two openings of the plurality of openings are adjacent to each other with a space therebetween in the first direction and single opening regions in which one opening of the plurality of openings opens in the first direction are formed alternately in the second direction. The correction stepper irradiates a light amount correction region with the second exposure light so as to limit an irradiation range of the exposure target to be irradiated with the second exposure light transmitted through the exposure photomask, and the light amount correction region is a region extending in the first direction by a width of the multi-opening region in the second direction in a plan view.

In the exposure apparatus of the first aspect, the correction stepper may perform irradiation of the second exposure light such that an integrated light amount of the second exposure light in the first direction in the light amount correction region becomes higher at a center than at both ends of the light amount correction region in the second direction.

In the exposure apparatus of the first aspect, the correction stepper may include a second projection optical system that projects the second exposure light toward the exposure target, and a light transmission amount restrictor that restricts the second exposure light within a range of the light amount correction region between the exposure photomask and the exposure target.

In the exposure apparatus of the first aspect, the light transmission amount restrictor may be disposed between the second projection optical system and the exposure target.

In the exposure apparatus of the first aspect, the light transmission amount restrictor may include a light attenuation filter.

In the exposure apparatus of the first aspect, the light transmission amount restrictor may include an opening diaphragm.

In the exposure apparatus of the first aspect, the light transmission amount restrictor may include a liquid crystal shutter.

According to a second aspect of the present invention, there is provided an exposure method including preparing a diaphragm having a plurality of openings that are formed thereon and arranged in a staggered arrangement with respect to a first axis as a center in a plan view, performing relative scanning in a first direction along a first axis with respect to an exposure photomask and an exposure target using first exposure light transmitted through the plurality of openings of the diaphragm, thereby performing a first exposure that projects an optical image of the exposure photomask realized by the first exposure light on the exposure target, and irradiating the exposure photomask with second exposure light before or after the first exposure and performing relative scanning in the first direction with respect to the exposure photomask and the exposure target using the second exposure light transmitted through the exposure photomask, thereby performing a second exposure that projects an optical image of the exposure photomask realized by the second exposure light on the exposure target. Opening widths of the plurality of openings in the first direction are uniform in a second direction along a second axis intersecting the first axis in a plan view. In the diaphragm, multi-opening regions in which two openings of the plurality of openings are adjacent to each other with a space therebetween in the first direction and single opening regions in which one opening of the plurality of openings opens in the first direction are formed alternately in the second direction. When the second exposure is performed, the exposure target is irradiated with the second exposure light so as to limit a light amount correction region which is a region extending in the first direction by a width of the multi-opening region in the second direction in a plan view.

According to a third aspect of the present invention, there is provided an exposure apparatus including a light source that generates exposure light, a diaphragm having a plurality of openings that are formed thereon and arranged in a staggered arrangement with respect to a first axis as a center in a plan view, the plurality of openings being positioned between the light source and an exposure photomask, a plurality of projection optical systems which are disposed while respectively facing the plurality of openings of the diaphragm and individually project an optical image realized by the exposure light transmitted through each of the plurality of openings on an exposure target, and a light transmission amount reducer that is disposed on an optical path of the exposure light between the light source and the exposure target. Opening widths of the plurality of openings in a first direction along the first axis are uniform in a second direction along a second axis intersecting the first axis in a plan view. In the diaphragm, multi-opening regions in which two openings of the plurality of openings are adjacent to each other with a space therebetween in the first direction and single opening regions in which one opening of the plurality of openings opens in the first direction are formed alternately in the second direction. The light transmission amount reducer reduces a light amount of the exposure light with which light amount correction regions on the exposure target respectively overlapping at least the single opening regions in a plan view are irradiated.

In the exposure apparatus of the third aspect, the light transmission amount reducer may include a first light transmission amount reducer that reduces the light amount of the exposure light with which first light amount correction regions on the exposure target overlapping at least the single opening regions in a plan view are irradiated, and a second light transmission amount reducer that is provided adjacent to the first light transmission amount reducer in the second direction and reduces the light amount of the exposure light with which second light amount correction regions on the exposure target overlapping the multi-opening regions in a plan view are irradiated.

In the exposure apparatus of the third aspect, the first light transmission amount reducer may include a uniform density filter that uniformly decreases a transmittance of the exposure light. The second light transmission amount reducer may include a gradient density filter that increases the transmittance of the exposure light while being away from a part adjacent to the first light transmission amount reducer in the second direction.

In the exposure apparatus of the third aspect, the light transmission amount reducer may be disposed between the projection optical systems and the exposure target.

According to a fourth aspect of the present invention, there is provided an exposure method including preparing a diaphragm having a plurality of openings that are formed thereon and arranged in a staggered arrangement with respect to a first axis as a center in a plan view, and performing relative scanning in a first direction along a first axis with respect to an exposure photomask and an exposure target using exposure light transmitted through the plurality of openings of the diaphragm, thereby performing an exposure that projects an optical image of the exposure photomask realized by the exposure light on the exposure target. Opening widths of the plurality of openings in the first direction are uniform in a second direction along a second axis intersecting the first axis in a plan view. In the diaphragm, multi-opening regions in which two openings of the plurality of openings are adjacent to each other with a space therebetween in the first direction and single opening regions in which one opening of the plurality of openings opens in the first direction are formed alternately in the second direction. When the exposure is performed, a light amount of the exposure light with which light amount correction regions on the exposure target respectively overlapping at least the single opening regions in a plan view are irradiated is reduced by a light transmission amount reducer that is disposed on an optical path of the exposure light between a light source generating the exposure light and the exposure target.

Effects of the Invention

According to the exposure apparatus and the exposure method of the present invention, unevenness of exposure caused by joining of exposure regions can be reduced when a plurality of projection optical systems arranged in a staggered arrangement are used.

DETAILED DESCRIPTION OF THE INVENTION

Hereinafter, embodiments of the present invention will be described with reference to the accompanying drawings. In all the drawings, even in cases of different embodiments, the same reference signs are applied to members which are the same or corresponding, and common description will be omitted.

First Embodiment

An exposure apparatus according to a first embodiment of the present invention will be described.

Figure 1:
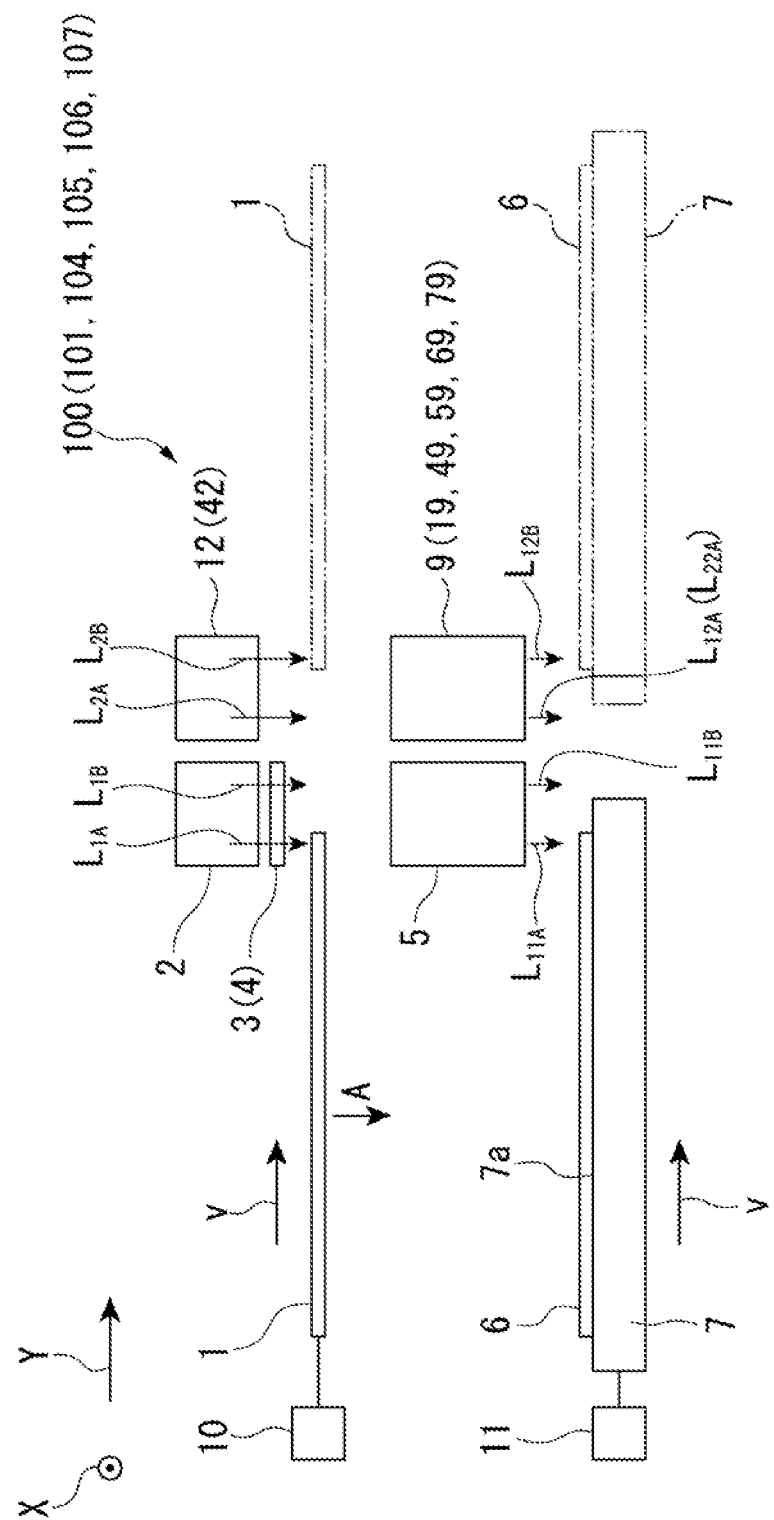
FIG. 1 is a schematic front view showing an example of an exposure apparatus of a first embodiment of the present invention.
Figure 2:
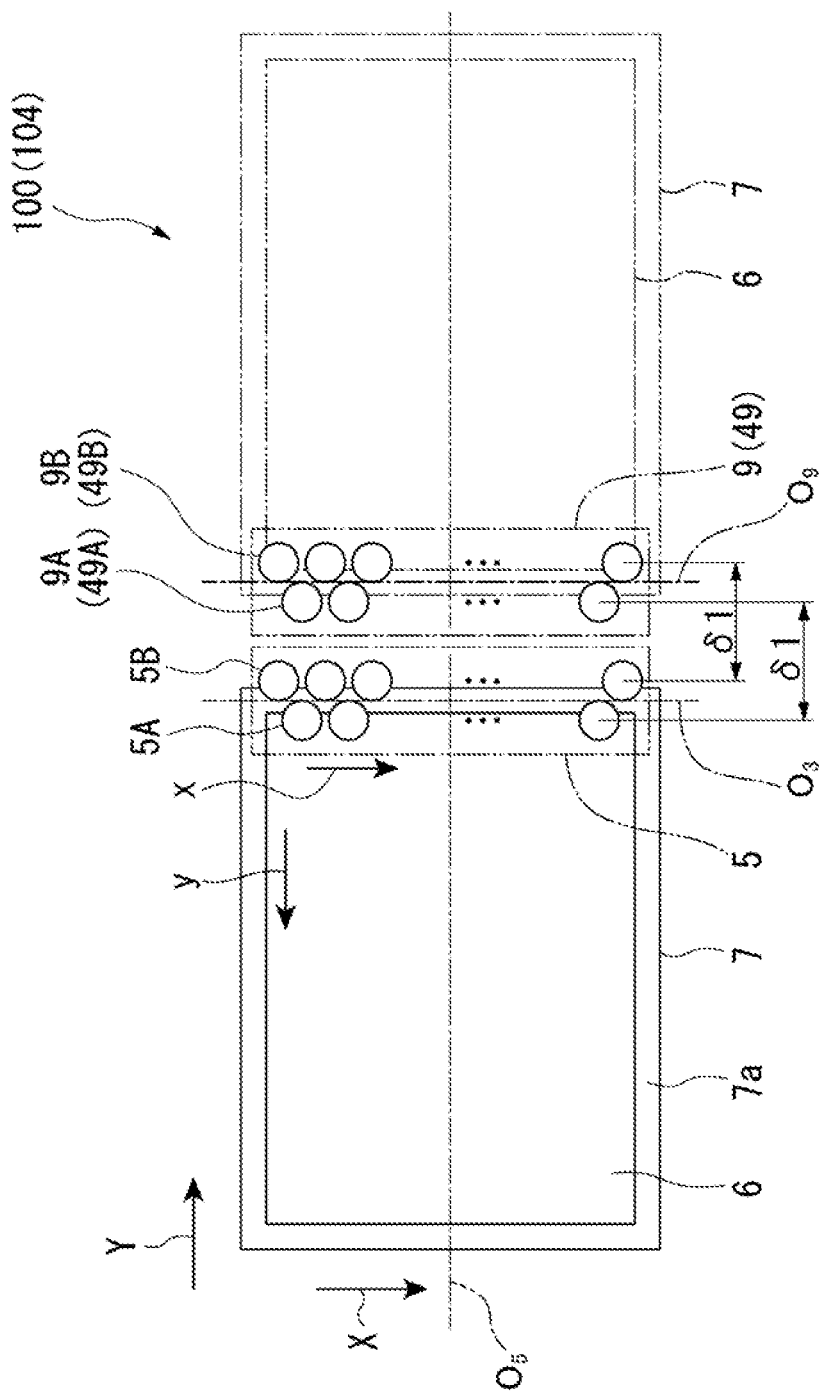
FIG. 2 is a plan view viewed in a direction of an arrow A in FIG. 1.
Figure 3:
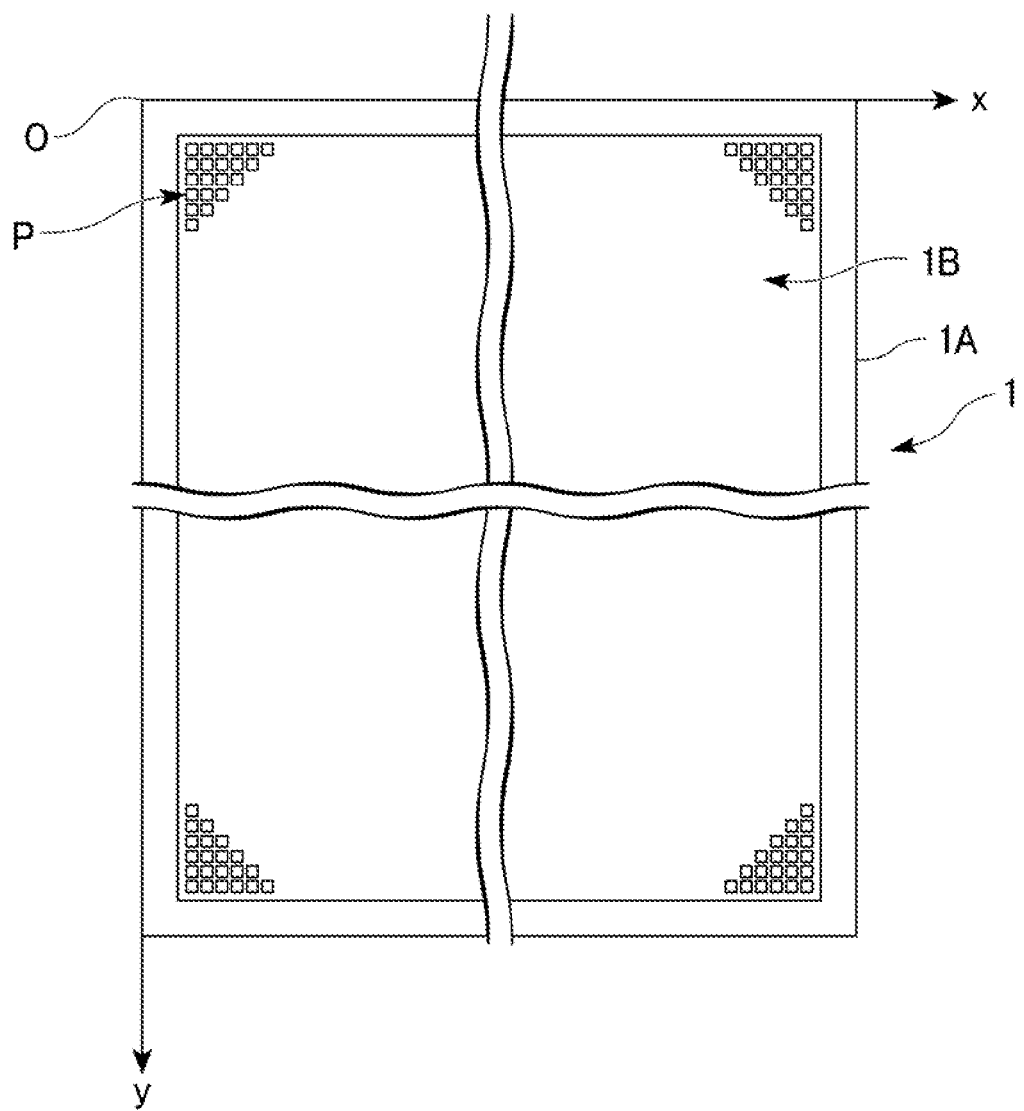
FIG. 3 is a schematic plan view showing an example of an exposure photomask used in the exposure apparatus of the first embodiment of the present invention.
Figure 4:
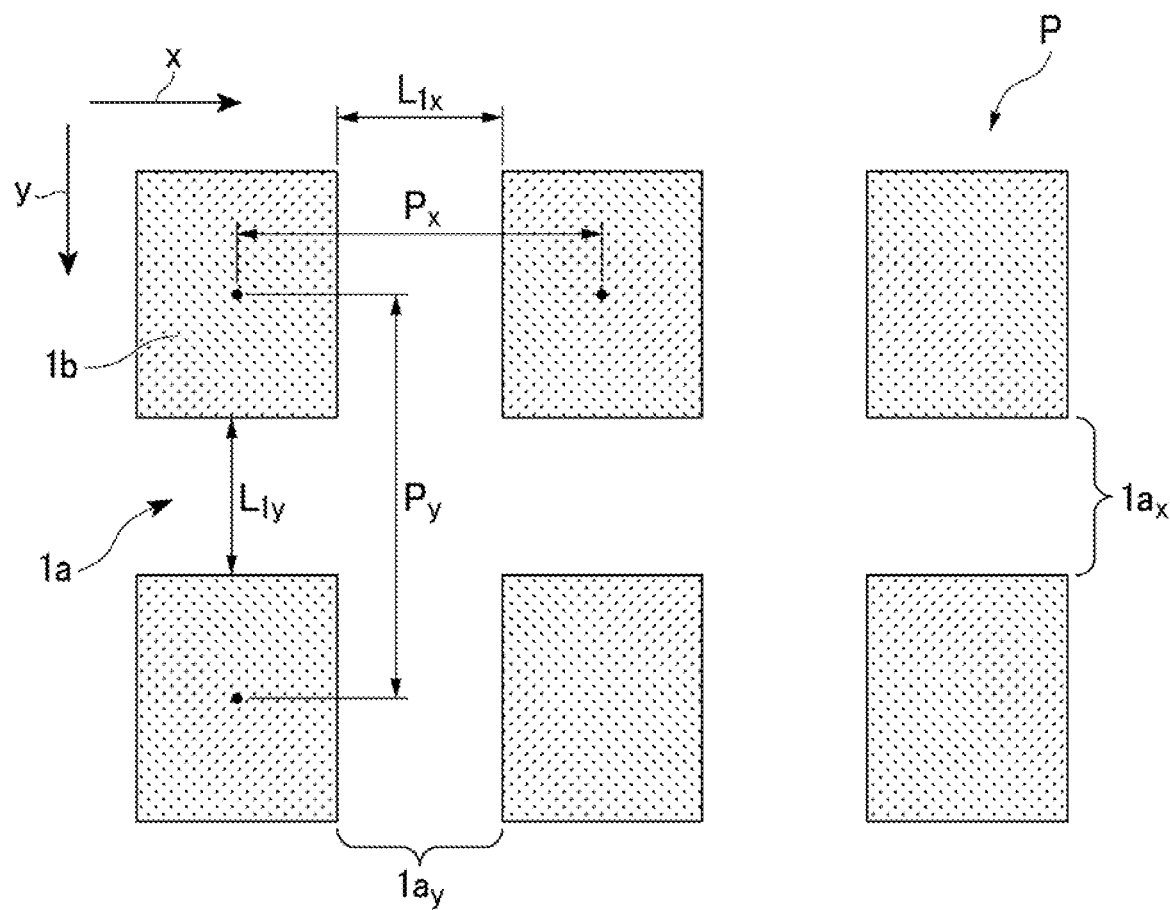
FIG. 4 is an enlarged schematic view showing an example of a mask pattern of the exposure photomask used in the exposure apparatus of the first embodiment of the present invention.
Figure 5A:
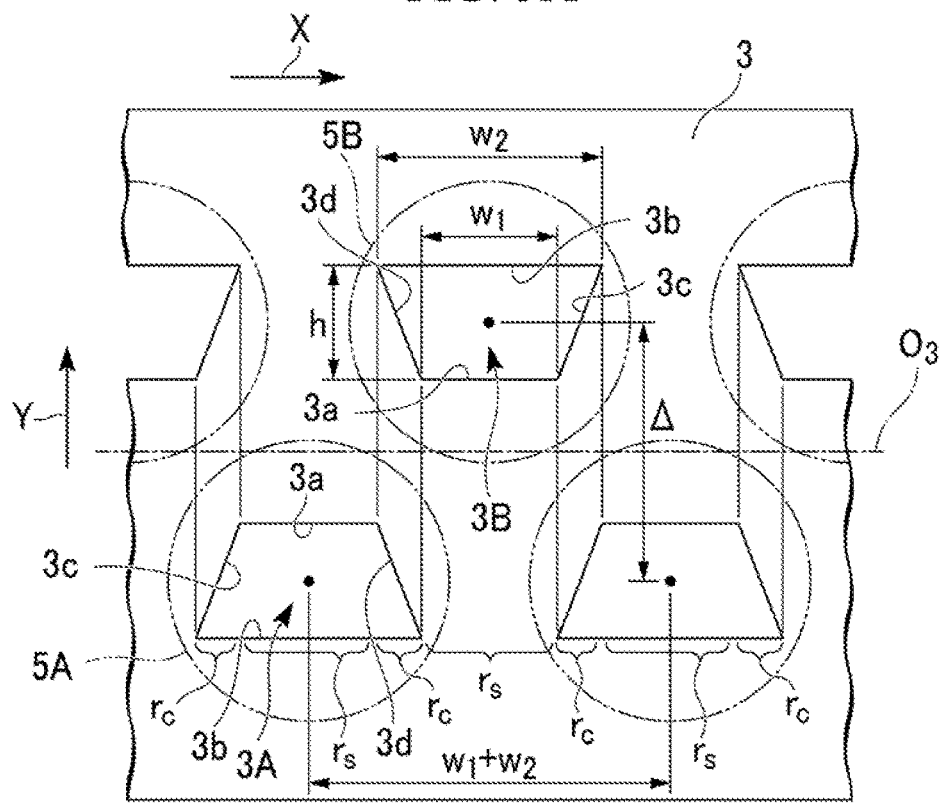
FIG. 5A is a schematic plan view showing an example of a field diaphragm used in the exposure apparatus of the first embodiment of the present invention.
Figure 5B:
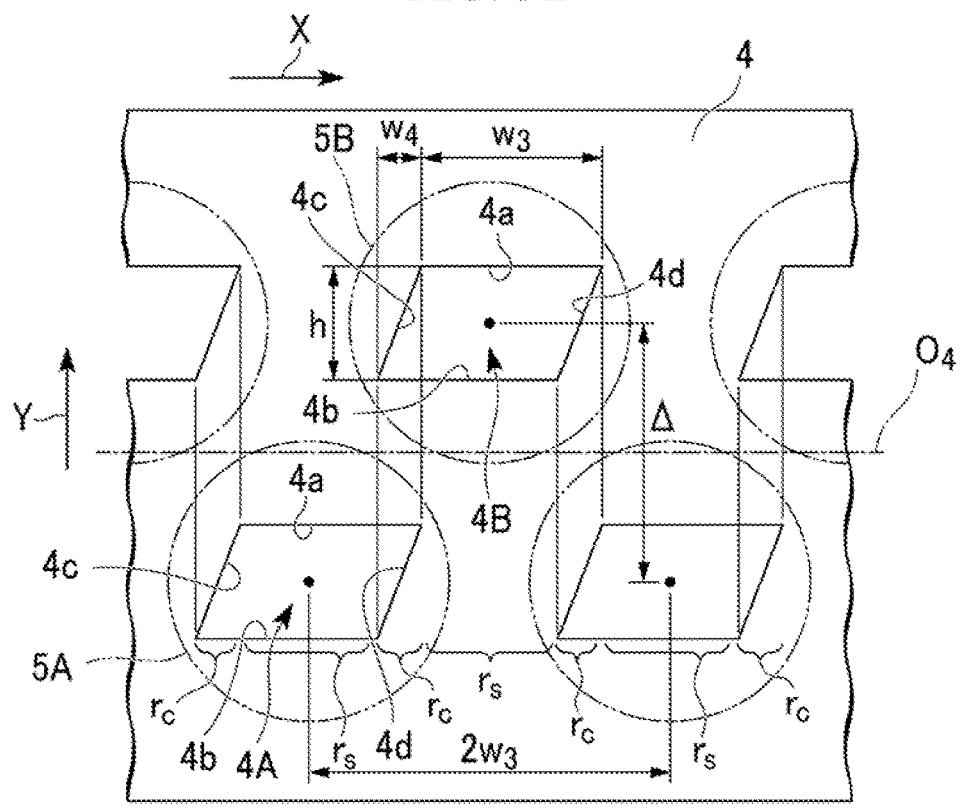
FIG. 5B is a schematic plan view showing a modification example of the field diaphragm.

FIG. 1 is a schematic front view showing an example of the exposure apparatus of the first embodiment of the present invention. FIG. 2 is a plan view viewed in a direction of an arrow A in FIG. 1. FIG. 3 is a schematic plan view showing an example of an exposure photomask used in the exposure apparatus of the first embodiment of the present invention. FIG. 4 is an enlarged schematic view showing an example of a mask pattern of the exposure photomask used in the exposure apparatus of the first embodiment of the present invention. FIGS. 5A and 5B are schematic plan views showing examples of a field diaphragm used in the exposure apparatus of the first embodiment of the present invention.

An exposure apparatus 100 shown in FIGS. 1 and 2 is a scanning exposure apparatus performing an equal-magnification scanning exposure on an exposure subject 6 (exposure target) with an exposure pattern of a photomask 1 (exposure photomask) using a plurality of projection optical systems.

An example of the photomask 1 will be described before a detailed constitution of the exposure apparatus 100 is described.

As shown in FIG. 3, the photomask 1 includes a light transmissive substrate 1A and a mask 1B.

Regarding the light transmissive substrate 1A, it is possible to use a suitable substrate which has light transmitting properties such that illumination light of the exposure apparatus 100 can be transmitted therethrough. For example, the light transmissive substrate 1A may be constituted of a glass substrate. The external shape of the light transmissive substrate 1A is not particularly limited. In the example shown in FIG. 3, the light transmissive substrate 1A has a rectangular external shape in a plan view.

The mask 1B includes a mask pattern P which serves as an exposure pattern projected on the exposure subject 6 by the exposure apparatus 100. For example, the mask pattern P is constituted of a patterned light shading layer made of a metal laminated on the light transmissive substrate 1A.

The mask pattern P used in the exposure apparatus 100 for an equal-magnification exposure need only have the same shape as the exposure pattern formed on the exposure subject 6.

The mask pattern P is formed in a two-dimensional manner in a y direction along the long side of the light transmissive substrate 1A and an x direction along the short side of the light transmissive substrate 1A on a surface of the light transmissive substrate 1A.

In order to describe a position of the mask pattern P on the light transmissive substrate 1A, an x-coordinate axis is set in the x direction and a y-coordinate axis is set in the y direction, respectively. In FIG. 3, as an example, the x-coordinate axis and the y-coordinate axis are established with the origin O on one vertex of the external shape of the light transmissive substrate 1A. However, the origin O of an xy coordinate system may be set to a suitable position in the light transmissive substrate 1A.

A specific shape of the mask pattern P is a suitable shape necessary for an exposure pattern.

Hereinafter, as an example of the mask pattern P, an example of a case where a light transmitter has a rectangular lattice shape in a plan view will be described. For example, such a rectangular lattice-shaped exposure pattern may be used to form a black matrix (BM) used in a color filter in a liquid crystal apparatus.

FIG. 4 shows an enlarged view showing the mask pattern P.

In the mask pattern P, a plurality of light shades 1b having a rectangular shape in a plan view are arranged in a rectangular lattice shape in the x direction and the y direction. For example, the arrangement pitch between the light shades 1b in the x direction is indicated with $P_x$ and the arrangement pitch therebetween in the y direction is indicated with $P_y$. For example, when the photomask 1 is a photomask used to form a BM, the pitch $P_x$ ($P_y$) matches the arrangement pitch of sub-pixels in the x direction (y direction).

A light transmitter 1a exposing a surface of the light transmissive substrate 1A (refer to FIG. 3) is formed between the light shades 1b. The light transmitter 1a is divided into a first line shape portion 1ax extending in the x direction and a second line shape portion $1a_y$ extending in the y direction.

The first line shape portion 1ax has a uniform line width $L_{1y}$. In the same manner, the second line shape portion $1a_y$ has a uniform line width $L_{1x}$. For example, when the photomask 1 is a photomask used to form a BM, the line widths $L_{1y}$ and $L_{1x}$ are equivalent to the line widths of the BM in the y direction and the x direction, respectively.

Here, a description will return to the exposure apparatus 100.

As shown in FIGS. 1 and 2, the exposure apparatus 100 includes a base 7, a second driver 11, a first driver 10, a main illumination light source 2 (first light source), a field diaphragm 3 (diaphragm), a projection optical unit 5, an additional exposure illumination light source 12 (second light source), and an additional exposure projection optical unit 9 (correction stepper).

The base 7 has a flat upper surface 7a disposed in a lateral direction (horizontal direction in the present embodiment) such that the exposure subject 6 is placed thereon. As shown in FIG. 1, the base 7 is supported by the second driver 11 such that it can move in a Y direction (first direction, that is, a direction toward the right side from the left side in the diagram) in the lateral direction. A constitution of the second driver 11 is not particularly limited. For example, the second driver 11 may be constituted of a single-axis stage such that it can move in a reciprocating manner in the Y direction. However, the second driver 11 may be constituted such that it can move the base 7 in an X direction (second direction, that is, a direction toward the front from behind the paper in FIG. 1) orthogonal to (intersecting) the Y direction on a horizontal surface.

As shown in FIG. 2, in the present embodiment, the moving direction of the base 7 is a direction along an axis $O_5$ (first axis) extending in the Y direction (direction toward the right from the left in FIG. 2) in the lateral direction.

As indicated by the two-dot dashed line in the diagram, the second driver 11 can move the base 7 to a movement limit in the Y direction and can thereafter return the base 7 to a movement start position by moving it to the opposite side in the Y direction.

The exposure subject 6 is subjected to an exposure by the exposure apparatus 100 with an exposure pattern based on an optical image of the mask pattern P of the photomask 1. The exposure subject 6 is formed to have a rectangular plate shape having a size smaller than the upper surface 7a and equal to or smaller than the photomask 1. The exposure subject 6 is placed on the upper surface 7a such that the longitudinal direction thereof matches the Y direction.

The exposure subject 6 is constituted on a suitable substrate coated with a photosensitive resist for performing photolithography.

As shown in FIG. 1, in the exposure apparatus 100, the photomask 1 is disposed at a position where it faces the exposure subject 6 placed on the base 7 in an up-down direction (vertical direction in the present embodiment). The photomask 1 is supported by a supporter (not shown in figures) provided to be able to be driven by the first driver 10. The first driver 10 can move the supporter (not shown in figures) synchronously with the base 7 in parallel in the lateral direction such that a uniform gap is maintained between the supporter and the upper surface 7a of the base 7. In the first driver 10, similar to the second driver 11, a single-axis stage in which it can move in the Y direction, a dual-axis stage in which it can move in the X and Y directions, or the like may be used.

In the photomask 1 in the exposure apparatus 100, the positive direction of the y-coordinate axis is a direction opposite to the Y direction, and the x-coordinate axis is disposed along the X direction.

For an exposure of the exposure subject 6, the main illumination light source 2 generates illumination light (first exposure light) having a wavelength such that a resist on the exposure subject 6 is subjected to an exposure. The main illumination light source 2 is fixed and supported by a support member (not shown in figures) above a movement region of the photomask 1. The main illumination light source 2 performs irradiation of illumination light downward.

The field diaphragm 3 is disposed between the main illumination light source 2 and the movement region of the photomask 1 in the up-down direction. The field diaphragm 3 is fixed and supported by a support member (not shown in figures). The field diaphragm 3 shapes illumination light of the main illumination light source 2 and divides the illumination light for each of a plurality of illumination regions.

As shown in FIG. 5A, the field diaphragm 3 has a plurality of first openings (openings) 3A and a plurality of second openings (openings) 3B. The plurality of first openings 3A are arranged at a pitch of $w_1+w_2$ (here, $w_1<w_2$) in the X direction. The plurality of second openings 3B are arranged at a pitch of $w_1+w_2$ in the X direction on an axis shifted in parallel with respect to the plurality of first openings 3A in the Y direction by Δ (here, Δ>h/2).

In a plan view, the first opening 3A has a shape of an isosceles trapezoid of which the apex angle is not a right angle. The first opening 3A is constituted of a first side 3a, a second side 3b, a third side 3c, and a fourth side 3d. The first side 3a is the upper base of the isosceles trapezoid, and the second side 3b is the lower base of the isosceles trapezoid. The lengths of the first side 3a and the second side 3b are $w_1$ and $w_2$, respectively. The first side 3a and the second side 3b are disposed parallel to each other and are separated from each other in the Y direction by a height h of the isosceles trapezoid. The third side 3c and the fourth side 3d are legs of the isosceles trapezoid disposed in the X direction in this order.

In a plan view, the shape of the second opening 3B is a shape of the first opening 3A rotated by 180°. The position of the second opening 3B in the X direction is shifted with respect to the first opening 3A by $(w_1+w_2)/2$. Therefore, the second opening 3B is disposed at a position facing an intermediate point between two first openings 3A in the X direction.

Due to such disposition, the first openings 3A and the second openings 3B are arranged in a staggered arrangement along an axis $O_3$ (second axis) extending in the X direction.

When viewed in the Y direction, the third sides 3c and the fourth sides 3d in the first openings 3A and the second openings 3B overlap each other. When viewed in the Y direction, an end of the first side 3a (second side 3b) in the first opening 3A and an end of the second side 3b (first side 3a) in the second opening 3B are at the same position.

When the field diaphragm 3 is viewed in the Y direction, a region in which only one of the first opening 3A and the second opening 3B opens is referred to as a single opening region $r_S$. In the single opening region $r_S$, the opening width of the first opening 3A or the second opening 3B in the Y direction is uniform in the X direction. That is, the opening width of the single opening region $r_S$ in the Y direction is the height h of the isosceles trapezoid.

When viewed in the Y direction, a region in which both the first opening 3A and the second opening 3B open is referred to as a multi-opening region $r_C$. In the multi-opening regions $r_C$, the first opening 3A and the second opening 3B are adjacent to each other in the Y direction with a space therebetween. In the multi-opening regions $r_C$, the first opening 3A and the second opening 3B open in the Y direction. The total opening width thereof is equivalent to the height h of the isosceles trapezoid and is uniform in the X direction.

In this manner, the opening width of the single opening region $r_S$ in the Y direction and the total opening width of the multi-opening regions $r_C$ in the Y direction are equivalent to the height h of the isosceles trapezoid and are uniform in the X direction. Hereinafter, there are cases where the height h of the isosceles trapezoid is referred to as the opening width (amount of opening) h.

The single opening region $r_S$ and the multi-opening regions $r_C$ are disposed alternately in the X direction.

In the field diaphragm 3, the width of the single opening region $r_S$ in the X direction is $w_1$, and the width of the multi-opening region $r_C$ in the X direction is $(w_2-w_1)/2$.

Regarding the shapes and the dispositions of the first openings 3A and the second openings 3B in the field diaphragm 3, they may be set to have a suitable size in accordance with conditions or the like of arrangement of the projection optical unit 5, which will be described below. The following is specific dimensional examples related to the first opening 3A and the second opening 3B.

For example, $(w_2-w_1)/2$ may be within a range of 14 mm to 18 mm. For example, the opening width h may be within a range of 25 mm to 45 mm. For example, $(w_1+w_2)/2$ may be within a range of 95 mm to 100 mm. For example, A may be within a range of 200 mm to 300 mm.

For example, the field diaphragm 3 of the exposure apparatus 100 may be replaced with a field diaphragm 4 shown in FIG. 5B.

The field diaphragm 4 has a plurality of first openings (openings) 4A and a plurality of second openings (openings) 4B. The plurality of first openings 4A are arranged at a pitch of $2w3$ in the X direction. The plurality of second openings 4B are arranged at a pitch of $2w2$ in the X direction on an axis shifted in parallel with respect to the plurality of first openings 4A in the Y direction by Δ.

In a plan view, the first opening 4A has a shape of a parallelogram of which the apex angle is not a right angle. The first opening 4A is constituted of a first side 4a, a second side 4b, a third side 4c, and a fourth side 4d. The first side 4a and the third side 4c are opposite sides in the Y direction. The third side 4c and the fourth side 4d are opposite sides in the X direction. The length of each of the first side 4a and the second side 4b is $w_3$. The width of each of the right-angled triangles in the X direction having the third side 4c and the fourth side 4d is $w_4$ (here, $w_4<w_3$).

In a plan view, the shape of the second opening 4B is the same as that of the first opening 4A. The position of the second opening 4B in the X direction is shifted with respect to the first opening 4A by $w_3$. Therefore, the second opening 4B is disposed at a position facing an intermediate point between two first openings 4A in the X direction.

Due to such disposition, the first openings 4A and the second openings 4B are arranged in a staggered arrangement along an axis $O_4$ (second axis) extending in the X direction.

When viewed in the Y direction, the third sides 4c (fourth sides 4d) in the first openings 4A and the fourth sides 4d (third sides 4c) in the second openings 4B overlap each other, respectively. When viewed in the Y direction, an end of the first side 4a (second side 4b) in the first opening 4A and an end of the first side 4a (second side 4b) in the second opening 4B are at the same position.

When the field diaphragm 4 is viewed in the Y direction, a region in which only one of the first opening 4A and the second opening 4B opens is referred to as the single opening region $r_S$. In the single opening region $r_S$, the opening width of the first opening 4A or the second opening 4B in the Y direction is uniform in the X direction. That is, the opening width of the single opening region $r_S$ in the Y direction is the height h of the parallelogram.

When viewed in the Y direction, a region in which both the first opening 4A and the second opening 4B open is referred to as the multi-opening region $r_C$. In the multi-opening regions $r_C$, the first opening 4A and the second opening 4B are adjacent to each other in the Y direction with a space therebetween. In the multi-opening regions $r_C$, the first opening 4A and the second opening 4B open in the Y direction. The total opening width thereof is equivalent to the height h of the parallelogram and is uniform in the X direction.

In this manner, the opening width of the single opening region $r_S$ in the Y direction and the total opening width of the multi-opening regions $r_C$ in the Y direction are equivalent to the height h of the parallelogram and are uniform in the X direction. Hereinafter, there are cases where the height h of the parallelogram is referred to as the opening width h.

The single opening region $r_S$ and the multi-opening regions $r_C$ are disposed alternately in the X direction.

In the field diaphragm 4, the width of the single opening region $r_S$ in the X direction is $(w_3-w_4)$, and the width of the multi-opening region $r_C$ in the X direction is $w_4$.

Hereinafter, unless otherwise specified, an example of the case where the exposure apparatus 100 includes the field diaphragm 3 will be described.

As shown in FIG. 1, the projection optical unit 5 is disposed above the exposure subject 6 on the base 7. The projection optical unit 5 and the field diaphragm 3 face each other in the up-down direction. The movement region of the photomask 1 is disposed between the projection optical unit 5 and the field diaphragm 3. The projection optical unit 5 is fixed and supported by a support member (not shown in figures).

As shown in FIG. 2, the projection optical unit 5 includes a plurality of first row projection optical systems 5A (projection optical systems, that is, first projection optical systems) and a plurality of second row projection optical systems 5B (projection optical systems, that is, first projection optical systems) which are arranged in a staggered arrangement along the axis $O_3$.

The first row projection optical system 5A (second row projection optical system 5B) is an optical image forming system forming an object image on an image surface as an upright equal-magnification image. The first row projection optical system 5A (second row projection optical system 5B) is disposed at a position where the mask pattern P of the photomask 1 and an upper surface of the exposure subject 6 coated with a resist have a conjugate positional relationship. In the present embodiment, emission light toward the exposure subject 6 from the first row projection optical system 5A (second row projection optical system 5B) forms a parallel luminous flux.

As indicated by the two-dot dashed line in FIG. 5A, the first row projection optical system 5A is disposed below the first opening 3A such that an optical image realized by light transmitted through the first opening 3A can be projected on the exposure subject 6. The second row projection optical system 5B is disposed below the second opening 3B such that an optical image realized by light transmitted through the second opening 3B can be projected on the exposure subject 6.

The first row projection optical system 5A (second row projection optical system 5B) projects an optical image realized by light transmitted through the first opening 3A (second opening 3B) on the exposure subject 6 as an upright equal-magnification image. Therefore, optical images in the single opening region $r_S$ and the multi-opening regions $r_C$ in the first opening 3A (second opening 3B) are also projected on the exposure subject 6 which they face in the up-down direction.

The first row projection optical systems 5A and the second row projection optical systems 5B are disposed with a positional relationship such that they are arranged in a staggered arrangement similar to the first openings 3A and the second openings 3B. Therefore, gaps between the first openings 3A and the second openings 3B have dimensions such that the first row projection optical systems 5A and the second row projection optical systems 5B do not interfere with each other. For example, there are cases where the pitch Δ between the first opening 3A and the second opening 3B in the y direction has a large value within a range from approximately six times to eight times the opening width h in the y direction.

As shown in FIG. 5B, when the field diaphragm 4 is used in place of the field diaphragm 3, the first row projection optical system 5A is disposed below the first opening 4A such that an optical image realized by light transmitted through the first opening 4A can be projected on the exposure subject 6. The second row projection optical system 5B is disposed below the second opening 4B such that an optical image realized by light transmitted through the second opening 4B can be projected on the exposure subject 6.

For an exposure of the exposure subject 6, the additional exposure illumination light source 12 generates illumination light (second exposure light) having a wavelength such that a resist on the exposure subject 6 is subjected to an exposure. The additional exposure illumination light source 12 is disposed above the movement region of the photomask 1. In addition, the additional exposure illumination light source 12 is fixed and supported by a support member (not shown in figures) at a position adjacent to the main illumination light source 2 in the Y direction. The additional exposure illumination light source 12 performs irradiation of illumination light downward.

Although illustration is omitted, the additional exposure illumination light source 12 includes a suitable light shading member. As necessary, the light shading member causes illumination light to be incident on only the projection optical systems of the additional exposure projection optical unit 9, and this will be described below in detail.

As shown in FIG. 1, the additional exposure projection optical unit 9 is disposed above such that it faces the exposure subject 6 on the base 7. The additional exposure projection optical unit 9 is disposed between the exposure subject 6 on the base 7 and the movement region of the photomask 1.

The additional exposure projection optical unit 9 is fixed and supported by a support member (not shown in figures) at a position adjacent to the projection optical unit 5 in the Y direction.

As shown in FIG. 2, the additional exposure projection optical unit 9 includes a plurality of first row projection optical systems 9A and a plurality of second row projection optical systems 9B which are arranged in a staggered arrangement along an axis $O_9$ parallel to the axis $O_3$.

The second row projection optical system 9B differs from the first row projection optical system 9A in only disposition and has a constitution similar to that of the first row projection optical system 9A. Hereinafter, a constitution of the first row projection optical system 9A will be described mainly.

Figure 6:
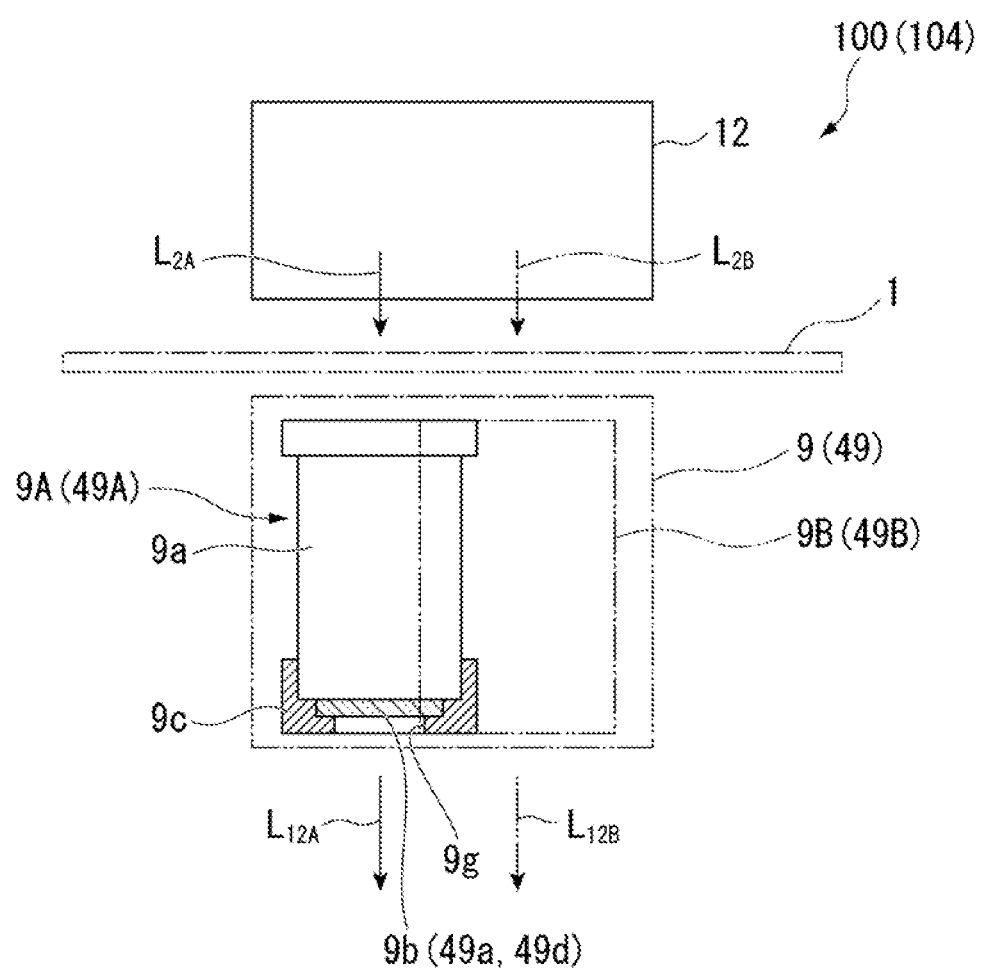
FIG. 6 is a schematic cross-sectional view partially showing an example of a correction stepper used in the exposure apparatus of the first embodiment of the present invention.
Figure 7:
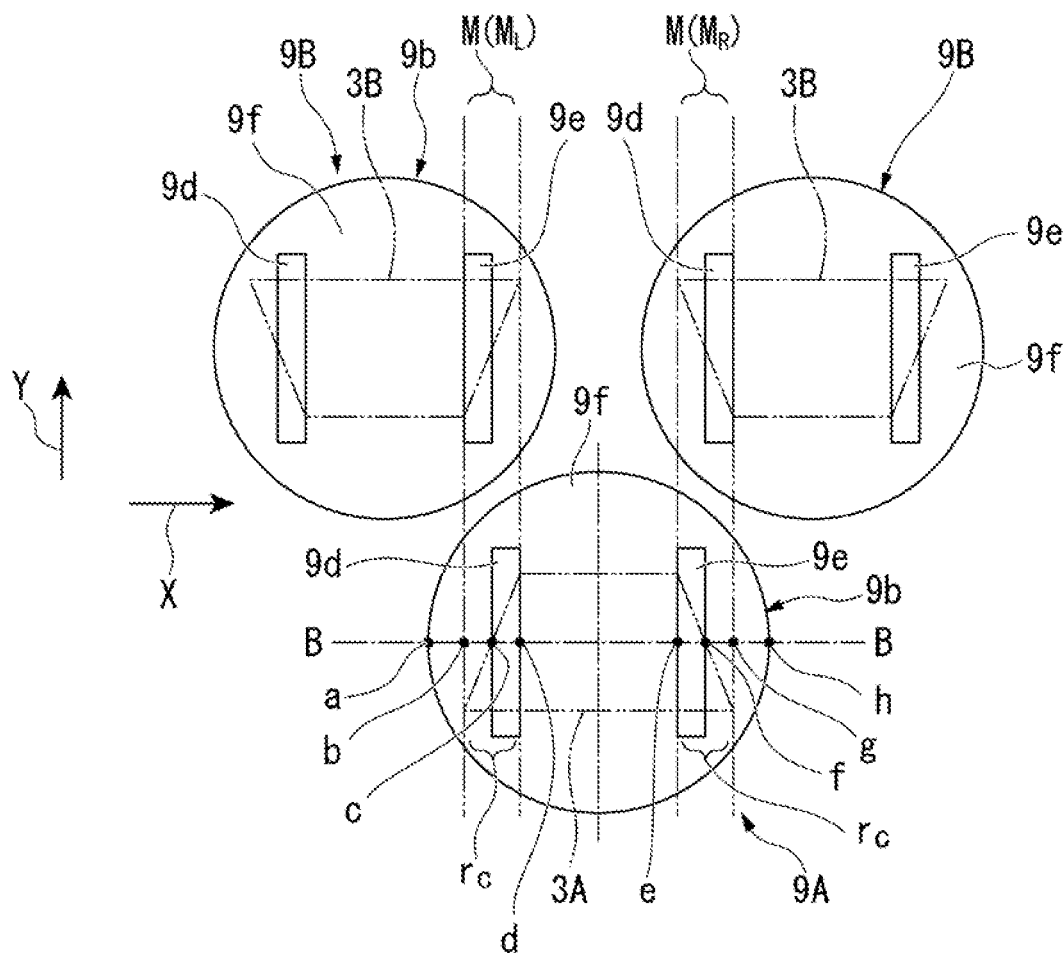
FIG. 7 is a schematic plan view showing an example of a light transmission amount restrictor used in the exposure apparatus of the first embodiment of the present invention.
Figure 8:
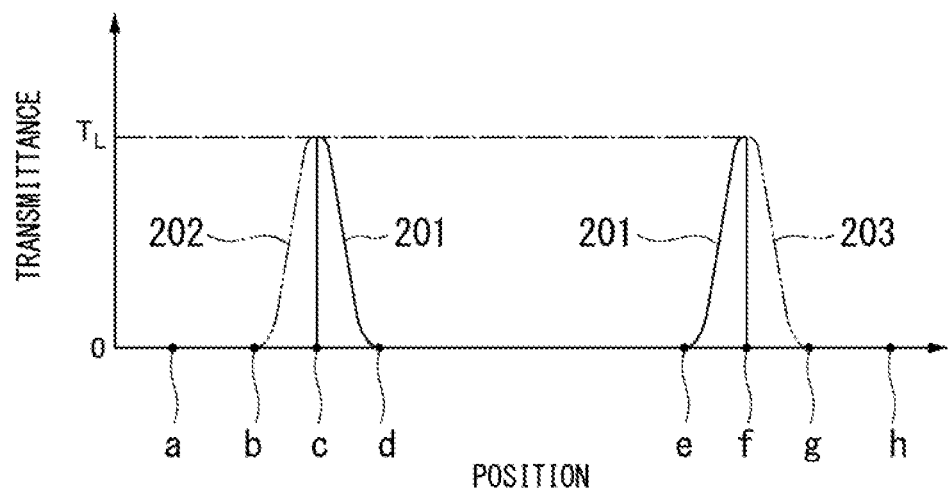
FIG. 8 is a schematic graph showing a transmittance distribution along line B-B in FIG. 7.

FIG. 6 is a schematic cross-sectional view partially showing an example of a correction stepper used in the exposure apparatus of the first embodiment of the present invention. FIG. 7 is a schematic plan view showing an example of a light transmission amount restrictor used in the exposure apparatus of the first embodiment of the present invention. FIG. 8 is a schematic graph showing a transmittance distribution along line B-B in FIG. 7. In FIG. 8, the horizontal axis indicates the position along line B-B, and the vertical axis indicates the transmittance.

As shown in FIG. 6, the first row projection optical system 9A includes a lens unit 9a (second projection optical system), a filter 9b (light transmission amount restrictor, that is, a light attenuation filter), and a filter holder 9c.

The lens unit 9a includes a lens which constitutes an optical image forming system forming an object image on an image surface as an upright equal-magnification image, and a lens barrel which holds the lens. The lens unit 9a is disposed at a position where the mask pattern P of the photomask 1 and the upper surface of the exposure subject 6 coated with a resist have a conjugate positional relationship. In the present embodiment, emission light toward the exposure subject 6 from the lens unit 9a forms a parallel luminous flux.

The lens unit 9a may use a constitution different from that of the first row projection optical system 5A in the projection optical unit 5. However, in the present embodiment, a constitution similar to those of the first row projection optical system 5A and the second row projection optical system 5B is used.

For example, the lens unit 9a of the first row projection optical system 9A may be constituted such that a constitution similar to that of the first row projection optical system 5A is disposed at a position moved in parallel by a distance M (refer to FIG. 2) in the Y direction from the first row projection optical system 5A. Similarly, the lens unit 9a of the second row projection optical system 9B may be constituted such that a constitution similar to that of the second row projection optical system 5B is disposed at a position moved in parallel by the distance δ1 (refer to FIG. 2) in the Y direction from the second row projection optical system 5B.

The filter 9b converts second exposure light $L_{2A}$ ($L_{2B}$) transmitted through the lens unit 9a into second exposure light $L_{12A}$ ($L_{12B}$) with which a light amount correction region M is to be only irradiated on the exposure subject 6.

Here, the light amount correction region M on the exposure subject 6 is a belt-shaped region extending in the Y direction by the width of the multi-opening region $r_C$ in the X direction in a plan view. As shown in FIG. 7, in the light amount correction region M overlapping the filter 9b in a plan view, a light amount correction region $M_L$ is disposed on a negative direction side in the X direction (negative X direction side, that is, one side in the X direction corresponding to the left side in the diagram). In addition, a light amount correction region $M_R$ is disposed on a positive direction side in the X direction (positive X direction side, that is, the other side in the X direction corresponding to the right side in the diagram).

In the present embodiment, as shown in FIG. 7, the filter 9b includes a first light reducer 9d, a second light reducer 9e, and a light shade 9f.

The first light reducer 9d is disposed while being biased to the positive direction side in the X direction (right side in the diagram) in the light amount correction region $M_L$. The width of the first light reducer 9d in the X direction is half the width of the light amount correction region $M_L$ in the X direction.

The second light reducer 9e is disposed while being biased to the negative direction side in the X direction in the light amount correction region $M_R$. The width of the second light reducer 9e in the X direction is half the width of the light amount correction region $M_R$ in the X direction.

Therefore, when viewed in the Y direction, the first light reducer 9d of the filter 9b in the first row projection optical system 9A and the second light reducer 9e of the filter 9b in the second row projection optical system 9B are disposed without overlapping each other such that the width of the light amount correction region M in the X direction is filled without a gap.

Similarly, when viewed in the Y direction, the second light reducer 9e of the filter 9b in the first row projection optical system 9A and the first light reducer 9d of the filter 9b in the second row projection optical system 9B are disposed without overlapping each other such that the width of the light amount correction region M in the X direction is filled without a gap.

The lengths of the first light reducer 9d and the second light reducer 9e in the Y direction need only be within a range of the size of the filter 9b and are not particularly limited.

In the filter 9b, a region excluding the first light reducer 9d and the second light reducer 9e serves as the light shade 9f having a transmittance of 0%.

In the present embodiment, the first light reducer 9d and the second light reducer 9e have transmittance distributions in the X direction as indicated by curves 201 (refer to the solid lines) in FIG. 8.

The reference signs on the horizontal axis in FIG. 8 indicate positions of points of the same reference signs on a line B-B disclosed in FIG. 7.

A point a is an end point of the filter 9b on the negative direction side in the X direction in the line B-B. A section from a point b to a point d is a section overlapping the light amount correction region $M_L$. A section from a point e to the point g is a section overlapping the light amount correction region $M_R$. A point h is an end point of the filter 9b on the positive direction side in the X direction in the line B-B.

The first light reducer 9d is disposed between the point c and the point d. The second light reducer 9e is disposed between the point e and the point f. The light shade 9f is disposed in each of the sections from the point a to the point b, from the point d to the point e, and from the point g to the point h.

As indicated by the curves 201, the transmittance of the first light reducer 9d has a transmittance distribution which reaches a maximum value $T_L$ (100% or smaller) at the point c, decreases gradually toward the point d, and becomes 0% at the point d. The transmittance of the second light reducer 9e has a transmittance distribution which becomes 0% at the point e, increases gradually toward the point f, and reaches the maximum value $T_L$ at the point f.

The rate of change in transmittance of the first light reducer 9d and the second light reducer 9e is set based on an experiment or a simulation, for example, in accordance with necessity of correction of the light amount in the light amount correction region M as described below. The rate of change in transmittance of the first light reducer 9d and the second light reducer 9e may be uniform (linear change) or may change based on a suitable function. The rate of change in transmittance may be monotonous or may be non-monotonous. Moreover, a change in transmittance is not limited to a smooth change. For example, the transmittance may change in a stepped shape.

As shown in FIG. 6, the filter holder 9c holds the filter 9b at a uniform position with respect to the lens unit 9a. A penetration hole 9g, through which the second exposure light $L_{12A}$ ($L_{12B}$) that has been transmitted through at least the first and second light reducers 9d and 9e is transmitted, is formed at the center of the filter holder 9c.

The filter holder 9c is detachably attached to the lens unit 9a from below. A method of attaching/detaching the filter holder 9c need only be able to be disposed such that the first light reducer 9d and the second light reducer 9e of the filter 9b overlap the range of the light amount correction region M described above in a plan view and is not particularly limited. For example, a suitable mount or screw fitting capable of positioning with respect to the lens unit 9a in a circumferential direction may be used. In the present embodiment, since the second exposure light emitted from the lens unit 9a is a parallel luminous flux along the optical axis, position alignment of the filter 9b in the optical axis direction (up-down direction) does not have to be performed with high accuracy.

The filter 9b is held by the filter holder 9c in a state where the position of the filter 9b in the lateral direction is positionally aligned. Accordingly, as described above, the filter 9b is disposed such that the first light reducer 9d and the second light reducer 9e of each filter 9b have a positional relationship overlapping the light amount correction region M in a plan view.

Therefore, as indicated by the curves 201 and a curve 202 (refer to the two-dot dashed line) in FIG. 8, when viewed in the Y direction, in a range overlapping the light amount correction region $M_L$ in the X direction, a mountain-shaped (hanging bell-shaped) transmittance distribution having the peak transmittance $T_L$ is formed at the point c in the second light reducer 9e of the second row projection optical system 9B and the first light reducer 9d of the first row projection optical system 9A. Similarly, as indicated by the curve 201 and a curve 203 (refer to the two-dot dashed line) in FIG. 8, when viewed in the Y direction, in a range overlapping the light amount correction region $M_R$ in the X direction, a mountain-shaped (hanging bell-shaped) transmittance distribution having the peak transmittance $T_L$ is formed at the point f in the second light reducer 9e of the first row projection optical system 9A and the first light reducer 9d of the second row projection optical system 9B.

Next, regarding an operation of the exposure apparatus 100, an exposure method of the present embodiment will be described mainly.

The exposure method of the present embodiment is performed favorably by using the exposure apparatus 100.

The exposure method of the present embodiment includes (1) preparing the exposure apparatus 100 including the field diaphragm 3, (2) performing a first exposure, and (3) performing a second exposure. When the second exposure is performed, the exposure subject 6 is irradiated with the second exposure light so as to limit the light amount correction region M in a plan view.

In the exposure apparatus 100, the first exposure and the second exposure are sequentially performed at each of the positions in the y direction of the exposure subject 6 by moving the photomask 1 and the exposure subject 6 in the Y direction.

First, an exposure operation of the exposure apparatus 100 related to the first exposure will be described. The first exposure is performed using the main illumination light source 2, the field diaphragm 3, and the projection optical unit 5.

Figure 9:
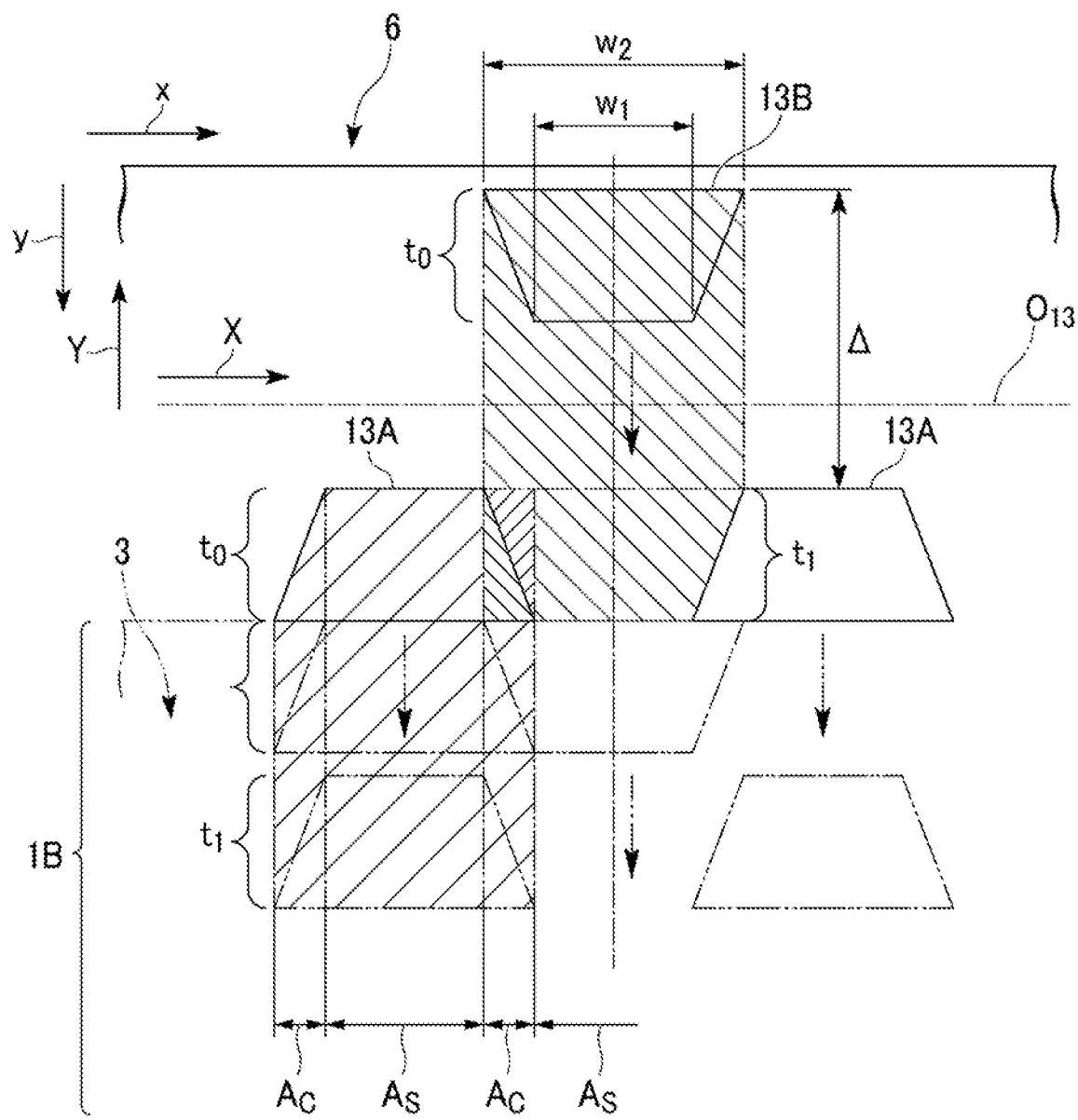
FIG. 9 is a schematic view showing a first exposure in an exposure method of the first embodiment of the present invention.
Figure 10A:
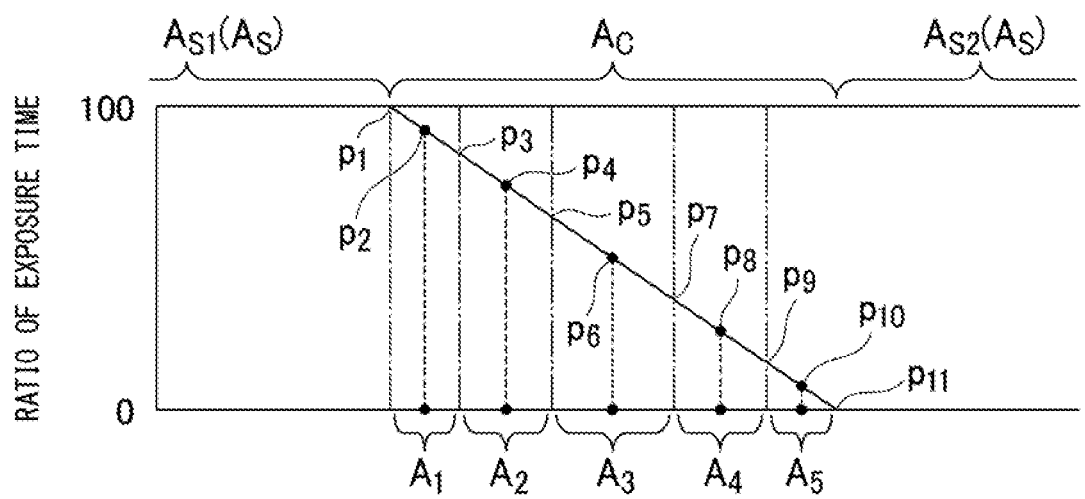
FIG. 10A is a schematic view showing a ratio of an exposure time in the first exposure.
Figure 10B:
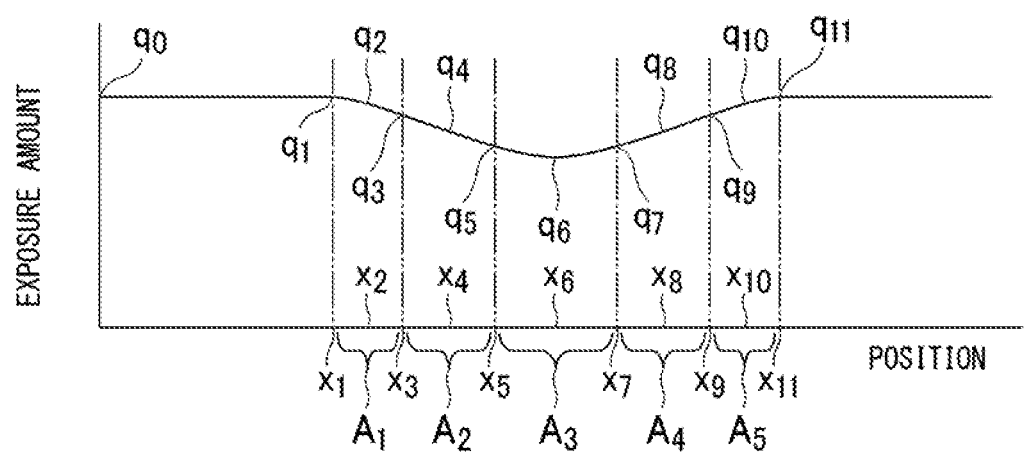
FIG. 10B is a schematic view showing a valid exposure amount in the first exposure.

FIG. 9 is a schematic view showing a first exposure in the exposure method of the first embodiment of the present invention. FIGS. 10A and 10B are schematic explanatory views showing a valid exposure amount in the first exposure.

FIG. 9 shows an enlarged portion of a tip of the exposure subject 6 disposed below the projection optical unit 5. Although it does not appear in the diagram of FIG. 9, the photomask 1 is moved synchronously with the exposure subject 6 in the Y direction in a state of facing the exposure subject 6 between the field diaphragm 3 and the projection optical unit 5 (refer to FIG. 1).

As shown in FIG. 1, when the main illumination light source 2 is turned on, the field diaphragm 3 is irradiated with first exposure light $L_{1A}$ and first exposure light $L_{1B}$. The photomask 1 is irradiated with the first exposure light $L_{1A}$ and the first exposure light $L_{1B}$ transmitted through each of the first openings 3A and each of the second openings 3B of the field diaphragm 3 (refer to FIG. 5A).

Regarding light transmitted through the light transmitter 1a in the photomask 1, light which has passed through the first opening 3A is projected as first exposure light $L_{11A}$ on the exposure subject 6 by the first row projection optical system 5A at equal magnification. Similarly, light which has passed through the second opening 3B is projected as first exposure light $L_{11B}$ on the exposure subject 6 by the second row projection optical system 5B at equal magnification.

As a result, as shown in FIG. 9, a first optical image 13A which is an optical image of the first opening 3A and a second optical image 13B which is an optical image of the second opening 3B are formed on the exposure subject 6. In the first optical image 13A and the second optical image 13B, a luminance distribution of the mask pattern P or the like corresponding to an object image is formed. However, in FIG. 9, for the sake of simplification, illustration of a luminance distribution is omitted.

Similar to the first opening 3A and the second opening 3B, the first optical image 13A and the second optical image 13B are arranged in a staggered arrangement along an axis $O_{13}$ parallel to the x-coordinate axis on the exposure subject 6.

When the base 7 moves in the Y direction, as indicated by the diagonal line in the diagram, each of the first optical images 13A and each of the second optical images 13B sweep a belt-shaped region having a width $w_2$. Therefore, each of the first optical images 13A and each of the second optical images 13B scan the exposure subject 6 from above in the y direction.

However, the first opening 3A and the second opening 3B are shifted by A in the Y direction. Therefore, a region swept using the first optical image 13A and the second optical image 13B at the same time is shifted by the distance $(w_1+w_2)/2$ in the x direction and is shifted by the distance Δ in the y direction.

When a moving velocity of the base 7 is v (refer to FIG. 1), the second optical image 13B arrives late by T=Δ/v at a region in which the first optical image 13A performs scanning in the y direction prior to this.

For example, when a time at which scanning has started is a time $t_0$, the second optical image 13B arrives at a position of the first optical image 13A at the time $t_0$ in the y direction at a time $t_1=t_0+T$. At this time, the second optical image 13B is just fitted into a place between the first optical images 13A adjacent to each other formed at the time $t_0$.

That is, in the time $t_0$, regions in which the first optical images 13A are arranged in the x direction are only subjected to an exposure with a gap therebetween using a plurality of first optical images 13A. At a time $t_1$, a non-stepper of the same region is subjected to an exposure using a plurality of second optical images 13B. Accordingly, a region extending in the x direction is subjected to an exposure with a time difference T in a belt shape without a gap. This is because legs of the isosceles trapezoid in the first optical image 13A and legs of the isosceles trapezoid in the second optical image 13B constitute boundaries of joints of the exposure regions formed by each thereof.

The mask 1B in the photomask 1 in a plan view is positioned on a negative direction side in the Y direction (negative Y direction side, that is, the lower side in the diagram) of the second side 3b of the first opening 3A at the time $t_0$. As an example, FIG. 9 shows a case where a tip of the mask 1B in the y direction is at the same position as the second side 3b of the first opening 3A at the time $t_0$. Therefore, the lower base of the isosceles trapezoid in the first optical image 13A is positioned at an end of the mask 1B at the time $t_0$.

In a region swept using the first optical image 13A through scanning, the mask pattern P of the photomask 1 is being projected on the exposure subject 6 through scanning after the time $t_0$. The exposure time of the mask pattern P is a time obtained by dividing the opening width h of the first opening 3A in the Y direction by a velocity v. An exposure time $t_f$ is h/v in a rectangular region sandwiched between the first side 3a and the second side 3b of the first opening 3A. Hereinafter, the exposure time $t_f$ will be referred to as a full exposure time.

However, in a triangular region surrounded by the third side 3c, the fourth side 3d, and the second side 3b of the first opening 3A, the exposure time in the x direction changes linearly during a period from zero to the full exposure time $t_f$.

Similarly, in a region swept using the second optical image 13B through scanning, an exposure similar to that using the first optical image 13A is performed late by a time T. Therefore, the region swept using the second optical image 13B is divided into regions subjected to an exposure during the full exposure time $t_f$ and regions subjected to an exposure during a time shorter than the full exposure time $t_f$.

The regions subjected to an exposure during a time shorter than the full exposure time $t_f$ are exposure regions related to joints of the first optical image 13A and the second optical image 13B.

In the present embodiment, the regions subjected to an exposure during the full exposure time $t_f$ using the first optical image 13A and the second optical image 13B are separated from each other. Each of the regions subjected to an exposure during the full exposure time $t_f$ extends in the y direction in a belt shape with a width $w_1$. The regions subjected to an exposure during the full exposure time $t_f$ in the y direction will be referred to as single exposure regions $A_S$.

In contrast, regions having the width $(w_1+w_2)/2$ between the single exposure regions $A_S$ are subjected to an exposure during a time shorter than the full exposure time $t_f$ using the first optical image 13A and the second optical image 13B. Regions subjected to an exposure during a time shorter than the full exposure time $t_f$ in the y direction will be referred to as multi-exposure regions $A_C$.

The exposure times at positions in the x direction in the multi-exposure regions $A_C$ differ only between the first optical image 13A and the second optical image 13B in exposure ratio, the total exposure times are equivalent to each other.

Therefore, if the illumination light intensities of the first optical image 13A and the second optical image 13B are the same as each other, the exposure amounts in the single exposure regions $A_S$ and the exposure amounts in the multi-exposure regions $A_C$ become equivalent to each other.

However, the inventors have found the following tendency through observations. Compared to an exposure pattern formed in the single exposure region $A_S$ on the exposure subject 6, in an exposure pattern formed in the multi-exposure region $A_C$, the line width of the light transmitter tends to be slightly narrower.

The multi-exposure regions $A_C$ extend in the y direction with uniform widths and are formed in the x direction at equal pitches. Therefore, a change in line width of the multi-exposure region $A_C$ in the y direction is likely to be visually recognized as unevenness of density of a belt shape in an exposure pattern.

For example, when a photomask used to form a BM is formed by the exposure apparatus 100, unevenness having a size of the opening of the sub-pixel occurs. Therefore, there is concern that a liquid crystal apparatus in which regular unevenness of color is likely to be visually recognized is formed.

The reason that the line width differs even if the exposure time is the same is not necessarily clear. However, it is assumed that it occurs due to an influence of a time difference indicated by the time T.

The resist can be removed using a liquid developer as a result of photochemical reaction of an exposure. However, photochemical reaction of a resist requires a certain period of time during a rising phase of reaction. On the other hand, when an exposure is halted, reaction stops quickly, and the photo-reaction which has started is reset.

As a result, it is assumed that since a valid exposure time becomes shorter in an intermittent exposure than in a continuous exposure, an effect similar to a case where the exposure amount decreases occurs.

Therefore, it is assumed that if the exposure amounts of the first optical image 13A and the second optical image 13B have the same light amounts, a valid exposure amount used for a net exposure of resists in the multi-exposure regions $A_C$ on the exposure subject 6 is determined based on the ratio of the exposure time using the first optical image 13A and the second optical image 13B.

The multi-exposure region $A_C$ shown in FIG. 10A is sandwiched between a single exposure region $A_{S1}$ where the first optical image 13A is scanned and a single exposure region $A_{S2}$ where the second optical image 13B adjacent thereto in the x direction is scanned. Here, the ratio of the exposure time using the first optical image 13A and the second optical image 13B in the multi-exposure region $A_C$ will be considered. FIG. 10A schematically shows the ratio of the exposure time in the multi-exposure region $A_C$. In the multi-exposure region $A_C$, the exposure time using the first optical image 13A and the exposure time using the second optical image 13B change linearly in the x direction.

For example, since the position indicated by a point $p_1$ is a boundary position with respect to the single exposure region $A_{S1}$, the exposure time using the first optical image 13A is 100%, and the exposure time using the second optical image 13B is 0%. The ratio (%) of the exposure time at each of the points is indicated as follows in a form of $p_n[t_A, t_B]$, for example, $p_1[100, 0]$, $p_2[90, 10]$, $p_3[80, 20]$, $p_4[70, 30]$, $p_5[60, 40]$, $p_6[50, 50]$, $p_7[40, 60]$, $p_8[30, 70]$, $p_9[20, 80]$, $p_{10}[20, 80]$, and $p_{11}[0, 100]$. Hereinafter, the position coordinates of these points $p_n$ in the x direction will be indicated as $x_n$ (here, n=1, and so on to 11).

At this time, the valid exposure amount (which will hereinafter be simply referred to as an exposure amount sometimes) affecting the line width or the like in the multi-exposure region $A_C$ is indicated in a substantially V-shaped graph projected downward as shown in FIG. 10B. It is assumed as a reason therefor that since the valid exposure time is shortened in the multi-exposure region $A_C$, an effect similar to a case where the exposure amount decreases has occurred. Exposure amounts $q_1$ and $q_{11}$ at positions $x_1$ and $x_{11}$ are equivalent to an exposure amount $q_0$ in the single exposure region $A_S$. For example, an exposure amount $q_6$ at a position $x_6$ is smaller than the exposure amount $q_0$ and is the minimum value of the exposure amount in the multi-exposure region $A_C$. The rate of change in exposure amount near the positions $x_1$ and $x_{11}$ and near the position $x_6$ changes smoothly. This graph is bilaterally symmetric about a vertical axis passing through the position $x_6$.

In this manner, the exposure amount in the multi-exposure region $A_C$ is indicated as a continuous function having position coordinates in the x direction as independent variables but may be simply approximated through a stepwise change.

For example, while having a section $A_n$ between a position $x_{2n-1}$ and a position $x_{2n+1}$, each of the exposure amounts within the section $A_n$ may be approximated based on the average exposure amount in the section $A_n$.

As described above, in the first exposure, the valid exposure amount decreases in the multi-exposure region $A_C$. In the present embodiment, a shortage of valid exposure amount is resolved by performing the second exposure with respect to the light amount correction region M while the multi-exposure region $A_C$ serves as the light amount correction region M. Hereinafter, the second exposure will be described.

Figure 11:
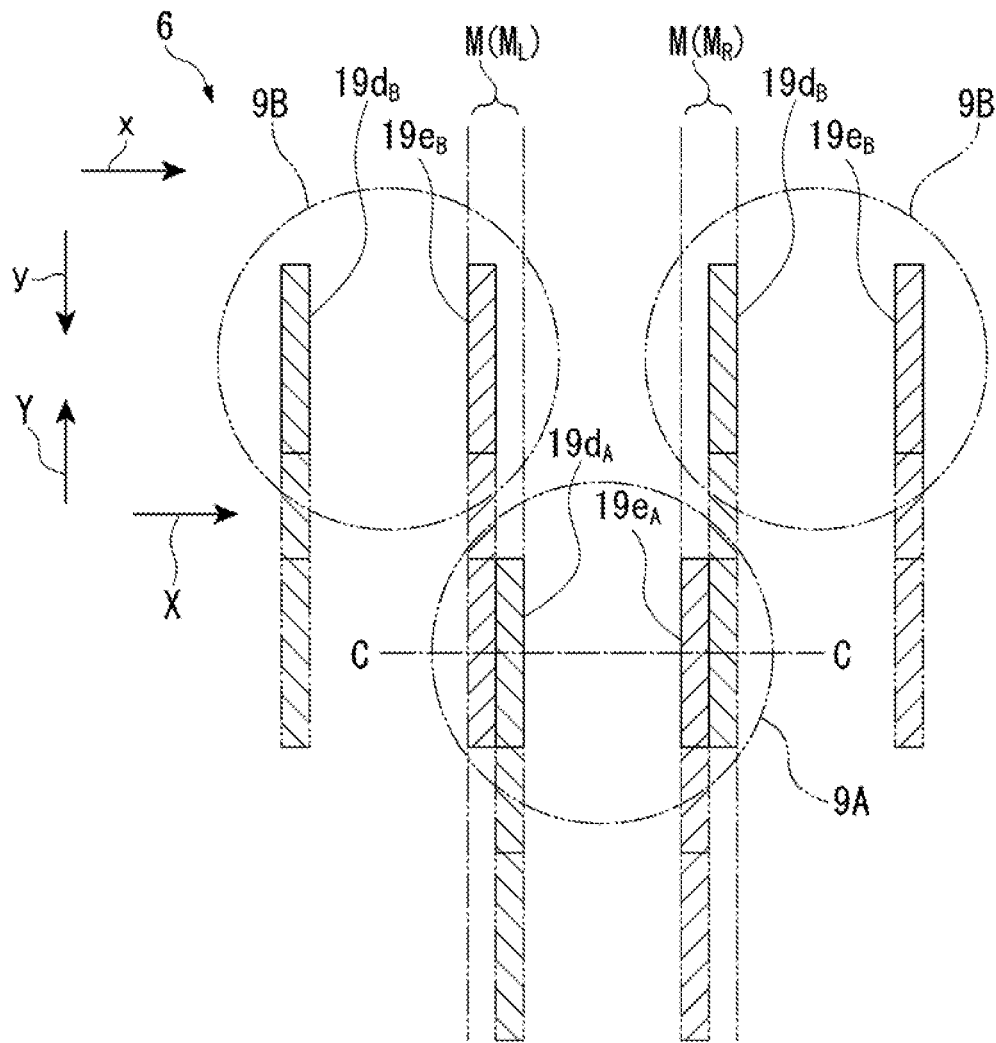
FIG. 11 is a schematic view showing a second exposure in the exposure method of the first embodiment of the present invention.
Figure 12:
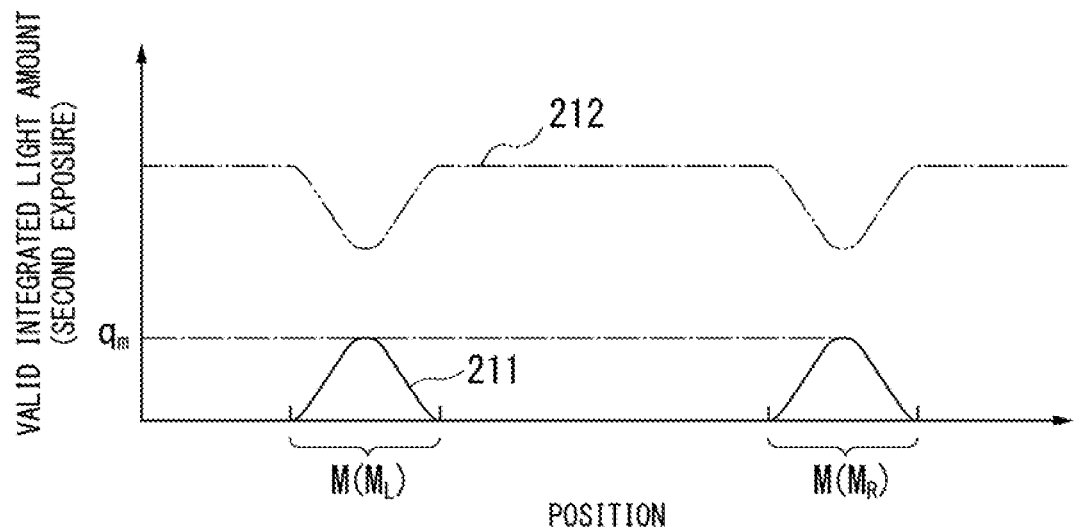
FIG. 12 is a schematic graph describing a valid integrated light amount in the second exposure.
Figure 13:
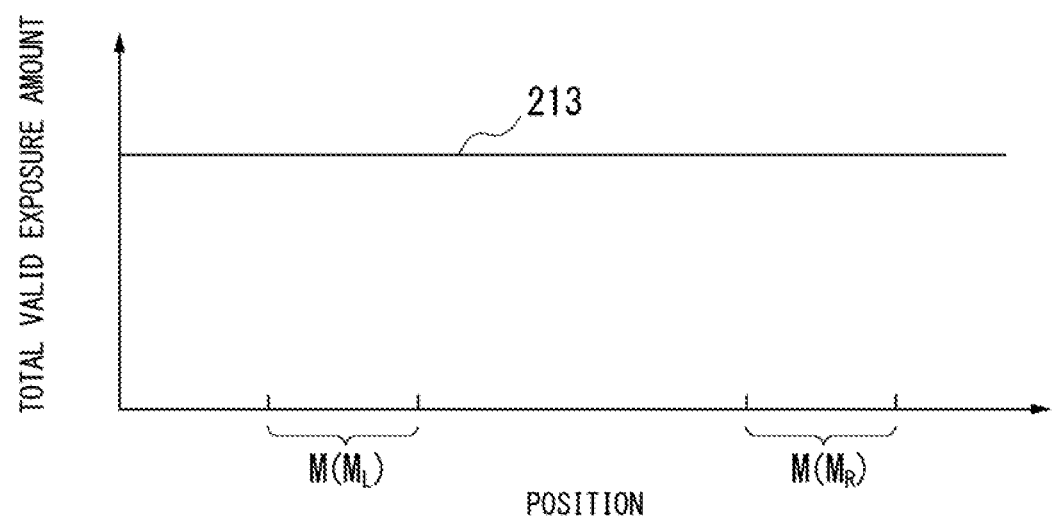
FIG. 13 is a schematic graph describing a total valid exposure amount obtained through the first exposure and the second exposure.

FIG. 11 is a schematic view showing a second exposure in the exposure method of the first embodiment of the present invention. FIG. 12 is a schematic graph describing a valid integrated light amount in the second exposure. In FIG. 12, the horizontal axis indicates the position, and the vertical axis indicates the valid integrated light amount in the second exposure. FIG. 13 is a schematic graph describing a total valid exposure amount obtained through the first exposure and the second exposure. In FIG. 13, the horizontal axis indicates the position, and the vertical axis indicates the total valid exposure amount.

The second exposure is performed using the additional exposure illumination light source 12 and the additional exposure projection optical unit 9.

As shown in FIG. 1, when the additional exposure illumination light source 12 is turned on, the photomask 1 is irradiated with the second exposure light $L_{2A}$ and the second exposure light $L_{2B}$.

Regarding light transmitted through the light transmitter 1a in the photomask 1, light incident on the first row projection optical system 9A is projected as the second exposure light $L_{12A}$ on the exposure subject 6 by the first row projection optical system 9A at equal magnification. Similarly, light incident on the second row projection optical system 9B is projected as the second exposure light $L_{12B}$ on the exposure subject 6 by the second row projection optical system 9B at equal magnification.

As a result, the second exposure light $L_{12A}$ and the second exposure light $L_{12B}$ transmitted through the first light reducer 9d and the second light reducer 9e scan the light amount correction region M on the exposure subject 6 from above in the Y direction.

Therefore, as shown in FIG. 11, a first correction optical image $19d_A$ which is an optical image of light transmitted through the first light reducer 9d in the first row projection optical system 9A and a second correction optical image $19e_B$ which is an optical image of light transmitted through the second light reducer 9e in the second row projection optical system 9B are formed in the light amount correction region $M_L$.

Similarly, a third correction optical image $19e_A$ which is an optical image of light transmitted through the second light reducer 9e in the first row projection optical system 9A and a fourth correction optical image $19d_B$ which is an optical image of light transmitted through the first light reducer 9d in the second row projection optical system 9B are formed in the light amount correction region $M_R$.

When the first correction optical image $19d_A$, the second correction optical image $19e_B$, the third correction optical image $19e_A$, and the fourth correction optical image $19d_B$ are generically referred to hereinafter, there are cases where each thereof is referred to as each of the correction optical images. A luminance distribution corresponding to an object image such as the mask pattern P is formed in each of the correction optical images. However, in FIG. 11, for the sake of simplification, illustration of a luminance distribution is omitted.

An integrated light amount of the second exposure using each of the correction optical images is determined in accordance with the transmittance distribution of each of the first light reducers 9d and each of the second light reducers 9e in the X direction. For example, a distribution of the integrated light amount taken along line C-C extending in the X direction in FIG. 11 is indicated by a curve 211 in FIG. 12. The distribution of the integrated light amount has a mountain-shaped distribution which reaches zero at both ends of the light amount correction region M in the X direction (horizontal axis direction) and reaches a maximum value $q_m$ at the center of the light amount correction region M in the X direction. However, in FIG. 12, for the sake of simplification, indication of the mask pattern P depending on a change in light amount is omitted. That is, FIG. 12 shows the integrated light amount in a region in which the transmittance of the mask pattern P is uniform.

A curve 212 (refer to the two-dot dashed line) in FIG. 12 indicates the valid exposure amount in the first exposure. The mountain-shaped distribution of the integrated light amount indicated by the curve 211 is a distribution in which decrease in exposure amount of the curve 212 in the light amount correction region M can be corrected.

A curve 213 in FIG. 13 indicates the total valid exposure amount obtained through the first exposure and the second exposure. As indicated by the curve 213 in FIG. 13, the total valid exposure amount on the exposure subject 6 after the first exposure and the second exposure are performed becomes substantially uniform regardless of the position in the X direction (horizontal axis direction).

FIG. 13 is a schematic view, and therefore the curve 213 is simplified and is drawn as a straight line parallel to the horizontal axis. However, if the exposure amount is within a permissible range of the valid exposure amount, it may be indicated by a curve which fluctuates in the vertical axis direction depending on the position of the horizontal axis.

As described above, in the exposure method of the present embodiment, decrease in valid exposure amount occurring in the multi-exposure region $A_C$ due to the first exposure is corrected by performing the second exposure in the light amount correction region M matching the multi-exposure region $A_C$. Therefore, when a plurality of projection optical systems (first projection optical systems) arranged in a staggered arrangement are used, unevenness of exposure caused by joining of the exposure regions is reduced.

Second Embodiment

An exposure apparatus according to a second embodiment of the present invention will be described.

Figure 14A:
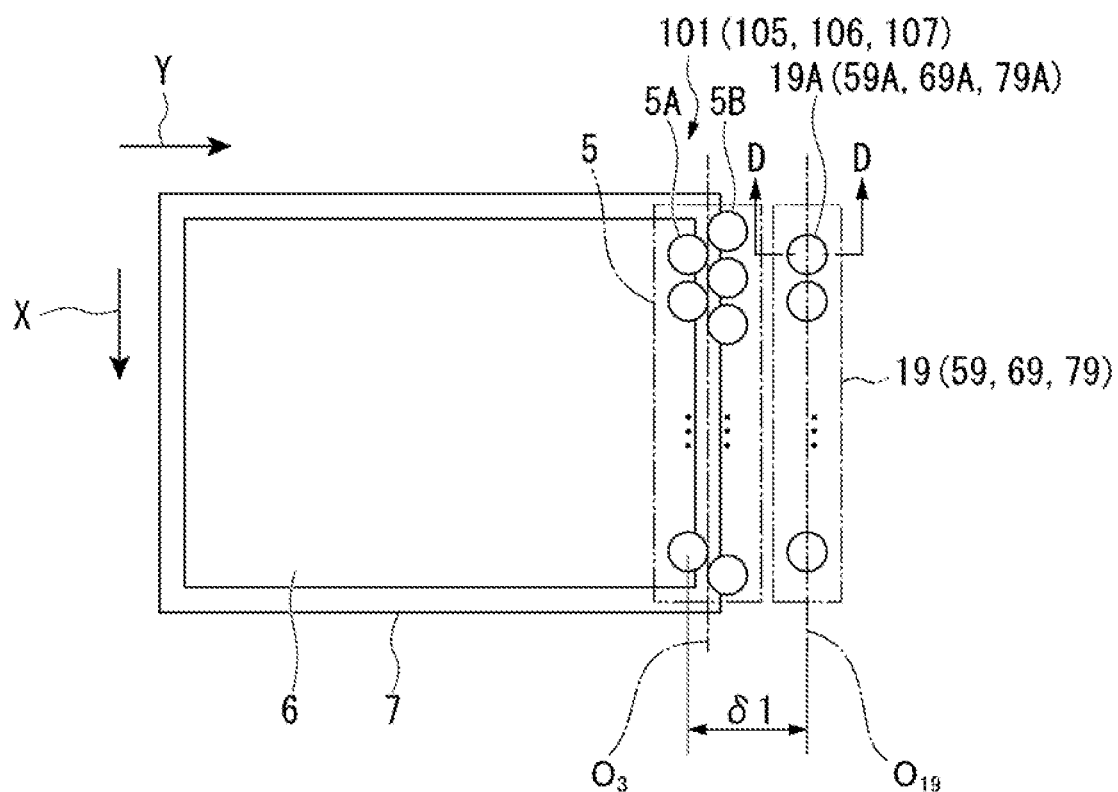
FIG. 14A is a schematic plan view showing an example of a main portion of an exposure apparatus of a second embodiment of the present invention.
Figure 14B:
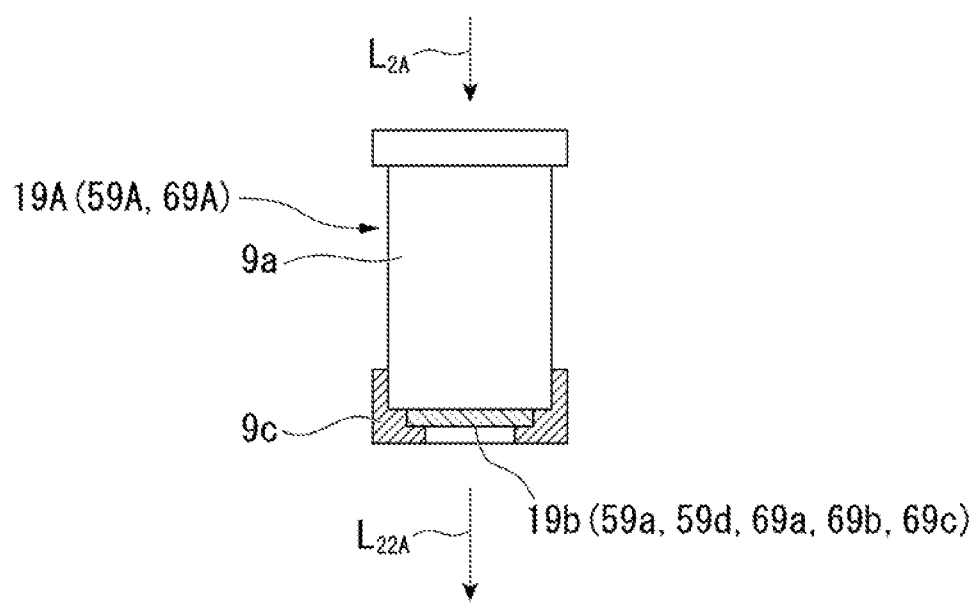
FIG. 14B is a cross-sectional view taken along D-D in FIG. 14A.
Figure 15:
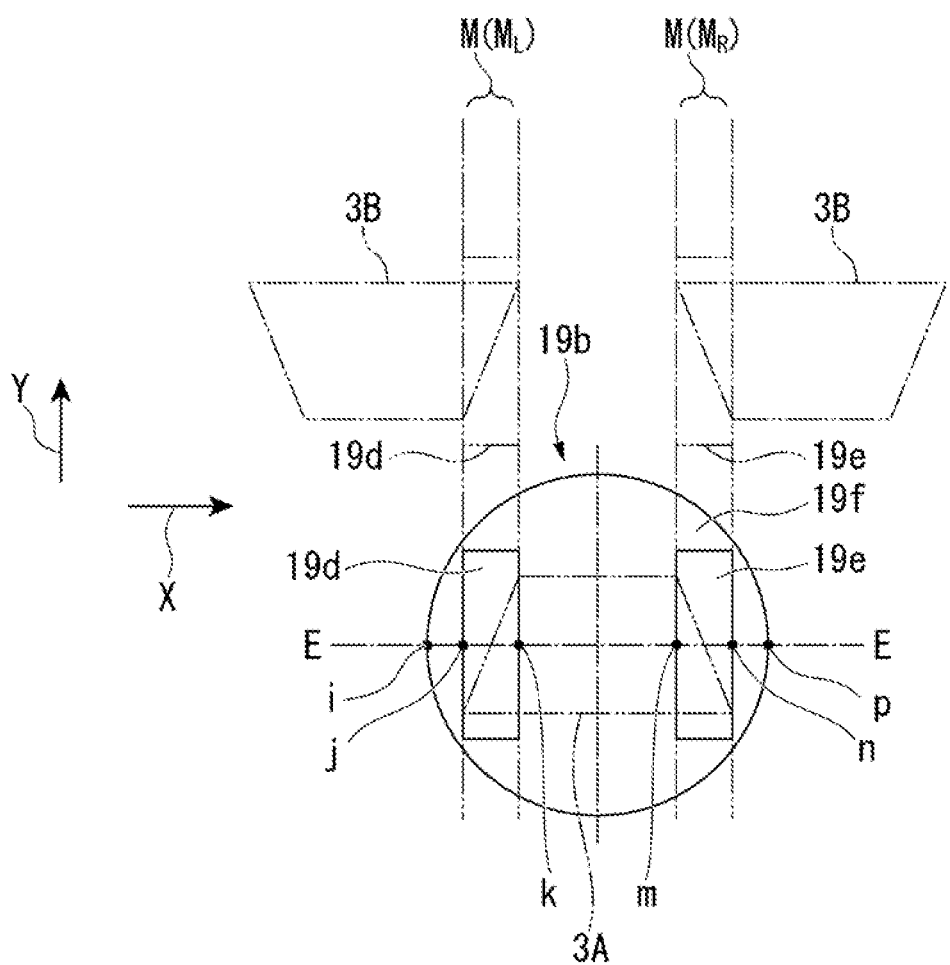
FIG. 15 is a schematic plan view showing an example of the light transmission amount restrictor used in the exposure apparatus of the second embodiment of the present invention.
Figure 16:
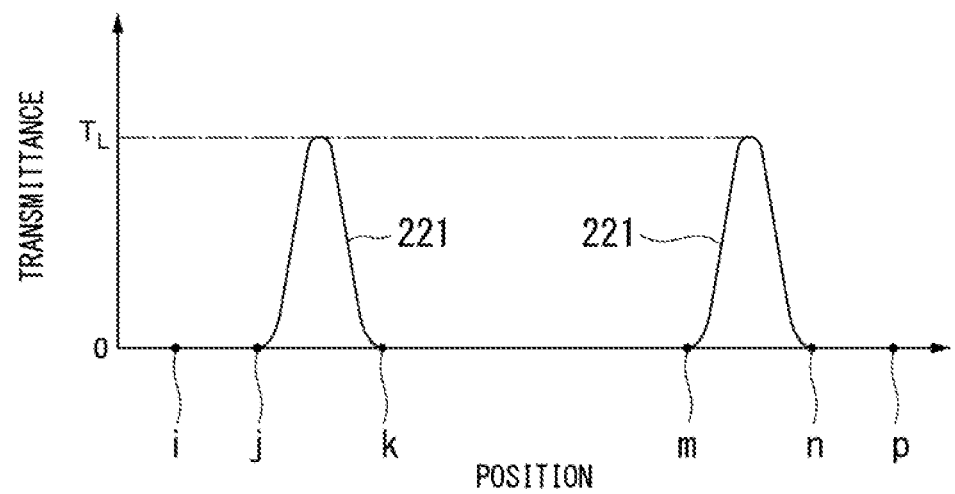
FIG. 16 is a schematic graph showing a transmittance distribution along line E-E in FIG. 15.

FIG. 14A is a schematic plan view showing an example of a main portion of the exposure apparatus of the second embodiment of the present invention. FIG. 14B is a cross-sectional view taken along D-D in FIG. 14A. FIG. 15 is a schematic plan view showing an example of the light transmission amount restrictor used in the exposure apparatus of the second embodiment of the present invention. FIG. 16 is a schematic graph showing a transmittance distribution along line E-E in FIG. 15. In FIG. 16, the horizontal axis indicates the position along line E-E, and the vertical axis indicates the transmittance.

As shown in FIG. 1, in place of the additional exposure illumination light source 12 and the additional exposure projection optical unit 9 of the exposure apparatus 100 of the first embodiment, an exposure apparatus 101 of the present embodiment includes an additional exposure illumination light source 42 (second light source) and an additional exposure projection optical unit 19 (correction stepper).

Hereinafter, points different from the first embodiment will be described mainly.

The additional exposure illumination light source 42 is constituted in a manner similar to that of the additional exposure projection optical unit 9 in the first embodiment, except that a light irradiation range in the Y direction is narrower. Specifically, the additional exposure illumination light source 42 need only be able to perform irradiation of a luminous flux similar to the second exposure light $L_{2A}$ with which the additional exposure projection optical unit 9 performs irradiation.

As shown in FIG. 1, the additional exposure projection optical unit 19 is disposed at a position similar to that of the additional exposure projection optical unit 9 in the first embodiment.

As shown in FIG. 14A, the additional exposure projection optical unit 19 includes a plurality of projection optical systems 19A (second projection optical systems) arranged along an axis $O_{19}$ parallel to the axis $O_3$.

As shown in FIG. 14A, in place of the filter 9b of the first row projection optical system 5A in the first embodiment, the projection optical system 19A includes a filter 19b (light transmission amount restrictor, that is, a light attenuation filter).

Similar to the first row projection optical system 9A in the first embodiment, the projection optical system 19A may be constituted such that it is disposed at a position moved in parallel by the distance M in the Y direction from the first row projection optical system 5A.

As shown in FIG. 14B, the filter 19b converts the second exposure light $L_{2A}$ transmitted through the lens unit 9a into second exposure light $L_{22A}$ with which the light amount correction region M is to be only irradiated on the exposure subject 6.

In the present embodiment, as shown in FIG. 15, the filter 19b includes a first light reducer 19d, a second light reducer 19e, and a light shade 19f.

The first light reducer 19d is formed in a rectangular range overlapping the entire width of the light amount correction region $M_L$ in the X direction in a plan view. The second light reducer 19e is formed in a rectangular range overlapping the entire width of the light amount correction region $M_R$ in the X direction in a plan view.

The lengths of the first light reducer 19d and the second light reducer 19e in the Y direction need only be within a range of the size of the filter 19b and are not particularly limited.

In the filter 19b, a region excluding the first light reducer 19d and the second light reducer 19e serves as the light shade 19f. The transmittance of the light shade 19f is 0%.

In the present embodiment, the first light reducer 19d and the second light reducer 19e have a transmittance distribution in the X direction, as shown in FIG. 16.

The reference signs on the horizontal axis in FIG. 16 indicate positions of points of the same reference signs on a line E-E disclosed in FIG. 15. A point i is an end point of the filter 19b on the negative direction side in the X direction in the line E-E. A section from a point j to a point k is a section overlapping the light amount correction region $M_L$. A section from a point m to a point n is a section overlapping the light amount correction region $M_R$. A point p is an end point of the filter 19b on the positive direction side in the X direction in the line E-E.

The first light reducer 19d is disposed between the point j and the point k. The second light reducer 19e is disposed between the point m and the point n. The light shade 19f is disposed in each of the sections from the point i to the point j, from the point k to the point m, and from the point n to the point p.

As indicated by curves 221 in FIG. 16, the transmittance of the first light reducer 19d has a mountain-shaped (hanging bell-shaped) transmittance distribution which reaches the maximum value $T_L$ (100% or smaller) in a central portion between the point j and the point k, decreases gradually toward the point j and the point k, and becomes 0% at the point j and the point k. The transmittance of the second light reducer 19e has a mountain-shaped (hanging bell-shaped) transmittance distribution which becomes 0% at the point m and the point n, increases gradually toward a central portion between the point m and the point n, and reaches the maximum value $T_L$ at the point f.

Specifically, the curves 221 exhibit mountain-shaped transmittance distributions similar to those indicated by the curve 202 and the curve 201 (the curve 201 and curve 203) described in FIG. 8 in the first embodiment.

Similar to that of the first embodiment, the rate of change in transmittance of the first light reducer 19d and the second light reducer 19e is set based on an experiment or a simulation, for example, in accordance with necessity of correction of the light amount in the light amount correction region M. The rate of change in transmittance of the first light reducer 19d and the second light reducer 19e may be uniform (linear change) or may change based on a suitable function. The rate of change in transmittance may be monotonous or may be non-monotonous. Moreover, a change in transmittance is not limited to a smooth change. For example, the transmittance may change in a stepped shape.

According to the additional exposure illumination light source 42 and the additional exposure projection optical unit 19 having such a constitution, after the first exposure similar to that of the first embodiment, it is possible to perform the second exposure by the second exposure light $L_{22A}$ having a distribution of the integrated light amount similar to that of the first embodiment in each of the light amount correction regions M using a plurality of projection optical systems 19A disposed in a row parallel to the axis $O_{19}$.

That is, according to the exposure apparatus 101 including the additional exposure illumination light source 42 and the additional exposure projection optical unit 19, it is possible to perform an exposure method similar to that of the first embodiment.

Therefore, according to the exposure apparatus 101 of the present embodiment, similar to the first embodiment, when a plurality of projection optical systems (first projection optical systems) arranged in a staggered arrangement are used, unevenness of exposure caused by joining of the exposure regions is reduced.

Moreover, according to the present embodiment, the numbers of lens units 9a, filters 19b, and filter holders 9c in the additional exposure projection optical unit 19 are reduced substantially by half the numbers of lens units 9a, filters 9b, and filter holders 9c of the additional exposure projection optical unit 9 in the first embodiment. Similarly, the light irradiation range in the additional exposure illumination light source 42 is also reduced substantially by half compared to that in the additional exposure illumination light source 12. Therefore, in the exposure apparatus 101, the component cost and the size can be reduced compared to the exposure apparatus 100.

Third Embodiment

An exposure apparatus according to a third embodiment of the present invention will be described.

Figure 17A:
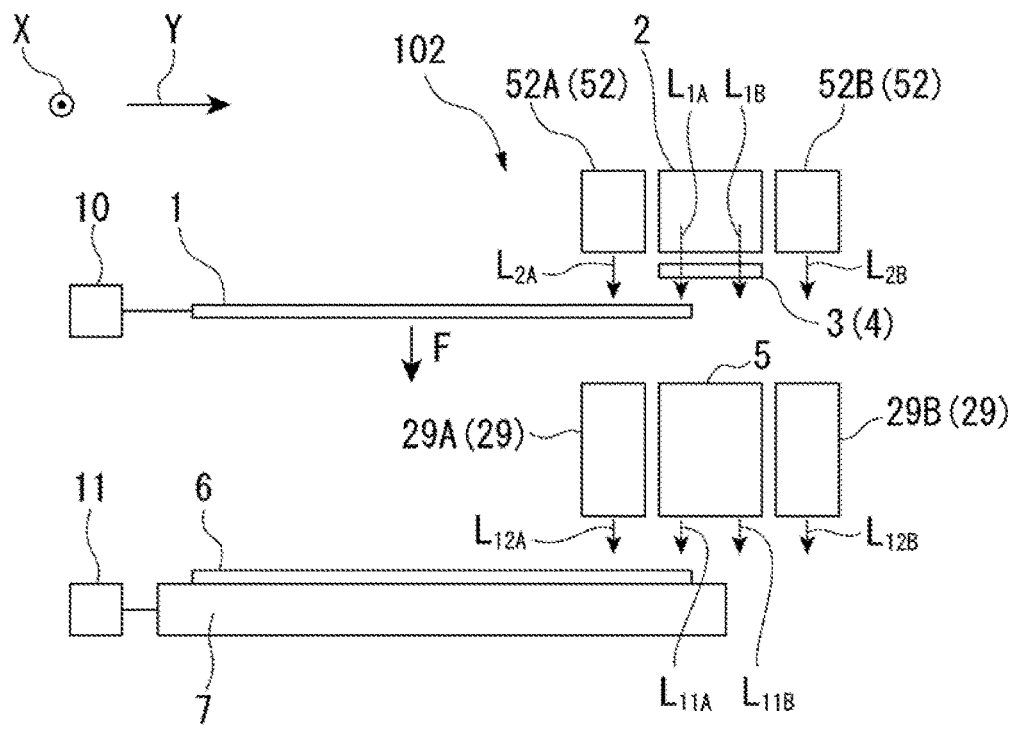
FIG. 17A is a schematic front view showing an example of an exposure apparatus of a third embodiment of the present invention.
Figure 17B:
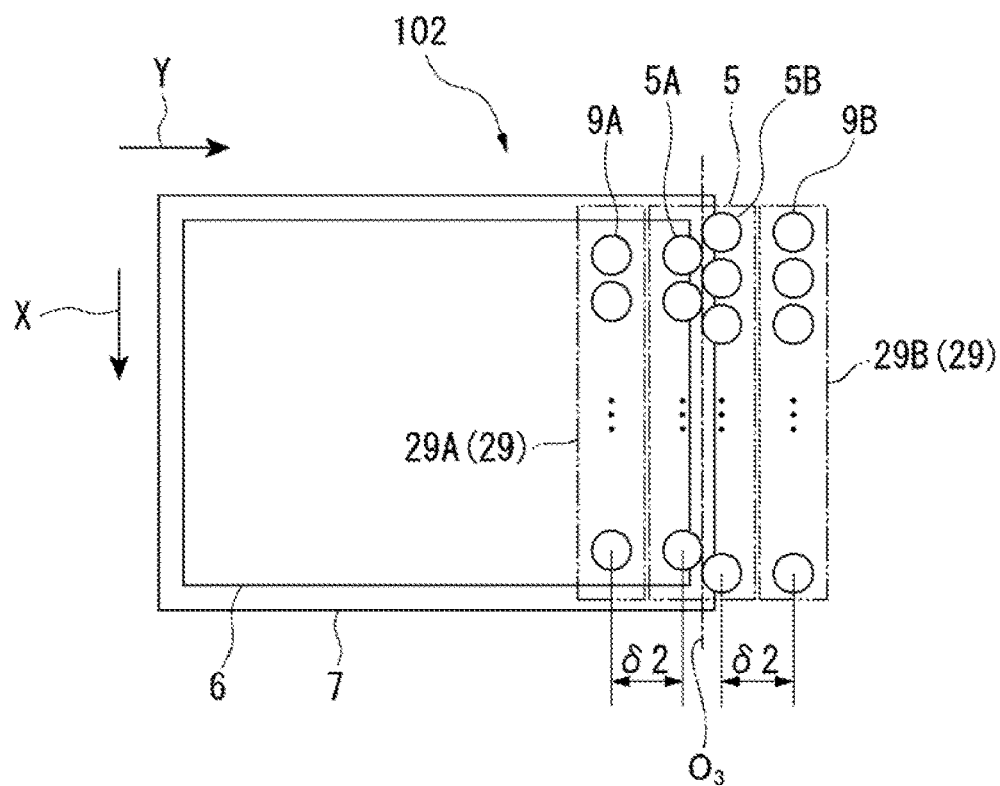
FIG. 17B is a plan view viewed in a direction of an arrow F in FIG. 17A.

FIG. 17A is a schematic front view showing an example of the exposure apparatus of the third embodiment of the present invention. FIG. 17B is a plan view viewed in a direction of an arrow F in FIG. 17A.

As shown in FIG. 17A, in place of the additional exposure illumination light source 12 and the additional exposure projection optical unit 9 of the exposure apparatus 100 of the first embodiment, an exposure apparatus 102 of the present embodiment includes an additional exposure illumination light source 52 (second light source) and an additional exposure projection optical unit 29 (correction stepper).

Hereinafter, points different from the first embodiment will be described mainly.

The additional exposure illumination light source 52 includes a first light source 52A performing irradiation of the second exposure light $L_{2A}$ similar to that of the first embodiment and a second light source 52B performing irradiation of the second exposure light $L_{2B}$ similar to that of the first embodiment.

The first light source 52A is disposed on the negative direction side (negative Y direction side, that is, one side in the Y direction corresponding to the left side in the diagram) of the main illumination light source 2 in the Y direction. The second light source 52B is disposed on the positive direction side of the main illumination light source 2 in the Y direction (positive Y direction side, that is, the other side in the Y direction corresponding to the right side in the diagram). The main illumination light source 2 is disposed adjacent to the first light source 52A and the second light source 52B in the Y direction.

As shown in FIGS. 17A and 17B, the additional exposure projection optical unit 29 includes a first optical unit 29A and a second optical unit 29B. The first optical unit 29A converts the second exposure light $L_{2A}$ into the second exposure light $L_{12A}$ similar to that of the first embodiment. The second optical unit 29B converts the second exposure light similar to that of the first embodiment $L_{2B}$ into the second exposure light $L_{12B}$.

The first optical unit 29A includes a plurality of first row projection optical systems 9A (second projection optical systems) similar to those of the first embodiment. The first optical unit 29A is disposed on the negative direction side of the projection optical unit 5 in the Y direction.

The second optical unit 29B includes a plurality of second row projection optical systems 9B (second projection optical systems) similar to those of the first embodiment. The second optical unit 29B is disposed on the positive direction side of the projection optical unit 5 in the Y direction.

The projection optical unit 5 is disposed adjacent to the first optical unit 29A and the second optical unit 29B in the Y direction.

The first row projection optical systems 9A in the first optical unit 29A are arranged along a straight line parallel to the axis $O_3$. A distance between each of the first row projection optical systems 9A and each of the first row projection optical systems 5A may be δ2. The second row projection optical systems 9B in the second optical unit 29B are arranged along a straight line parallel to the axis $O_3$. A distance between each of the second row projection optical systems 9B and each of the second row projection optical systems 5B may be δ2.

Due to such a constitution, the first light source 52A and the second light source 52B have a constitution similar to that in which the additional exposure illumination light source 12 in the first embodiment is divided into two units in the Y direction.

The main illumination light source 2 in the present embodiment is disposed such that it is interposed between the first light source 52A and the second light source 52B in the Y direction.

The first optical unit 29A and the second optical unit 29B have a constitution similar to that in which the additional exposure projection optical unit 9 in the first embodiment is divided into two units in the Y direction.

The projection optical unit 5 in the present embodiment is disposed such that it is interposed between the first optical unit 29A and the second optical unit 29B in the Y direction.

However, the positional relationship between each of the first row projection optical systems 9A and each of the first row projection optical systems 5A in the X direction, and the positional relationship between each of the second row projection optical systems 9B and each of the second row projection optical systems 5B in the X direction are similar to those of the first embodiment.

According to the exposure apparatus 102 having such a constitution, the photomask 1 and the exposure subject 6 are moved in the Y direction. Through the movement, the second exposure by the second exposure light $L_{12A}$, the first exposure by the first exposure light $L_{11A}$ and the first exposure light $L_{11B}$, and the second exposure by the second exposure light $L_{12B}$ are performed in this order. An exposure method similar to that of the first embodiment is performed except for this order of the exposures.

Therefore, according to the exposure apparatus 102 of the present embodiment, similar to the first embodiment, when a plurality of projection optical systems (first projection optical systems) arranged in a staggered arrangement are used, unevenness of exposure caused by joining of the exposure regions is reduced.

Moreover, according to the present embodiment, in the Y direction, the first row projection optical system 5A and the first row projection optical system 9A are disposed adjacent to each other, and the second row projection optical system 5B and the second row projection optical system 9B are disposed adjacent to each other. Therefore, the separation distance δ2 therebetween can be shorter than the separation distance M in the first embodiment.

Accordingly, the time difference between the first exposure and the second exposure can be further shortened, and therefore favorable correction can be performed with a lower exposure amount.

Fourth Embodiment

An exposure apparatus according to a fourth embodiment of the present invention will be described.

Figure 18A:
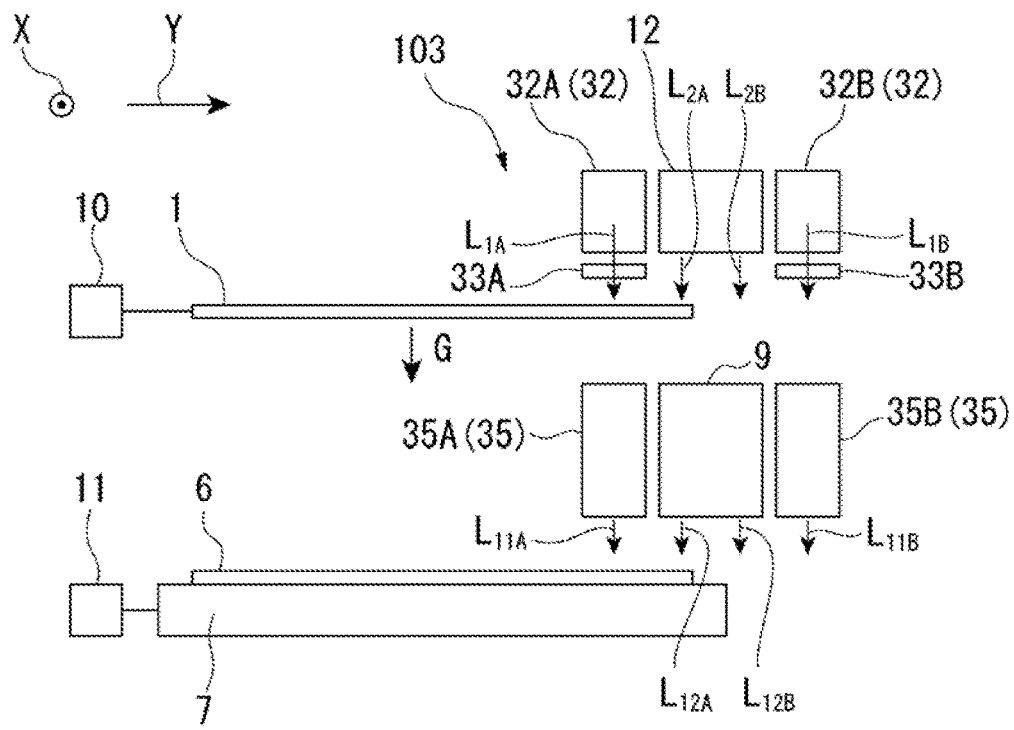
FIG. 18A is a schematic front view showing an example of an exposure apparatus of a fourth embodiment of the present invention.
Figure 18B:
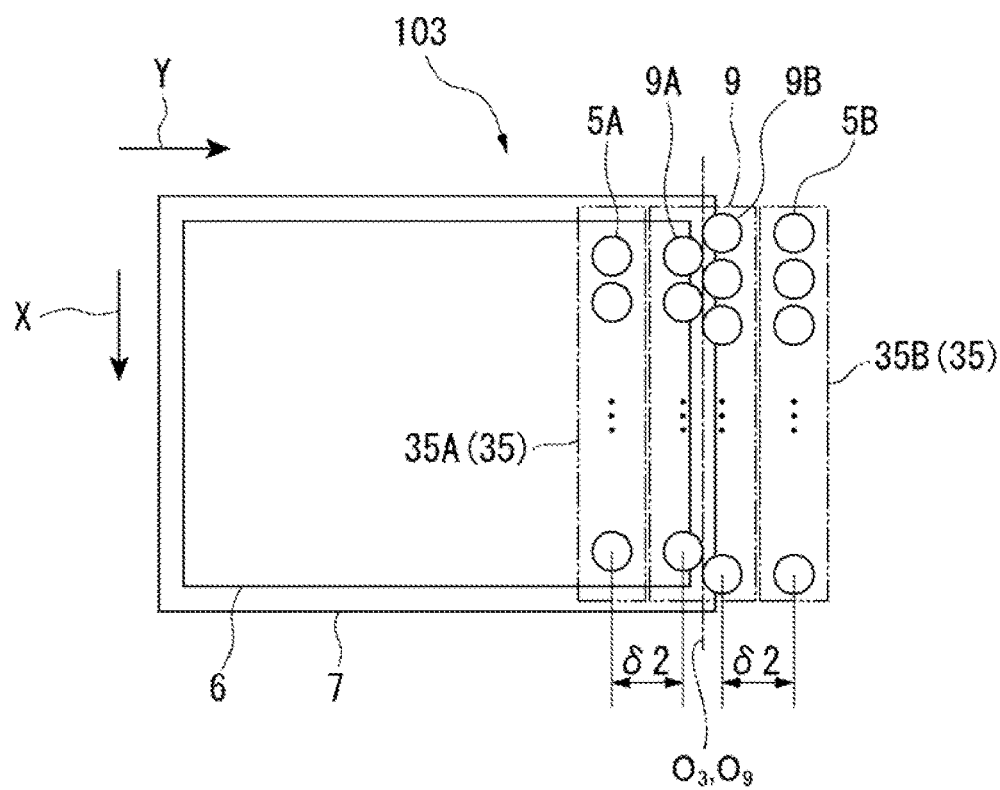
FIG. 18B is a plan view viewed in a direction of an arrow G in FIG. 18A.

FIG. 18A is a schematic front view showing an example of the exposure apparatus of the fourth embodiment of the present invention. FIG. 18B is a plan view viewed in a direction of an arrow G in FIG. 18A.

As shown in FIG. 18A, in place of the main illumination light source 2 and the projection optical unit 5 of the exposure apparatus 100 of the first embodiment, an exposure apparatus 103 of the present embodiment includes a main illumination light source 32 (first light source), field diaphragms 33A and 33B (diaphragms), and a projection optical unit 35.

Hereinafter, points different from the first embodiment will be described mainly.

The main illumination light source 32 includes a first light source 32A performing irradiation of the first exposure light $L_{1A}$ similar to that of the first embodiment and a second light source 32B performing irradiation of the first exposure light $L_{1B}$ similar to that of the first embodiment.

The first light source 32A is disposed on the negative direction side of the additional exposure illumination light source 12 in the Y direction. The second light source 32B is disposed on the positive direction side of the additional exposure illumination light source 12 in the Y direction. The additional exposure illumination light source 12 is disposed adjacent to the first light source 32A and the second light source 32B.

The field diaphragms 33A and 33B have a constitution similar to that in which the field diaphragm 3 in the first embodiment is divided in the Y direction.

The field diaphragm 33A has arrangement of a plurality of first openings 3A of the field diaphragm 3 in the first embodiment. The field diaphragm 33A is disposed below the first light source 32A such that the first exposure light $L_{1A}$ is transmitted therethrough.

The field diaphragm 33B has arrangement of a plurality of second openings 3B of the field diaphragm 3 in the first embodiment. The field diaphragm 33B is disposed below the second light source 32B such that the first exposure light $L_{1B}$ is transmitted therethrough.

As shown in FIGS. 18A and 18B, the projection optical unit 35 includes a first optical unit 35A and a second optical unit 35B. The first optical unit 35A projects an optical image realized by the first exposure light $L_{1A}$ transmitted through the field diaphragm 33A on the exposure subject 6. The second optical unit 35B projects an optical image realized by the first exposure light $L_{1B}$ transmitted through the field diaphragm 33B on the exposure subject 6.

The first optical unit 35A includes a plurality of first row projection optical systems 5A (first projection optical systems) similar to those of the first embodiment. The first optical unit 35A is disposed on the negative direction side of the additional exposure projection optical unit 9 in the Y direction.

The second optical unit 35B includes a plurality of second row projection optical systems 5B (first projection optical systems) similar to those of the first embodiment. The second optical unit 35B is disposed on the positive direction side of the additional exposure projection optical unit 9 in the Y direction.

The additional exposure projection optical unit 9 is disposed adjacent to the first optical unit 35A and the second optical unit 35B.

The first row projection optical systems 5A in the first optical unit 35A are arranged along a straight line parallel to the axis $O_9$. A distance between each of the first row projection optical systems 5A and each of the first row projection optical systems 9A may be δ2. The second row projection optical systems 5B in the second optical unit 35B are arranged along a straight line parallel to the axis $O_9$. A distance between each of the second row projection optical systems 5B and each of the second row projection optical systems 9B may be δ2.

Due to such a constitution, the first light source 32A and the second light source 32B have a constitution similar to that in which the main illumination light source 2 in the first embodiment is divided into two units in the Y direction.

The additional exposure illumination light source 12 of the present embodiment is disposed such that it is interposed between the first light source 32A and the second light source 32B.

The first optical unit 35A and the second optical unit 35B have a constitution similar to that in which the projection optical unit 5 in the first embodiment is divided into two units in the Y direction.

The additional exposure projection optical unit 9 of the present embodiment is disposed such that it is interposed between the first optical unit 35A and the second optical unit 35B.

However, the positional relationship between each of the first row projection optical systems 9A and each of the first row projection optical systems 5A in the X direction, and the positional relationship between each of the second row projection optical systems 9B and each of the second row projection optical systems 5B in the X direction are similar to those of the first embodiment.

According to the exposure apparatus 103 having such a constitution, the photomask 1 and the exposure subject 6 are moved in the Y direction. Through the movement, the first exposure by the first exposure light $L_{1Ia}$, the second exposure by the second exposure light $L_{12A}$ and the second exposure light $L_{12B}$, and the first exposure by the first exposure light $L_{11B}$ are performed in this order. An exposure method similar to that of the first embodiment is performed except for this order of the exposures.

Therefore, according to the exposure apparatus 103 of the present embodiment, similar to the first embodiment, when a plurality of projection optical systems (first projection optical systems) arranged in a staggered arrangement are used, unevenness of exposure caused by joining of the exposure regions is reduced.

Moreover, according to the present embodiment, in the Y direction, the first row projection optical system 5A and the first row projection optical system 9A are disposed adjacent to each other, and the second row projection optical system 5B and the second row projection optical system 9B are disposed adjacent to each other. Therefore, the separation distance δ2 therebetween can be shorter than the separation distance M in the first embodiment.

Therefore, the time difference between the first exposure and the second exposure can be further shortened, and therefore favorable correction can be performed with a lower exposure amount.

Fifth Embodiment

An exposure apparatus according to a fifth embodiment of the present invention will be described.

Figure 19:
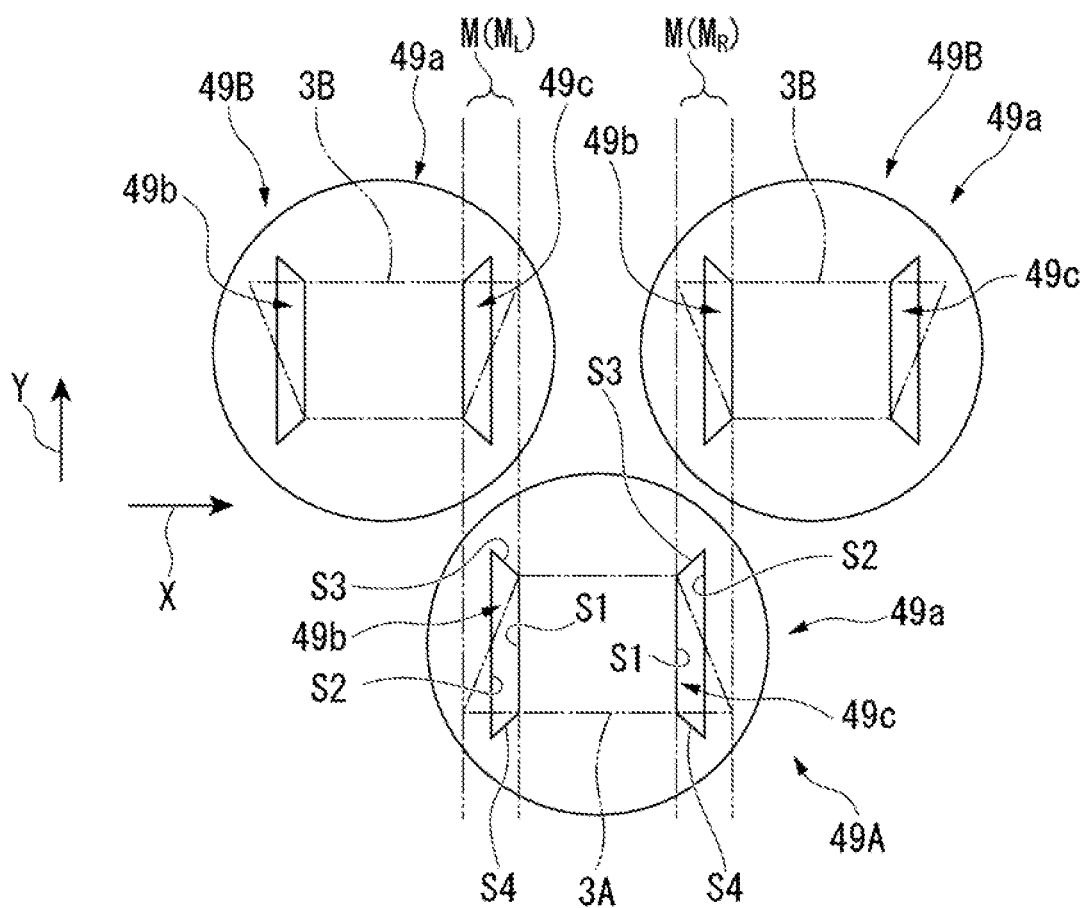
FIG. 19 is a schematic plan view showing an example of the light transmission amount restrictor used in an exposure apparatus of a fifth embodiment of the present invention.
Figure 20:
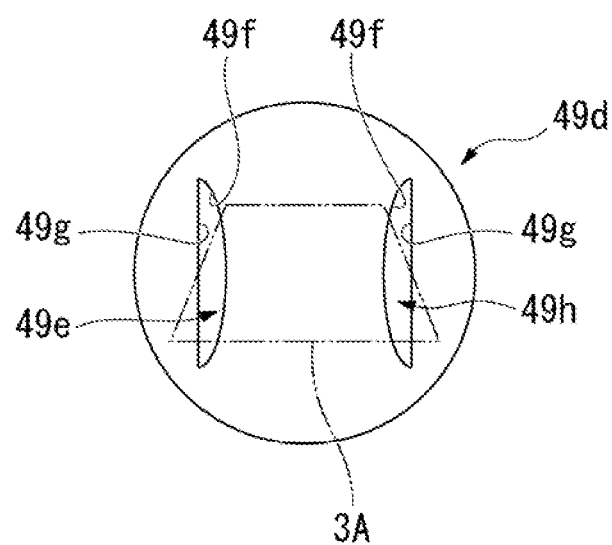
FIG. 20 is a schematic plan view showing another example of the light transmission amount restrictor used in the exposure apparatus of the fifth embodiment of the present invention.

FIGS. 19 and 20 are schematic plan views showing examples of the light transmission amount restrictor used in the exposure apparatus of the fifth embodiment of the present invention.

As shown in FIG. 1, in place of the additional exposure projection optical unit 9 of the exposure apparatus 100 of the first embodiment, an exposure apparatus 104 of the present embodiment includes an additional exposure projection optical unit 49 (correction stepper).

Hereinafter, points different from the first embodiment will be described mainly.

As shown in FIG. 6, in place of the first row projection optical system 9A and the second row projection optical system 9B in the first embodiment, the additional exposure projection optical unit 49 includes a first row projection optical system 49A and a second row projection optical system 49B.

In place of the filter 9b of the first row projection optical system 9A (second row projection optical system 9B), the first row projection optical system 49A (second row projection optical system 49B) includes an aperture 49a (light transmission amount restrictor, that is, an opening diaphragm).

The aperture 49a converts the second exposure light $L_{2A}$ ($L_{2B}$) transmitted through the lens unit 9a into the second exposure light $L_{12A}$ ($L_{12B}$) with which the light amount correction region M is to be only irradiated on the exposure subject 6.

In the present embodiment, as shown in FIG. 19, the aperture 49a is constituted by forming first opening 49b and second opening 49c (plurality of penetration holes) on a metal plate having light shading properties.

The first opening 49b opens in an isosceles trapezoid surrounded by an upper base side S1 and a lower base side S2 extending in the Y direction and legs S3 and S4 connecting the upper base side S1 and the lower base side S2 to each other. The lower base side S2 is longer than the upper base side S1. In the first opening 49b, the upper base side S1 is disposed on the positive direction side in the X direction, and the lower base side S2 is disposed on the negative direction side in the X direction. The width and the disposition position of the first opening 49b in the X direction are similar to those of the first light reducer 9d in the first embodiment.

Here, in FIG. 19, for example, the length of the upper base side S1 in the Y direction is the same as the heights h of the isosceles trapezoids of the openings 3A and 3B. However, the length of the upper base side S1 in the Y direction need only be adjusted such that it stays within a permissible range for an executable exposure amount described with the curve 213 in FIG. 13.

Due to such a constitution, the opening width of the first opening 49b in the Y direction increases gradually from the positive direction side in the X direction toward the negative direction side in the X direction. Therefore, the first opening 49b can restrict the amount of transmitted light of the second exposure light $L_{2A}$ ($L_{2B}$) in the X direction, and therefore the light amount distribution of the second exposure light $L_{2A}$ ($L_{2B}$) transmitted through the lens unit 9a in the X direction can be increased from the end toward the center of the light amount correction region $M_L$ in the X direction.

The second opening 49c opens in an isosceles trapezoid realized by inverting the first opening 49b in the X direction. The width and the disposition position of the second opening 49c is the X direction are similar to the second light reducer 9e in the first embodiment.

Due to such a constitution, the opening width of the second opening 49c in the Y direction increases gradually from the negative direction side in the X direction toward the positive direction side in the X direction. Therefore, the second opening 49c can restrict the amount of transmitted light of the second exposure light $L_{2A}$ ($L_{2B}$) in the X direction, and therefore the light amount distribution of the second exposure light $L_{2A}$ ($L_{2B}$) transmitted through the lens unit 9a in the X direction can be increased from the end toward the center of the light amount correction region $M_R$ in the X direction.

Due to such a constitution, the additional exposure illumination light source 12 performs irradiation of the second exposure light $L_{2A}$ ($L_{2B}$), which is then transmitted through the lens unit 9a. Similar to the first embodiment, the valid integrated light amount of the second exposure light $L_{12A}$ ($L_{12B}$) in the Y direction indicates a mountain-shaped distribution as indicated by the curve 211 in FIG. 12.

According to the exposure apparatus 104, the light transmission amount restrictor is constituted of the aperture 49a. Except for that, the exposure apparatus 104 has a constitution similar to the exposure apparatus 100 of the first embodiment, and therefore an exposure method similar to that of the first embodiment is performed.

According to the exposure apparatus 104 of the present embodiment, similar to the first embodiment, when a plurality of projection optical systems (first projection optical systems) arranged in a staggered arrangement are used, unevenness of exposure caused by joining of the exposure regions is reduced.

Moreover, according to the present embodiment, compared to the filter 9b having the first light reducer 9d and the second light reducer 9e, the aperture 49a which can be manufactured at lower cost is used, and therefore the cost can be further reduced.

Moreover, in the aperture 49a, the extent of the integrated light amount and the light amount distribution in the X direction can be easily changed by changing the opening shapes of the first openings 49b and the second openings 49c.

The shapes of the first openings 49b and the second openings 49c of the aperture 49a described above are examples. The opening shape of the aperture 49a need only be a shape in which the opening width in the Y direction changes in the X direction and is not limited to an isosceles trapezoid.

For example, in the exposure apparatus 104, in place of the aperture 49a, an aperture 49d (light transmission amount restrictor, that is, an opening diaphragm) shown in FIG. 20 may be used.

In place of the first openings 49b and the second openings 49c of the aperture 49a, the aperture 49d includes a first opening 49e and a second opening 49h, respectively.

The first opening 49e opens in a half moon shape which is slender in the Y direction and is surrounded by a straight portion 49g extending in the Y direction and an arc-shaped portion 49f protruding from both ends of the straight portion 49g to the positive direction side in the X direction.

Due to such a constitution, the opening width of the first opening 49e in the Y direction increases gradually from the positive direction side in the X direction toward the negative direction side in the X direction.

The second opening 49h opens in a half moon shape which is slender in the Y direction realized by inverting the first opening 49e in the X direction.

Due to such a constitution, the opening width of the second opening 49h in the Y direction increases gradually from the negative direction side in the X direction toward the positive direction side in the X direction.

The first and second openings 49e and 49h are examples having an opening shape constituted in a shape including a curve.

Sixth Embodiment

An exposure apparatus according to a sixth embodiment of the present invention will be described.

Figure 21:
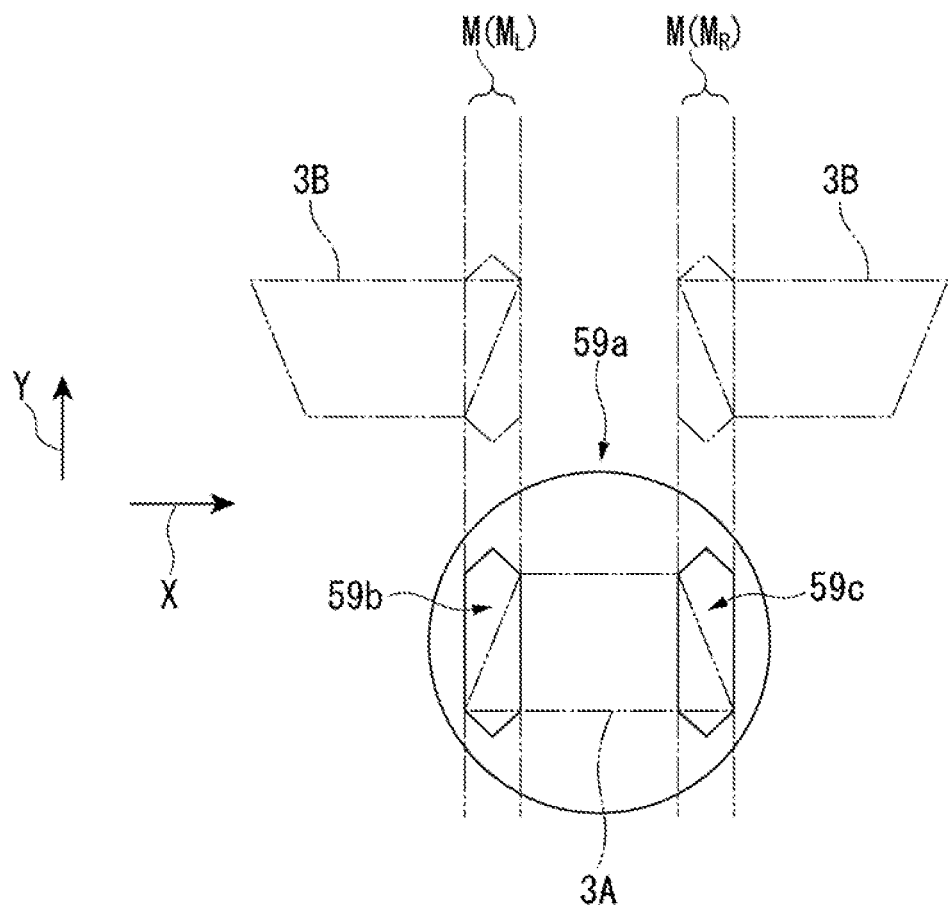
FIG. 21 is a schematic plan view showing an example of the light transmission amount restrictor used in an exposure apparatus of a sixth embodiment of the present invention.
Figure 22:
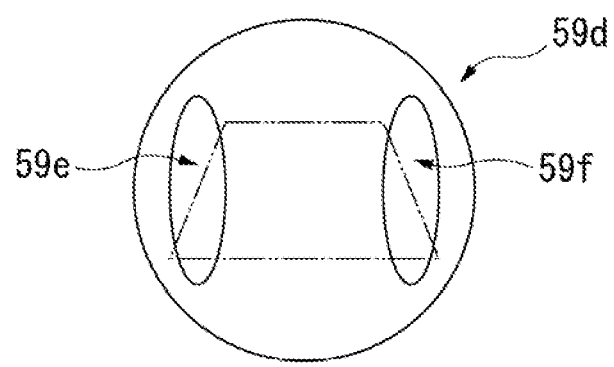
FIG. 22 is a schematic plan view showing another example of the light transmission amount restrictor used in the exposure apparatus of the sixth embodiment of the present invention.

FIGS. 21 and 22 are schematic plan views showing examples of the light transmission amount restrictor used in the exposure apparatus of the sixth embodiment of the present invention.

As shown in FIG. 1, in place of the additional exposure projection optical unit 19 of the exposure apparatus 101 of the second embodiment, an exposure apparatus 105 of the present embodiment includes an additional exposure projection optical unit 59 (correction stepper).

Hereinafter, points different from the second embodiment will be described mainly.

As shown in FIG. 14A, in place of the projection optical systems 19A in the second embodiment, the additional exposure projection optical unit 59 includes projection optical systems 59A.

As shown in FIG. 14B, in place of the filter 19b in the second embodiment, the projection optical system 59A includes an aperture 59a (light transmission amount restrictor, that is, an opening diaphragm).

The aperture 59a converts the second exposure light $L_{2A}$ transmitted through the lens unit 9a into the second exposure light $L_{22A}$ with which the light amount correction region M is to be only irradiated on the exposure subject 6.

In the present embodiment, as shown in FIG. 21, the aperture 59a is constituted by forming first opening 59b and second opening 59c (plurality of penetration holes) on a metal plate having light shading properties.

The first opening 59b has the same width as the light amount correction region $M_L$ in the X direction and opens in a hexagonal shape which is slender in the Y direction. For example, the first opening 59b is formed to have a hexagonal shape formed by matching the lower base side S2 of the first opening 49b and the lower base side S2 of the second opening 49c in the fifth embodiment. The disposition position of the first opening 59b in the X direction is similar to the first light reducer 19d in the second embodiment.

Due to such a constitution, the opening width of the first opening 59b in the Y direction increases gradually from both ends in the X direction to the center. Therefore, the first opening 59b can restrict the amount of transmitted light of the second exposure light $L_{2A}$ in the X direction, and therefore the light amount distribution of the second exposure light $L_{2A}$ in the X direction transmitted through the lens unit 9a can be increased from both ends toward the center of the light amount correction region $M_L$ in the X direction.

The second opening 59c opens in the same hexagonal shape as the shape of the first opening 59b. The disposition position of the second opening 49c in the X direction is similar to that of the second light reducer 19e in the second embodiment.

Due to such a constitution, the second opening 59c can restrict the amount of transmitted light of the second exposure light $L_{2A}$ in the X direction, and therefore the light amount distribution of the second exposure light $L_{2A}$ in the X direction transmitted through the lens unit 9a can be increased from both ends toward the center of the light amount correction region $M_R$ in the X direction.

Due to such a constitution, the additional exposure illumination light source 42 performs irradiation of the second exposure light $L_{2A}$, which is then transmitted through the lens unit 9a. Similar to the second embodiment, the valid integrated light amount of the second exposure light $L_{12A}$ in the Y direction indicates a mountain-shaped distribution as indicated by the curve 211 in FIG. 12.

According to the exposure apparatus 105, the light transmission amount restrictor is constituted of the aperture 59a. Except for that, the exposure apparatus 105 has a constitution similar to the exposure apparatus 101 of the second embodiment, and therefore an exposure method similar to that of the second embodiment is performed.

According to the exposure apparatus 105 of the present embodiment, similar to the second embodiment, when a plurality of projection optical systems (first projection optical systems) arranged in a staggered arrangement are used, unevenness of exposure caused by joining of the exposure regions is reduced.

Moreover, according to the present embodiment, compared to the filter 19b having the first light reducer 19d and the second light reducer 19e, the aperture 59a which can be manufactured at low cost is used, and therefore the cost can be further reduced.

Moreover, in the aperture 59a, the extent of the integrated light amount and the light amount distribution in the X direction can be easily changed by changing the opening shapes of the first openings 59b, and the second openings 59c.

The shapes of the first openings 59b and the second openings 59c of the aperture 59a described above are examples. The opening shape of the aperture 59a need only be a shape in which the opening width in the Y direction changes in the X direction and is not limited to an isosceles trapezoid.

For example, in the exposure apparatus 105, in place of the aperture 59a, an aperture 59d (light transmission amount restrictor, that is, an opening diaphragm) shown in FIG. 22 may be used.

In place of the first openings 59b and the second openings 59c of the aperture 59a, the aperture 59d includes a first opening 59e and a second opening 59f, respectively.

The first opening 59e opens in an elliptical shape which is slender in the Y direction. Due to such a constitution, the opening width of the first opening 59e in the Y direction increases gradually from both ends in the X direction toward the center.

The second opening 59f opens in the same shape as the first opening 59e.

The first opening 59e and the second opening 59f are examples having an opening shape constituted of a curve.

Seventh Embodiment

An exposure apparatus according to a seventh embodiment of the present invention will be described.

Figure 23A:
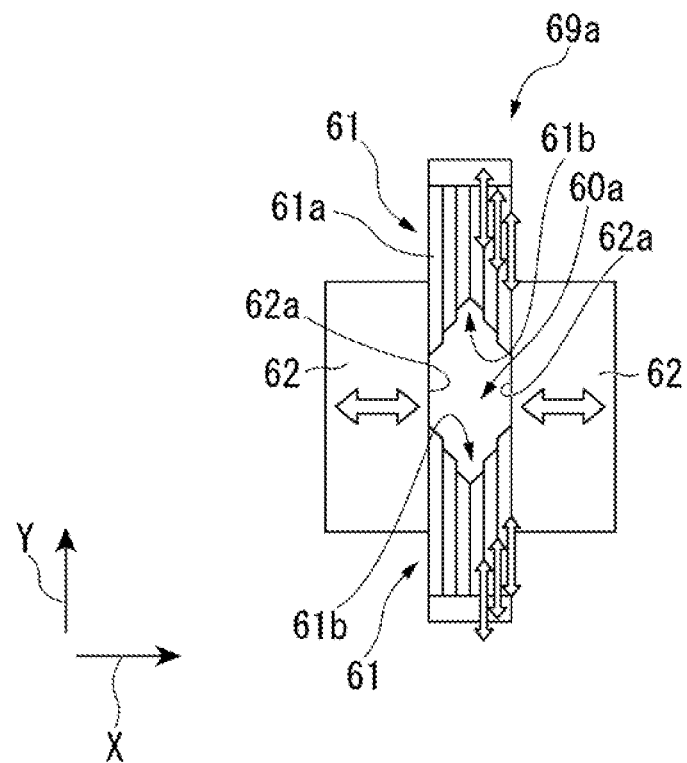
FIG. 23A is a schematic plan view showing an example of a main portion of the light transmission amount restrictor used in an exposure apparatus of a seventh embodiment of the present invention.
Figure 23B:
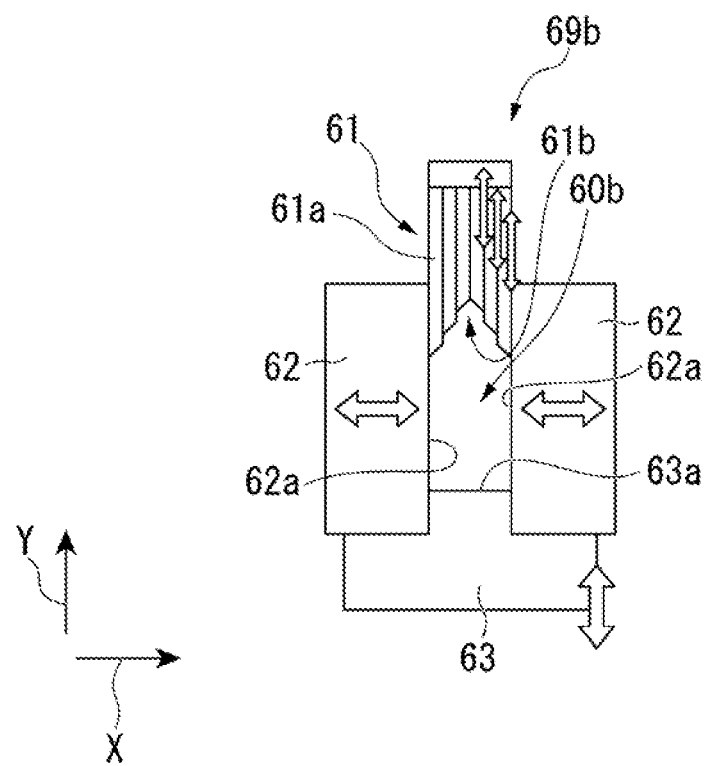
FIG. 23B is a schematic plan view showing another example of the main portion of the light transmission amount restrictor used in the exposure apparatus of the seventh embodiment of the present invention.
Figure 23C:
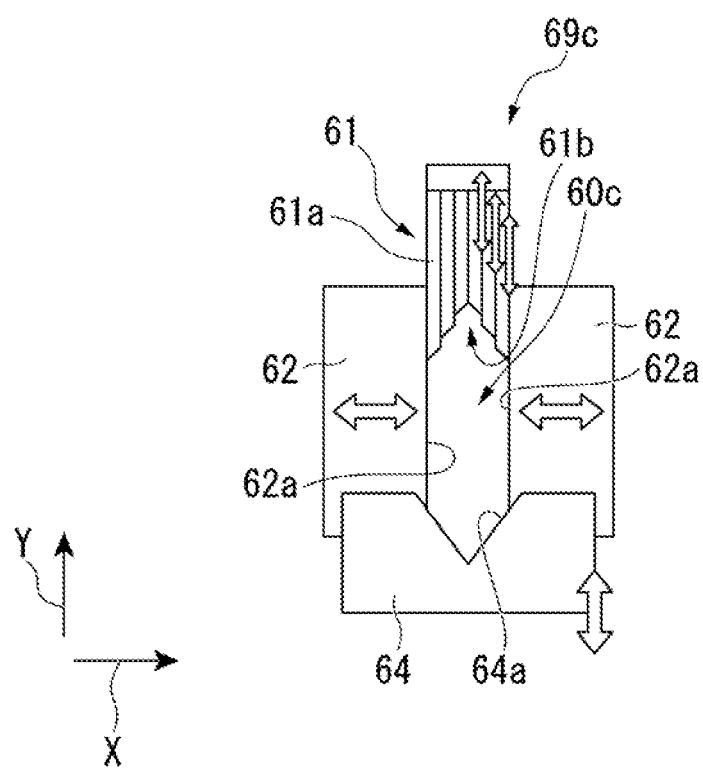
FIG. 23C is a schematic plan view showing another example of the main portion of the light transmission amount restrictor used in the exposure apparatus of the seventh embodiment of the present invention.

FIGS. 23A, 23B, and 23C are schematic plan views showing examples of a main portion of the light transmission amount restrictor used in the exposure apparatus of the seventh embodiment of the present invention.

As shown in FIG. 1, in place of the additional exposure projection optical unit 59 of the exposure apparatus 105 of the sixth embodiment, an exposure apparatus 106 of the present embodiment includes an additional exposure projection optical unit 69 (correction stepper).

Hereinafter, points different from the sixth embodiment will be described mainly.

As shown in FIG. 14A, in place of the projection optical systems 59A in the sixth embodiment, the additional exposure projection optical unit 69 includes projection optical systems 69A.

FIG. 14B shows a constitution of the main portion. In place of the aperture 59a in the sixth embodiment, the projection optical system 69A includes an opening variable aperture 69a (light transmission amount restrictor, that is, an opening diaphragm).

In place of the first openings 59b and the second openings 59c of the aperture 59a in the sixth embodiment, the opening variable aperture 69a has openings 60a having variable opening shapes at positions similar thereto (refer to FIG. 23A).

As shown in FIG. 23A, the opening 60a of the opening variable aperture 69a includes two first shutters 61 facing each other in the Y direction and two second shutters 62 facing each other in the X direction.

The first shutter 61 is constituted of a plurality of movement pieces 61a which can move forward and rearward independently in the Y direction and are arranged in the X direction. The entirety of each tip 61b of the movement piece 61a constitutes an inner edge of the opening 60a in the Y direction. The position and the shape of the inner edge (which will hereinafter be referred to as a first inner edge) of the opening 60a in the Y direction vary depending on a forward/rearward movement position of each of the movement pieces 61a. In the example shown in FIG. 23A, the shape of the first inner edge is a V-shape in which the center of the width in the X direction is recessed the most.

The second shutter 62 includes a plate-shaped member which has a tip 62a extending in the Y direction and can move forward and rearward in the X direction. Each of the tips 62a of the second shutter 62 constitutes an inner edge (which will hereinafter be referred to as a second inner edge)

of the opening 60a in the X direction. The position of the second inner edge of the opening 60a in the X direction varies depending on the forward/rearward movement position of each tip 62a of the second shutter 62. In the example shown in FIG. 23A, the separation distance between the second inner edges is equivalent to the width of the light amount correction region M.

In the example shown in FIG. 23A, the shape of the opening 60a in a plan view is a hexagonal shape which is substantially similar to that of the sixth embodiment.

Although illustration is omitted, a driver for driving each of the first shutters 61 and the second shutters 62 is connected thereto. Regarding a constitution of the driver, for example, a mechanism in which a motor and a cam are combined, a micrometer, a micro-ball screw, or a piezo-motor may be used.

Due to such a constitution, the opening variable aperture 69a functions as a light transmission amount restrictor similar to that of the sixth embodiment.

According to the exposure apparatus 106, the light transmission amount restrictor is constituted of the opening variable aperture 69a. Except for that, the exposure apparatus 106 has a constitution similar to that of the exposure apparatus 101 of the second embodiment, and therefore an exposure method similar to that of the second embodiment is performed.

According to the exposure apparatus 106 of the present embodiment, similar to the second embodiment, when a plurality of projection optical systems (first projection optical systems) arranged in a staggered arrangement are used, unevenness of exposure caused by joining of the exposure regions is reduced.

Moreover, according to the present embodiment, the shape and the size of the opening 60a of the opening variable aperture 69a can be changed. Therefore, even if the shape and the disposition in the Y direction of the first opening 3A and the second opening 3B of the field diaphragm 3 are changed, the second exposure is appropriately performed. Therefore, even when the field diaphragm 3 is changed, the opening variable aperture 69a does not have to be replaced, and therefore the operation efficiency of the exposure apparatus 106 is improved.

Moreover, the exposure amount of the second exposure can be optimized by finely adjusting the shape of the opening 60a, and therefore unevenness of exposure can be further reduced.

The shape of the opening 60a of the opening variable aperture 69a shown in FIG. 23A is an example.

For example, the opening shape of the opening variable aperture 69a can be a slender elliptical shape as that of the aperture 59d in the sixth embodiment.

In the exposure apparatus 106, the opening variable aperture 69a may be replaced with an opening variable aperture 69b (light transmission amount restrictor, that is, an opening diaphragm) shown in FIG. 23B.

In place of the opening 60a of the opening variable aperture 69a, the opening variable aperture 69b has an opening 60b. The opening variable aperture 69b is constituted such that one of the first shutters 61 of the opening variable aperture 69a is replaced with a third shutter 63.

The third shutter 63 includes a plate-shaped member which has a tip 63a extending in the X direction and can move forward and rearward in the Y direction. The tip 63a of the third shutter 63 constitutes an inner edge (which will hereinafter be referred to as a third inner edge) of the opening 60b facing the first inner edge formed by the tips 61b of the first shutters 61. The position of a third inner edge of the opening 60b in the Y direction varies depending on the forward/rearward movement position of the tip 63a of the third shutter. The third shutter 63 includes a driver which is not shown in figures and is similar to those of the second shutters 62.

In the example shown in FIG. 23B, the shape of the opening 60b in a plan view is a substantially pentagonal shape. In such an opening 60b, the opening width in the Y direction increases gradually from both ends in the X direction toward the center.

Due to such a constitution, the opening variable aperture 69b functions as a light transmission amount restrictor substantially similar to that of the sixth embodiment.

In the exposure apparatus 106, the opening variable aperture 69a may be replaced with an opening variable aperture 69c (light transmission amount restrictor, that is, an opening diaphragm) shown in FIG. 23C.

In place of the opening 60a of the opening variable aperture 69a, the opening variable aperture 69c has an opening 60c. The opening variable aperture 69c is constituted such that one of the first shutters 61 of the opening variable aperture 69a is replaced with a fourth shutter 64.

The fourth shutter 64 includes a plate-shaped member which has a V-shaped tip cutout 64a recessed in the Y direction and can move forward and rearward in the Y direction. The tip cutout 64a has a symmetrical shape about a central axis in the X direction of the light amount correction region M which is not shown in figures.

The tip cutout 64a of the fourth shutter 64 constitutes an inner edge (which will hereinafter be referred to as a fourth inner edge) of the opening 60c facing the first inner edge formed by the tips 61b of the first shutters 61. The position of the fourth inner edge of the opening 60c in the Y direction varies depending on the forward/rearward movement position of the tip cutout 64a of the fourth shutter. The fourth shutter 64 includes a driver which is not shown in figures and is similar to those of the second shutters 62.

In the example shown in FIG. 23C, the shape of the opening 60c in a plan view is a substantially hexagonal shape. In such an opening 60c, the opening width in the Y direction increases gradually from both ends in the X direction toward the center. However, depending on the movement position of each of the movement pieces 61a of the first shutters 61, the shape of the opening 60c in a plan view is changed to a shape other than a substantially hexagonal shape.

Due to such a constitution, the opening variable aperture 69c functions as a light transmission amount restrictor substantially similar to that of the sixth embodiment.

Eighth Embodiment

An exposure apparatus according to an eighth embodiment of the present invention will be described.

Figure 24A:
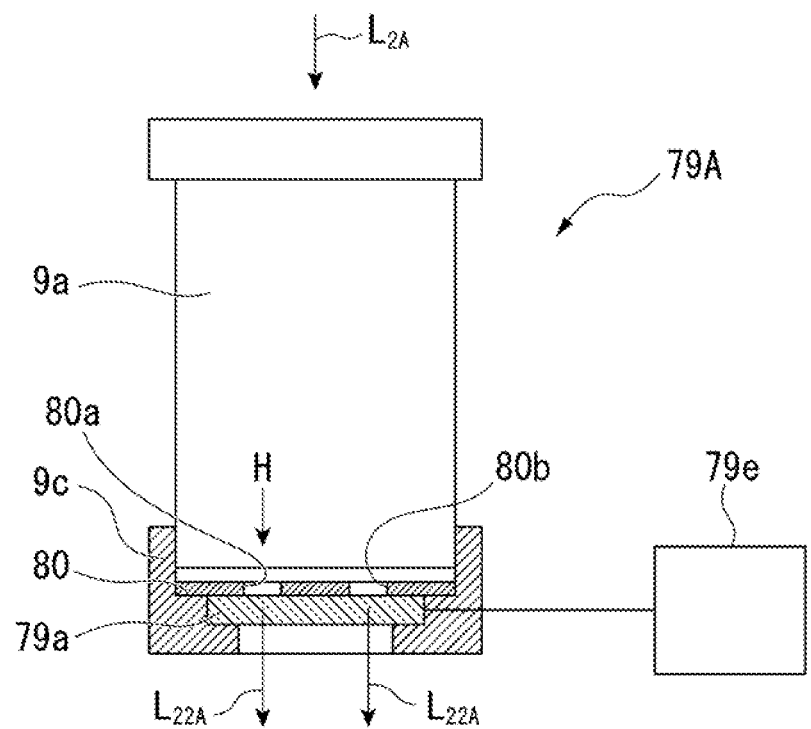
FIG. 24A is a schematic cross-sectional view partially showing an example of the light transmission amount restrictor used in an exposure apparatus of an eighth embodiment of the present invention.
Figure 24B:
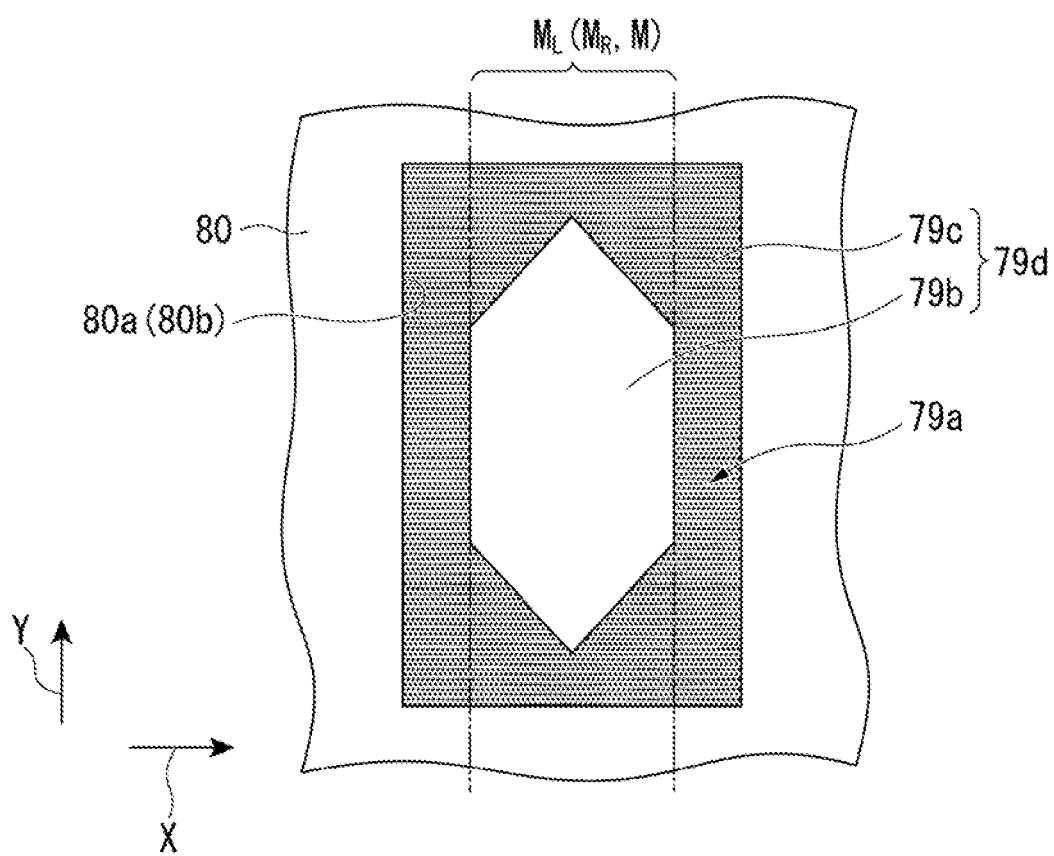
FIG. 24B is an enlarged view viewed in a direction of an arrow H in FIG. 24A.

FIG. 24A is a schematic cross-sectional view partially showing an example of the light transmission amount restrictor used in the exposure apparatus of the eighth embodiment of the present invention. FIG. 24B is an enlarged view viewed in a direction of an arrow H in FIG. 24A.

As shown in FIG. 1, in place of the additional exposure projection optical unit 59 of the exposure apparatus 105 of the sixth embodiment, an exposure apparatus 107 of the present embodiment includes an additional exposure projection optical unit 79 (correction stepper).

Hereinafter, points different from the sixth embodiment will be described mainly.

As shown in FIG. 14A, in place of the projection optical systems 59A in the sixth embodiment, the additional exposure projection optical unit 79 includes projection optical systems 79A.

FIGS. 24A and 24B show a constitution of the main portion. In place of the aperture 59a in the sixth embodiment, the projection optical system 79A includes a shielding plate 80, and a liquid crystal shutter panel 79a (light transmission amount restrictor, that is, a liquid crystal shutter).

The shielding plate 80 is formed using a thin plate having light shading properties. The shielding plate 80 regulates a transmission region of the second exposure light $L_{2A}$ transmitted through the lens unit 9a within a region including positions where the first openings 59b and the second openings 59c of the aperture 59a in the sixth embodiment are formed. The present embodiment has openings 80a and 80b formed to have rectangular shapes respectively surrounding the first openings 59b and the second openings 59c of the aperture 59a in the sixth embodiment.

The shielding plate 80 is fixed to the filter holder 9c such that it faces the lens unit 9a below the lens unit 9a.

The liquid crystal shutter panel 79a is disposed adjacent to the shielding plate 80 below the shielding plate 80 and is fixed to the filter holder 9c. The liquid crystal shutter panel 79a includes a liquid crystal shutter 79d (refer to FIG. 24B) within a range overlapping at least the opening 80a (80b) of the shielding plate 80 in a plan view.

As shown in FIG. 24A, a liquid crystal shutter controller 79e switching the density of each pixel of the liquid crystal shutter 79d is electrically connected to the liquid crystal shutter panel 79a. For example, FIG. 24B shows a state where a hexagonal light transmitter 79b similar to the first openings 59b and the second openings 59c in the sixth embodiment, and a light shield 79c surrounding the light transmitter 79b are formed by the liquid crystal shutter controller 79e.

The liquid crystal shutter controller 79e can change patterns of the light transmitter 79b and the light shield 79c by independently turning on and off each pixel of the liquid crystal shutter 79d.

Therefore, according to the projection optical system 79A, the second exposure light $L_{2A}$ is converted into the second exposure light $L_{22A}$ shaped into a suitable shape including a hexagonal shape within a range of the openings 80a and 80b in a plan view, and therefore it is possible to perform an exposure of the exposure subject 6 which is not shown in figures.

Due to such a constitution, the liquid crystal shutter panel 79a functions as a light transmission amount restrictor similar to that of the sixth embodiment.

According to the exposure apparatus 107, the light transmission amount restrictor is constituted of the liquid crystal shutter panel 79a. Except for that, the exposure apparatus 107 has a constitution similar to the exposure apparatus 101 of the second embodiment, and therefore an exposure method similar to that of the second embodiment is performed.

According to the exposure apparatus 107 of the present embodiment, similar to the second embodiment, when a plurality of projection optical systems (first projection optical systems) arranged in a staggered arrangement are used, unevenness of exposure caused by joining of the exposure regions is reduced.

Moreover, according to the present embodiment, the shape and the size of the light transmitter 79b of the liquid crystal shutter panel 79a can be changed. Therefore, even if the shape and disposition in the Y direction of the first opening 3A and the second opening 3B of the field diaphragm 3 are changed, the second exposure is appropriately performed. Moreover, even when the field diaphragm 3 is changed, the liquid crystal shutter panel 79a does not have to be replaced, and therefore the operation efficiency of the exposure apparatus 107 is improved.

Moreover, the exposure amount of the second exposure can be optimized by finely adjusting the shape of the light transmitter 79b, and therefore unevenness of exposure can be further reduced.

In description of each of the embodiments, an example of the case where the first light source, the second light source, the diaphragm, the first projection optical system, and the correction stepper (which will hereinafter be referred to as a stepper) are fixed, and a scanning exposure is performed by moving the exposure photomask and the exposure target (which will hereinafter be referred to as an exposure object) in the exposure apparatus has been described. However, regarding a scanning exposure, relative scanning may be performed by relatively moving the stepper and the exposure object in a scanning direction (Y direction, that is, the first direction). Therefore, in the exposure apparatus, the stepper may move in the scanning direction, and the exposure object may be fixed. Moreover, in the exposure apparatus, the stepper and the exposure object may move individually.

In description of each of the embodiments, an example of the case where the first direction and the second direction are orthogonal to each other has been described. However, the first direction and the second direction need only intersect each other in a flat plane, and the intersecting angle is not limited to a right angle.

In description of each of the embodiments, an example of the case where the photomask 1 is moved by the first driver 10 and the exposure subject 6 is moved by the second driver 11 moving the base 7 has been described. However, the photomask 1 and the base 7 may be moved in the scanning direction by one driver.

In description of each of the embodiments, an example of the case where the second projection optical system is disposed at a position of the first projection optical system moved in parallel in the first direction has been described. However, since the second projection optical system need only be able to irradiate only the light amount correction region with the second exposure light, the optical axis of the second projection optical system may be disposed at a position other than that of the optical axis of the first projection optical system moved in parallel in the first direction. For example, the second projection optical system may be disposed at a position having an optical axis at a position overlapping the light amount correction region in a plan view.

In description of each of the embodiments, an example of the case where the light transmission amount restrictor is disposed between the second projection optical system and the exposure target has been described. However, the light transmission amount restrictor may be disposed at any position as long as it stays between the second light source and the exposure target.

In description of the seventh and eighth embodiments, a constitution of the light transmission amount restrictor for forming an opening at a position substantially similar to the first openings 59b and the second openings 59c of the sixth embodiment has been described. However, for example, the constitution of the light transmission amount restrictor of the seventh and eighth embodiments may be used to form the first openings 49b and the second openings 49c of the fifth embodiment.

In description of the eighth embodiment, an example of the case where one liquid crystal shutter panel 79a in which the liquid crystal shutter 79d is disposed in a region on which it overlaps the openings 80a and 80b is used has been described. However, liquid crystal shutter panels may be provided one each in a range overlapping the openings 80a and 80b. In this case, a smaller-sized liquid crystal shutter panel can be used.

In description of the eighth embodiment, an example of a constitution using the shielding plate 80 has been described. However, depending on the light amount of the second exposure light and an extinction ratio of the liquid crystal shutter panel, the shielding plate 80 may be omitted.

In description of the eighth embodiment, an example of the case where an optical opening corresponding to the opening shape of the aperture is formed by the light transmitter 79b of the liquid crystal shutter panel 79a has been described.

However, when a transmittance distribution can be controlled through liquid crystal driving, an optical opening having a transmittance distribution corresponding to the filter of the first and second embodiments may be formed. Methods of controlling a transmittance distribution through liquid crystal driving include multi-value control of the transmittance of liquid crystal, transmittance control performed by an area gradation method, and the like.

In description of each of the embodiments, an example of the case where the projection optical unit 5 performs an exposure of the entire width of the exposure subject 6 in the X direction has been described. However, if an exposure can be performed by a single photomask 1 with an exposure pattern of the exposure subject 6, the projection optical unit 5 may have a size covering a portion in the X direction. In this case, the exposure subject 6 in its entirety is subjected to an exposure by performing a scanning exposure of the exposure apparatus 100 in the Y direction a plurality of times in a manner of being shifted in the X direction.

Ninth Embodiment

An exposure apparatus according to a ninth embodiment of the present invention will be described.

Figure 25:
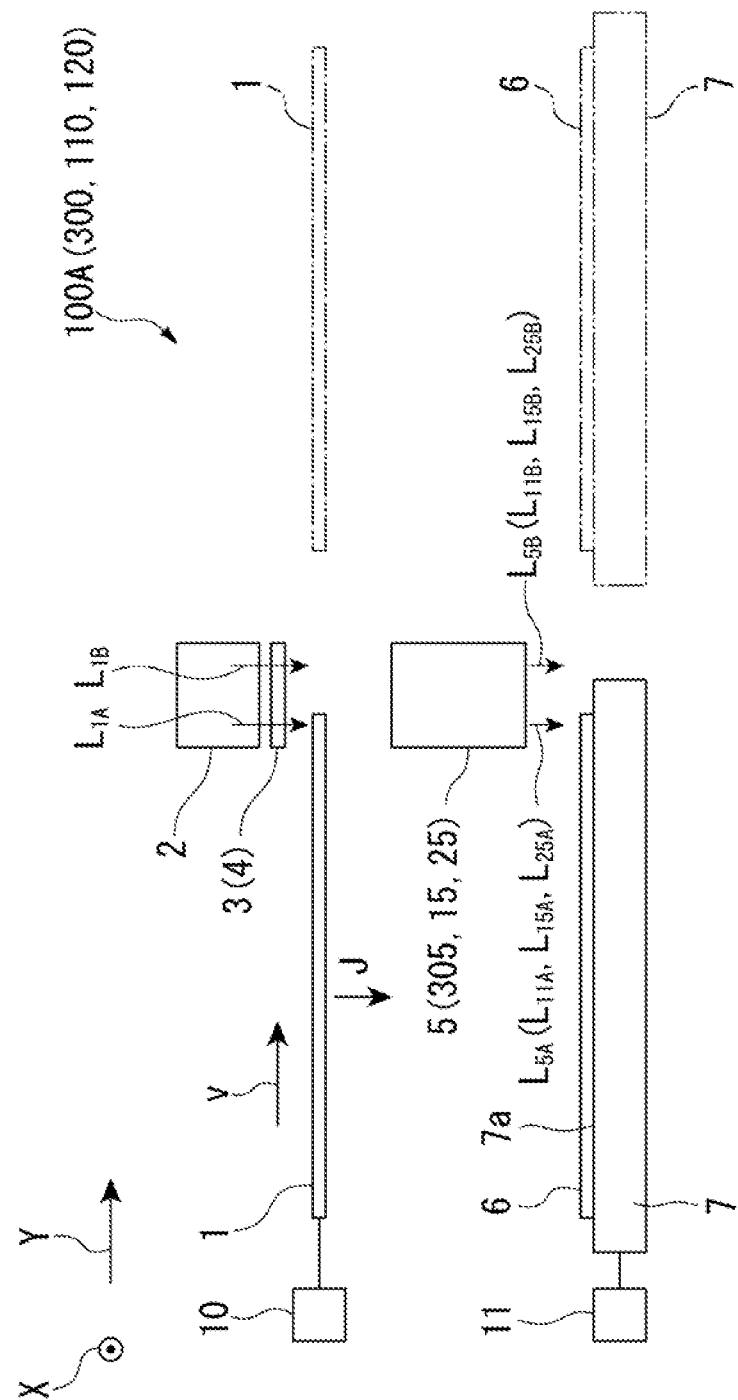
FIG. 25 is a schematic front view showing an example of an exposure apparatus of a ninth embodiment of the present invention.
Figure 26:
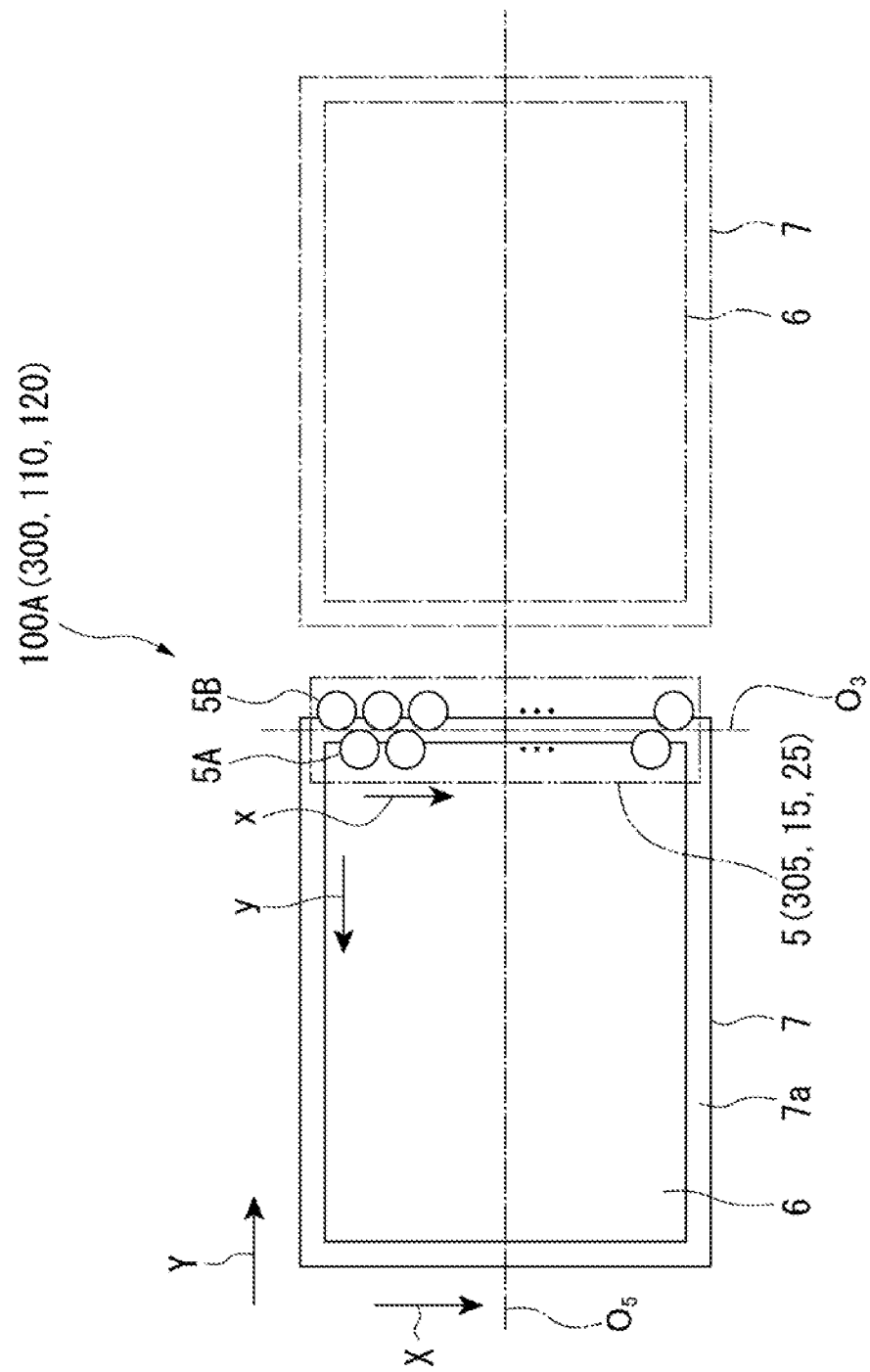
FIG. 26 is a plan view viewed in a direction of an arrow J in FIG. 25.
Figure 27:
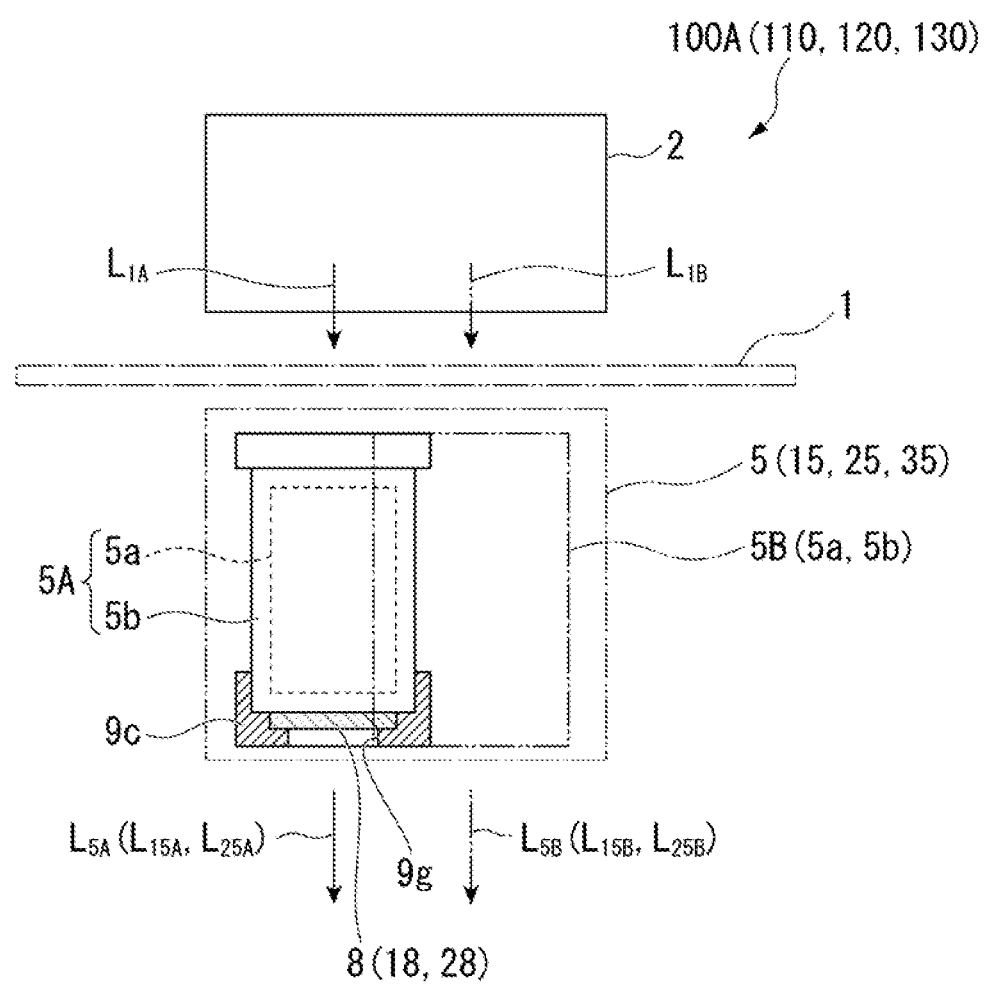
FIG. 27 is a schematic cross-sectional view partially showing a constitution of a main portion of the exposure apparatus of the ninth embodiment of the present invention.
Figure 28:
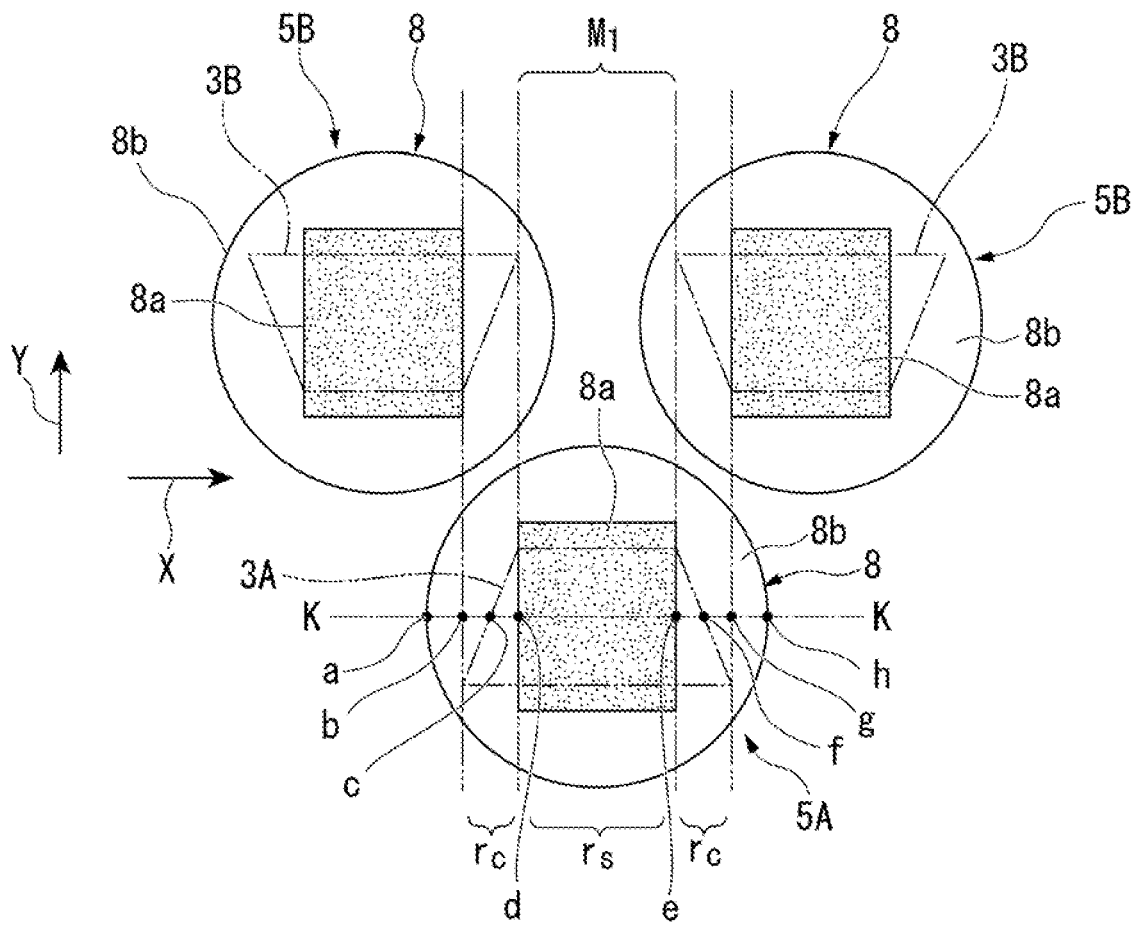
FIG. 28 is a schematic plan view showing an example of a light transmission amount reducer used in the exposure apparatus of the ninth embodiment of the present invention.
Figure 29:
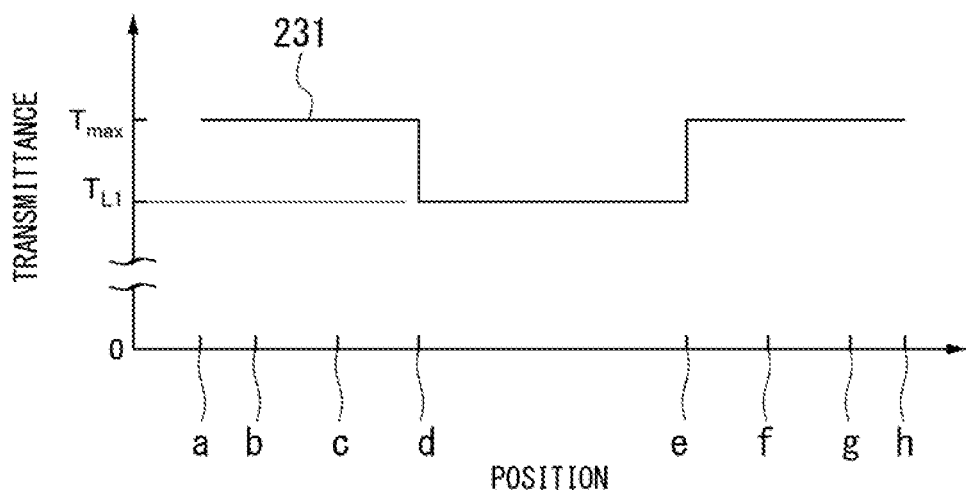
FIG. 29 is a schematic graph showing a transmittance distribution along line K-K in FIG. 28.

FIG. 25 is a schematic front view showing an example of the exposure apparatus of the ninth embodiment of the present invention. FIG. 26 is a plan view viewed in a direction of an arrow J in FIG. 25. FIG. 27 is a schematic cross-sectional view partially showing a constitution of a main portion of the exposure apparatus of the ninth embodiment of the present invention. FIG. 28 is a schematic plan view showing an example of a light transmission amount reducer used in the exposure apparatus of the ninth embodiment of the present invention. FIG. 29 is a schematic graph showing a transmittance distribution along line K-K in FIG. 28. In FIG. 29, the horizontal axis of the graph indicates the position in the X direction, and the vertical axis indicates the transmittance.

An exposure apparatus 100A shown in FIGS. 25 and 26 is a scanning exposure apparatus performing an equal-magnification scanning exposure of the exposure subject 6 (exposure target) with an exposure pattern of the photomask 1 (exposure photomask, refer to FIG. 3) using a plurality of projection optical systems. The exposure apparatus 100A includes the base 7, the second driver 11, the first driver 10, and the illumination light source 2 (light source, that is, a main illumination light source), the field diaphragm 3 (diaphragm), the projection optical unit 5. The base 7, the second driver 11, the first driver 10, the illumination light source 2 (light source, that is, a main illumination light source), the field diaphragm 3 (diaphragm), and the projection optical unit 5 have a constitution similar to that in the exposure apparatus 100.

Hereinafter, points different from the exposure apparatus 100 of the first embodiment will be described mainly.

As shown in FIG. 26, the projection optical unit 5 includes a plurality of first row projection optical systems 5A (projection optical systems) and a plurality of second row projection optical systems 5B (projection optical systems) which are arranged in a staggered arrangement along the axis $O_3$. A light attenuation filter (light transmission amount reducer, which will be described below) 8 (refer to FIG. 27) is provided in each of the first row projection optical systems 5A and each of the second row projection optical systems 5B.

Each of the second row projection optical systems 5B differs from the first row projection optical system 5A in disposition only and has a constitution similar to that of the first row projection optical system 5A.

As shown in FIG. 27, the first row projection optical system 5A (second row projection optical system 5B) includes a lens 5a and a lens barrel 5b.

The lens 5a is constituted of an optical image forming system forming an object image as an upright equal-magnification image on an image surface.

The lens barrel 5b holds the lens 5a at a posture such that the optical axis of the lens 5a becomes parallel to the vertical axis.

The first row projection optical system 5A (second row projection optical system 5B) is disposed at a position where the mask pattern P of the photomask 1 and the upper surface of the exposure subject 6 coated with a resist have a conjugate positional relationship. In the present embodiment, emission light from the first row projection optical system 5A toward the exposure subject 6 becomes a parallel luminous flux.

As shown in FIG. 27, in the exposure apparatus 100A, the light attenuation filter 8 (light transmission amount reducer) is disposed in the lower end of each lens barrel 5b in the projection optical unit 5. Each of the light attenuation filters 8 is fixed at a position determined with respect to the lens 5a by the filter holder 9c fixed to the lower end of the lens barrel 5b.

The light attenuation filter 8 converts exposure light $L_{1A}$ ($L_{1B}$) transmitted through the first row projection optical system 5A (second row projection optical system 5B) into exposure light $L_{5A}$ ($L_{5B}$) reduced in at least a portion of the light amount.

A light amount correction region $M_1$ (refer to FIGS. 28 and 30, which will be described below) on the exposure subject 6 is irradiated with the exposure light $L_{5A}$ ($L_{5B}$). Here, the light amount correction region $M_1$ on the exposure subject 6 is a region overlapping at least the single opening region $r_S$ in a plan view. In the present embodiment, as an example, the light amount correction region $M_1$ is a region that overlaps only the single opening region $r_S$. That is, the light amount correction region $M_1$ overlaps a belt-shaped region extending in the Y direction by the width of the single opening region $r_S$ in the X direction in a plan view.

In addition, a penetration hole 9g, through which the exposure light $L_{5A}$ ($L_{5B}$) that has been transmitted through at least a light reducer 8a is transmitted, is formed at the center of the filter holder 9c.

The filter holder 9c is detachably attached to the lens barrel 5b from below. A method of attaching/detaching the filter holder 9c need only be able to be disposed such that the light reducer 8a of the light attenuation filter 8 overlaps the range of the light amount correction region $M_1$ in a plan view described above and is not particularly limited. For example, a suitable mount or screw fitting capable of positioning with respect to the lens barrel 5b in the circumferential direction may be used. In the present embodiment, since the exposure light $L_{5A}$ ($L_{5B}$) emitted from the lens 5a is a parallel luminous flux along the optical axis, position alignment of the light attenuation filter 8 in the optical axis direction (up-down direction) does not have to be performed with high accuracy.

The light attenuation filter 8 is held by the filter holder 9c in a state where the position of the light attenuation filter 8 in the lateral direction is positionally aligned. Accordingly, as described above, the light attenuation filter 8 is disposed such that the light reducer 8a has a positional relationship overlapping the light amount correction region $M_1$ in a plan view.

Next, as shown in FIG. 28, the light attenuation filter 8 includes the light reducer 8a (uniform density filter) and a light transmitter 8b.

The light reducer 8a is a part attenuating the exposure light $L_{1A}$ ($L_{1B}$) transmitted through the field diaphragm 3 and the lens 5a at a uniform transmittance Tu.

The light reducer 8a is formed to have a rectangular external shape laid in the X direction and the Y direction in a plan view. The light reducer 8a is formed as a part covering the entirety of the single opening region $r_S$ in the X direction of the first opening 3A (second opening 3B) which the light attenuation filter 8 faces in a plan view. Therefore, the width of the light reducer 8a in the X direction is equivalent to the width of the single opening region $r_S$ in the X direction of the first opening 3A (second opening 3B) which the light attenuation filter 8 faces. The width of the light reducer 8a in the Y direction is equal to or larger than the width of the single opening region $r_S$ in the Y direction of the first opening 3A (second opening 3B) which the light attenuation filter 8 faces.

The light transmitter 8b is formed in a region excluding the light reducer 8a in the light attenuation filter 8. A transmittance $T_{max}$ of the light transmitter 8b is higher than the transmittance $T_{L1}$ of the light reducer 8a. It is more preferable that the transmittance of the light transmitter 8b be within a range of 90% to 100%.

Due to such a constitution, the light attenuation filter 8 has a transmittance distribution in the X direction as indicated by a curve 231 shown in FIG. 29.

The reference signs on the horizontal axis in FIG. 29 indicate positions of points of the same reference signs on a line K-K disclosed in FIG. 28.

The point a is an end point of the light attenuation filter 8 on the negative direction side in the X direction (negative X direction side, that is, one side in the X direction corresponding to the left side in the diagram) in the line K-K. Each of the section from the point b to the point d and the section from the point e to the point g is a section overlapping the multi-opening region $r_C$. Each of the points c and f is a center point of the multi-opening region $r_C$ in the X direction. The section from the point d to the point e is a section overlapping the single opening region $r_S$. The point h is an end point of the light attenuation filter 8 on the positive direction side in the X direction (positive X direction side, that is, the other side in the X direction corresponding to the right side in the diagram) in the line K-K.

The light reducer 8a is disposed between the point d and the point e. The light transmitter 8b is formed in each of the sections from the point a to the point d and from the point e to the point h.

The curve 231 is a bent line having a uniform value $T_{L1}$ in a section from the point d to the point e and a uniform value $T_{max}$ (here, $T_{max} > T_{L1}$) at positions other than this section.

For example, the light attenuation filter 8 may be manufactured by performing vapor deposition or the like of a thin metal film in a part serving as the light reducer 8a on a surface of a glass substrate.

Due to the light attenuation filter 8 having such a constitution, the exposure light $L_{1A}$ ($L_{1B}$) transmitted through the field diaphragm 3 and the lens 5a is converted into the exposure light $L_{5A}$ ($L_{5B}$) subjected to light attenuation in accordance with the transmittances of the light reducer 8a and the light transmitter 8b. The transmittance $T_{L1}$ of the light reducer 8a is selected from a range exceeding 0% to less than 100% such that unevenness of the valid exposure amount (which will be described below) due to the exposure light $L_{5A}$ ($L_{5B}$) can be reduced. A method of determining the transmittance $T_{L1}$ of the light reducer 8a will be described in description of an operation which will be described below.

Figure 30:
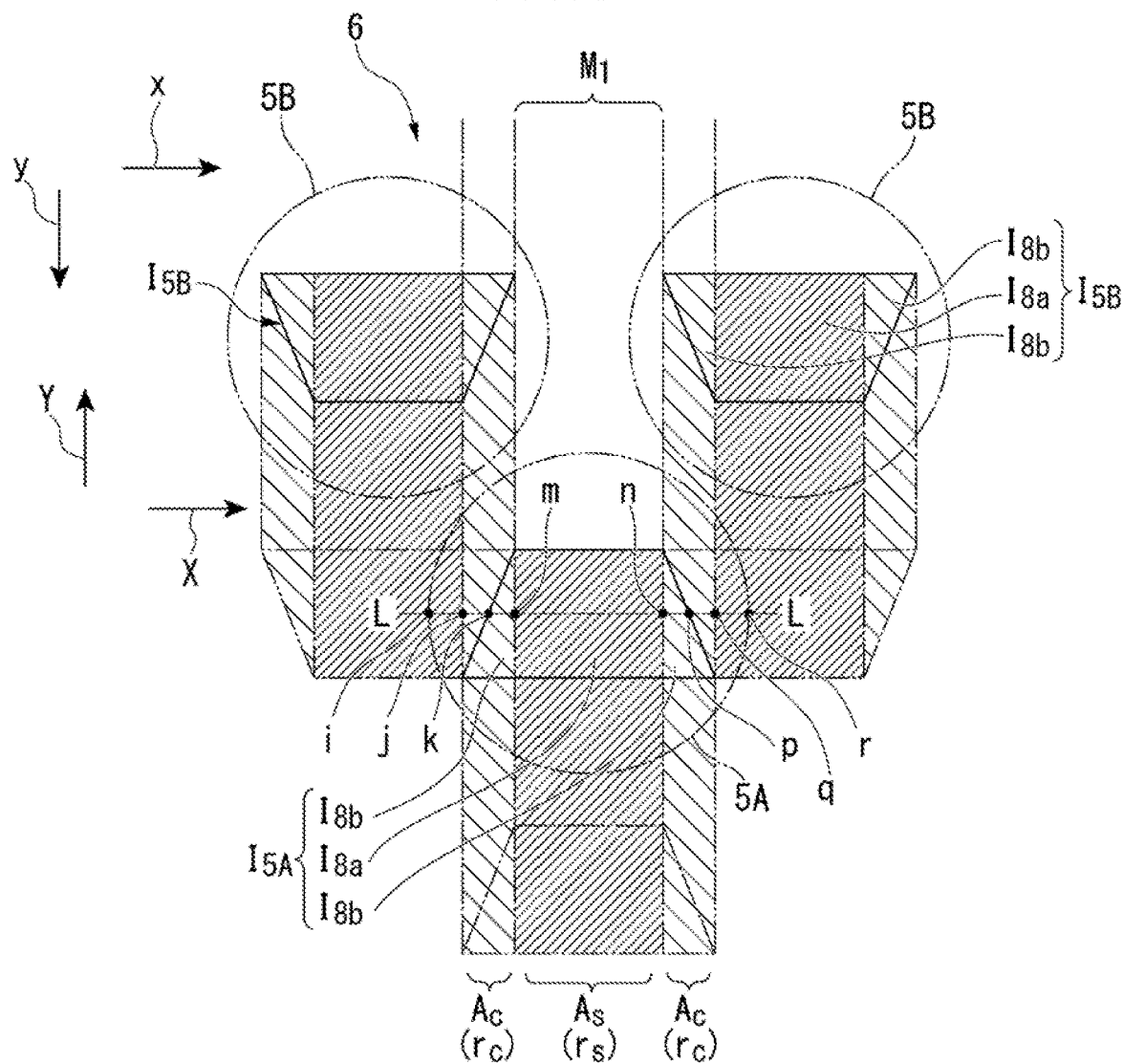
FIG. 30 is a schematic view showing an exposure in the exposure apparatus of the ninth embodiment of the present invention.
Figure 31:
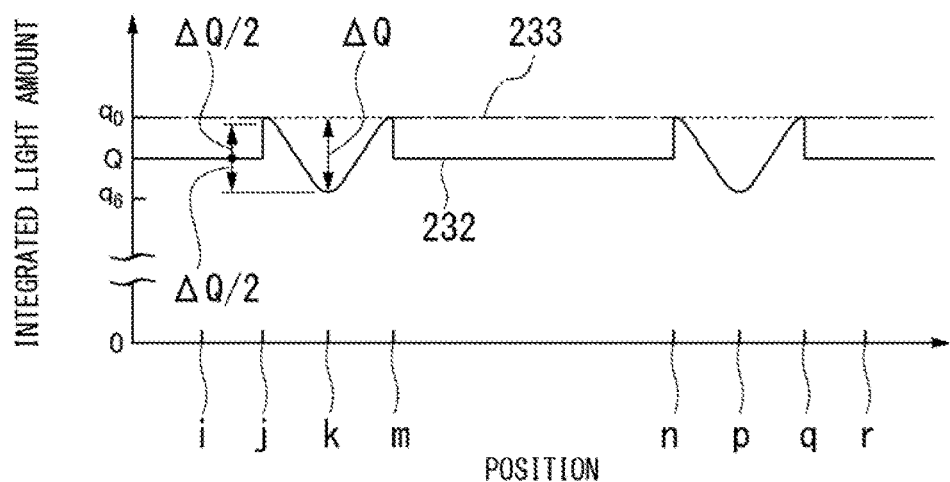
FIG. 31 is a schematic graph describing an integrated light amount in an exposure of the exposure apparatus of the ninth embodiment of the present invention.

Next, an operation of the exposure apparatus 100A will be described. FIG. 30 is a schematic view showing an exposure in the exposure apparatus of the ninth embodiment of the present invention. FIG. 31 is a schematic graph describing an integrated light amount in an exposure of the exposure apparatus of the ninth embodiment of the present invention. In the graph of FIG. 31, the horizontal axis indicates the position in the X direction, and the vertical axis indicates the integrated light amount.

First, an exposure operation and an exposure amount of an exposure apparatus 300 in a comparative example shown in FIG. 25 will be described before an exposure operation of the exposure apparatus 100A is described. In place of the projection optical unit 5 of the exposure apparatus 100A of the ninth embodiment, the exposure apparatus 300 includes a projection optical unit 305. The projection optical unit 305 is constituted by removing the light attenuation filter 8 from the projection optical unit 5. That is, the exposure apparatus 300 of the comparative example has a constitution similar to that in which the additional exposure illumination light source 12 (second light source) and the additional exposure projection optical unit 9 (correction stepper) are removed from the exposure apparatus 100 of the first embodiment.

The exposure method of the comparative example is similar to that of the first exposure of the first embodiment shown in FIG. 9. In addition, the valid exposure amount in the comparative example is similar to that in schematic views shown in FIGS. 10A and 10B.

Similar to the first exposure of the first embodiment shown in FIGS. 9, 10A, and 10B, in an exposure of the exposure apparatus 300 of the comparative example, even if the opening width of the field diaphragm 3 viewed in the Y direction is uniform in the X direction, the valid exposure amount of the multi-exposure region $A_C$ is decreased compared to that of the single exposure region $A_S$.

In the present embodiment, since the projection optical unit 5 includes the light attenuation filter 8, the exposure amount in the single exposure region $A_S$ is reduced. Accordingly, valid unevenness of exposure based on decrease in valid exposure amount in the multi-exposure region $A_C$ is reduced.

Hereinafter, the exposure method of the present embodiment will be described mainly regarding points different from the operation of the comparative example.

The exposure method of the present embodiment is performed favorably by using the exposure apparatus 100A.

The exposure method of the present embodiment includes (1) preparing the exposure apparatus 100A including the field diaphragm 3, and (2) performing an exposure. When the exposure is performed, the exposure amount in the light amount correction region in a plan view is reduced by the light transmission amount reducer.

The exposure operation of the exposure apparatus 100A differs from an operation of the exposure apparatus 300 in the following points. The exposure light $L_{5A}$ and the exposure light $L_{5B}$ emitted from the projection optical unit 5 are transmitted through the light attenuation filter 8. Therefore, the light amount distribution of an optical image projected on the exposure subject 6 by the exposure light $L_{5A}$ and the exposure light $L_{5B}$ differs from the light amount distributions of the first optical image 13A and the second optical image 13B. Decrease in light amount of an optical image projected on the exposure subject 6 is based on the transmittance of the light reducer 8a and the transmittance of the light transmitter 8b of the light attenuation filter 8. As shown in FIG. 30, a first optical image $I_{5A}$ (second optical image $I_{5B}$) projected on the exposure subject 6 by the exposure light $L_{5A}$ ($L_{5B}$) is constituted of a first light attenuation image $I_{8a}$ and a second light attenuation image $I_{8b}$.

The first light attenuation image $I_{8a}$ is formed in a region overlapping the light reducer 8a in a range of the first opening 3A (second opening 3B). In the case of the present embodiment, the first light attenuation image $I_{8a}$ is an optical image in the range of the single opening region $r_S$. The light amount of the first light attenuation image $I_{8a}$ is decreased from the light amount of the first optical image 13A (second optical image 13B) in accordance with the transmittance $T_{L1}$ of the light reducer 8a.

The second light attenuation image $I_{8b}$ is formed in a region overlapping the light transmitter 8b in a range of the first opening 3A (second opening 3B). In the case of the present embodiment, the second light attenuation image $I_{8b}$ is an optical image in the region of the multi-opening region $r_C$. The light amount of the second light attenuation image $I_{8b}$ is decreased from the light amount of the first optical image 13A (second optical image 13B) in accordance with the transmittance $T_{max}$ of the light transmitter 8b. However, due to a relationship of $T_{max} > T_{L1}$, the light amount of the second light attenuation image $I_{8b}$ is larger than the light amount of the first light attenuation image $I_{8a}$.

Therefore, the integrated light amount in a case where the first optical image $I_{5A}$ and the second optical image $I_{5B}$ are scanned on the exposure subject 6 is not decreased much in the multi-opening region $r_C$ but is decreased more significantly in the single opening region $r_S$.

For easy comparison with the comparative example, FIG. 31 shows the integrated light amount at the time of a scanning exposure in a case where the transmittance $T_{max}$ is 100%.

The reference signs on the horizontal axis in FIG. 31 indicate positions of points of the same reference signs on a line L-L disclosed in FIG. 30. The points i, j, k, m, n, p, q, and r on the line L-L respectively correspond to the points a, b, c, d, e, f, g, and h on the line K-K of the light attenuation filter 8. Therefore, each of the section from the point j to the point m and the section from the point n to the point q is the multi-exposure region $A_C$ overlapping the multi-opening regions $r_C$ in a plan view. The section from the point m to the point n is the single exposure region $A_S$ overlapping the single opening regions $r_S$ in a plan view. In the present embodiment, the single exposure region $A_S$ becomes the light amount correction region $M_1$.

In FIG. 31, a curve 232 (refer to the solid lines) indicates the integrated light amount in the present embodiment, and a curve 233 (refer to one-dot dashed line) indicates the integrated light amount in the comparative example. However, in the multi-exposure region $A_C$, the curve 233 overlaps the curve 232.

As indicated by the curves 232 and 233, the integrated light amount in the present embodiment is similar to the integrated light amount of the comparative example in the multi-exposure region $A_C$. Therefore, for example, in the multi-exposure region $A_C$, the integrated light amount is decreased between the point j and the point k by $\Delta Q (=q_0-q_6)$.

In contrast, compared to the integrated light amount in the same region in the comparative example, the integrated light amount of the single exposure region $A_S$ overlapping the light amount correction region $M_1$ is decreased in accordance with the transmittance $T_{L1}$ of the light reducer 8a. In addition, the integrated light amount of the single exposure region $A_S$ overlapping the light amount correction region $M_1$ is a uniform value Q (here, $q_6 < Q < q_0$).

In this manner, in the present embodiment, a total fluctuation range $\Delta Q$ of the integrated light amount does not differ from that in the comparative example. However, compared to the comparative example, the integrated light amount of the single exposure region $A_S$ is decreased from $q_0$ to Q. Accordingly, the fluctuation amount of the exposure amount of the multi-exposure region $A_C$ with respect to the exposure amount of the single exposure region $A_S$ becomes smaller than $\Delta Q$.

Particularly, a relationship $Q = (q_0 + q_6)/2$ is established by suitably setting the transmittance $T_{L1}$ of the light reducer 8a. At this time, since the fluctuation amount of the exposure amount of the multi-exposure region $A_C$ with respect to the exposure amount of the single exposure region $A_S$ becomes $\Delta Q/2$, unevenness of exposure is minimized. Therefore, it is more preferable that the transmittance $T_{L1}$ of the light reducer 8a be set such that the relationship $Q = (q_0 + q_6)/2$ is established.

In this manner, when unevenness of the exposure amount of the multi-exposure region $A_C$ with respect to the exposure amount of the single exposure region $A_S$ is reduced, unevenness of exposure caused by joining of the exposure regions is reduced. Accordingly, for example, a fluctuation or the like of the line width corresponding to the mask pattern P is reduced, and therefore an exposure pattern having higher accuracy can be obtained.

As described above, according to the exposure apparatus 100A of the present embodiment, when a plurality of projection optical systems arranged in a staggered arrangement are used, unevenness of exposure caused by joining of exposure regions can be reduced.

Tenth Embodiment

An exposure apparatus according to a tenth embodiment of the present invention will be described.

Figure 32:
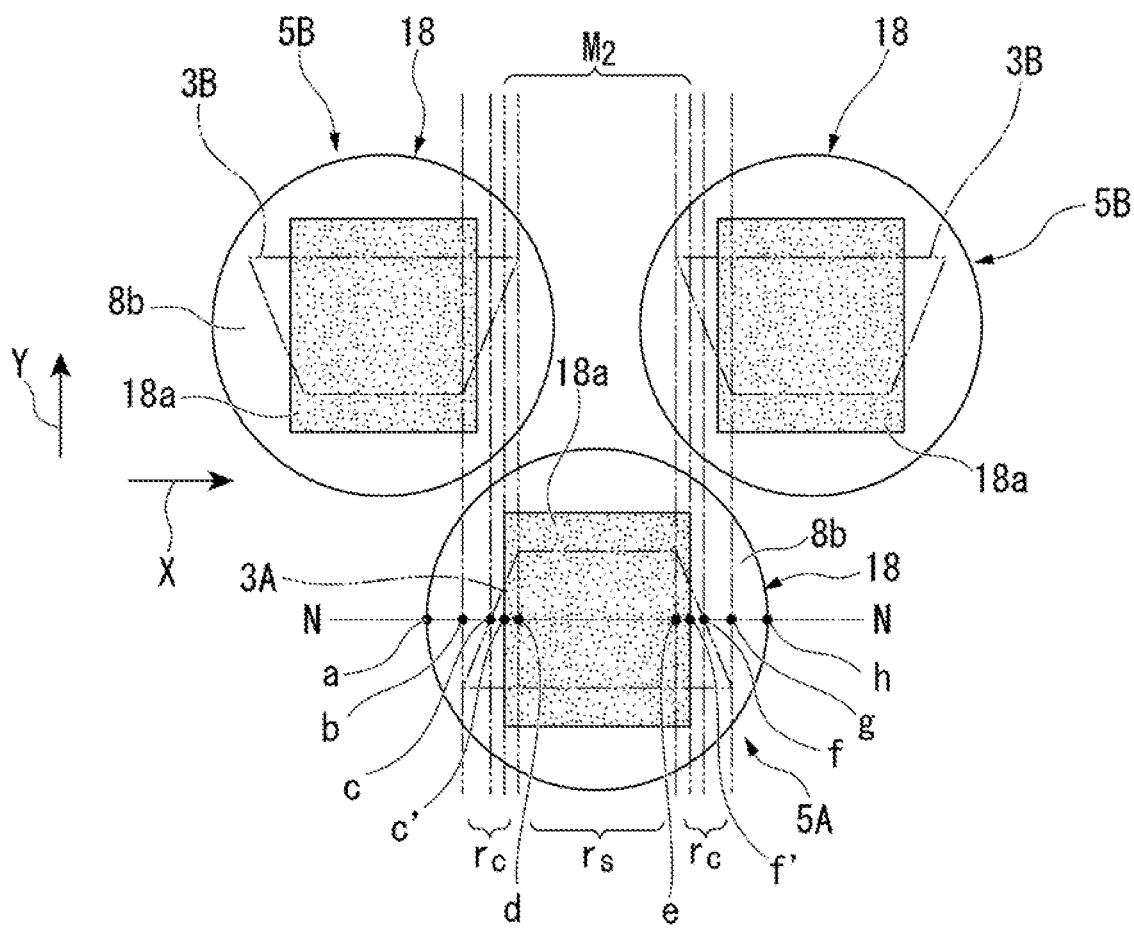
FIG. 32 is a schematic plan view showing an example of the light transmission amount reducer used in an exposure apparatus of a tenth embodiment of the present invention.
Figure 33:
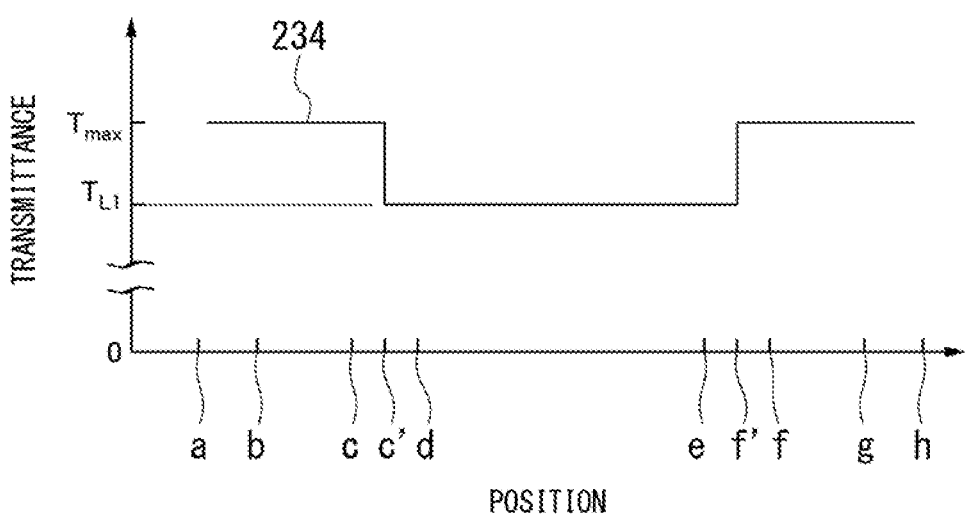
FIG. 33 is a schematic graph showing a transmittance distribution along line N-N in FIG. 32.

FIG. 32 is a schematic plan view showing an example of the light transmission amount reducer used in the exposure apparatus of the tenth embodiment of the present invention. FIG. 33 is a schematic graph showing a transmittance distribution along line N-N in FIG. 32. In FIG. 33, the horizontal axis of the graph indicates the position in the X direction, and the vertical axis indicates the transmittance.

Figure 34:
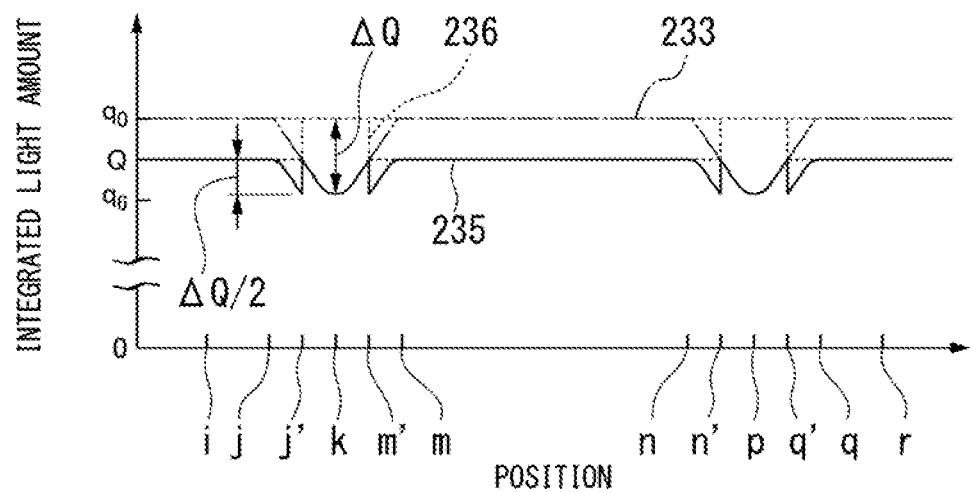
FIG. 34 is a schematic graph describing an integrated light amount in an exposure of the exposure apparatus of the tenth embodiment of the present invention.

FIG. 34 is a schematic graph describing an integrated light amount in an exposure of the exposure apparatus of the tenth embodiment of the present invention. In FIG. 34, the horizontal axis of the graph indicates the position in the X direction, and the vertical axis indicates the integrated light amount.

As shown in FIGS. 25 and 26, in place of the projection optical unit 5 of the exposure apparatus 100A of the ninth embodiment, an exposure apparatus 110 of the present embodiment includes a projection optical unit 15.

As shown in FIG. 27, in place of the light attenuation filter 8 of the projection optical unit 5 in the ninth embodiment, the projection optical unit 15 includes a light attenuation filter 18 (light transmission amount reducer).

Hereinafter, points different from the ninth embodiment will be described mainly.

As shown in FIG. 27, similar to the light attenuation filter 8 in the ninth embodiment, the light attenuation filter 18 is disposed in the lower end of each lens barrel 5b in each of the first row projection optical system 5A and the second row projection optical system 5B in the projection optical unit 15. In each of the light attenuation filters 18, a position with respect to the lens 5a is fixed by the filter holder 9c fixed to the lower end of the lens barrel 5b.

The light attenuation filter 18 converts the exposure light $L_{1A}$ ($L_{1B}$) transmitted through the first row projection optical system 5A (second row projection optical system 5B) into exposure light $L_{15A}$ ($L_{15B}$) reduced in at least a portion of the light amount.

A light amount correction region $M_2$ (refer to FIG. 32, which will be described below) on the exposure subject 6 is irradiated with the exposure light $L_{15A}$ ($L_{15B}$). Here, the light amount correction region $M_2$ on the exposure subject 6 is a region overlapping at least the single opening region $r_S$ in a plan view. In the present embodiment, as an example, the light amount correction region $M_2$ is a region overlapping a portion of the single opening region $r_S$ and each of the multi-opening regions $r_C$ adjacent to both ends of the single opening region $r_S$.

As shown in FIG. 32, in place of the light reducer 8a the ninth embodiment, the light attenuation filter 18 includes a light reducer 18a (uniform density filter).

The light reducer 18a is constituted by extending both ends of the light reducer 8a in the X direction of the ninth embodiment outward. Both ends of the light reducer 8a in the X direction extend by less than 50% of the width of each multi-opening region $r_C$ in the X direction. In the example shown in FIG. 32, as an example, the light reducer 18a is further increased in width on both sides in the X direction by 25% of the width of the multi-opening region $r_C$ in the X direction than the light reducer 8a.

In a plan view, the light reducer 18a is disposed such that it overlaps each of the entirety of the single opening region $r_S$ of the first opening 3A (second opening 3B) and a region (region of one fourth of the multi-opening region $r_C$ in FIG. 32) of a portion of the multi-opening regions $r_C$ on both sides in the X direction adjacent thereto.

The transmittance of the light reducer 18a is similar to that of the light reducer 8a in the ninth embodiment.

The light transmitter 8b in the present embodiment is formed in a region excluding the light reducer 18a in the light attenuation filter 18.

Due to such a constitution, the light attenuation filter 18 has a transmittance distribution in the X direction as indicated by a curve 234 shown in FIG. 33.

The reference signs on the horizontal axis in FIG. 33 indicate positions of points of the same reference signs on a line N-N disclosed in FIG. 32. Meaning of the point a to the point h is similar to that in the description of the ninth embodiment. However, a point c' (f') is a center point of a line segment cd (ef).

Similar to the light reducer 8a in the ninth embodiment, the curve 234 has a minimum value $T_{L1}$ between the point c' and the point f' and has the uniform value $T_{max}$ at positions other than this section.

The light attenuation filter 18 is manufactured in a manner similar to that of the light attenuation filter 8.

Due to the light attenuation filter 18 having such a constitution, the exposure light $L_{1A}$ ($L_{1B}$) transmitted through the field diaphragm 3 and the lens 5a is converted into the exposure light $L_{15A}$ ($L_{15B}$) subjected to light attenuation in accordance with the transmittances of the light reducer 18a and the light transmitter 8b.

According to the exposure apparatus 110, an exposure is performed in a manner similar to that of the exposure apparatus 100A of the ninth embodiment.

In an exposure operation of the exposure apparatus 110, the exposure light $L_{15A}$ and the exposure light $L_{15B}$ emitted from the projection optical unit 15 is transmitted through the light attenuation filter 18. Therefore, the exposure operation thereof differs from the operation of the exposure apparatus 100A in the following points. The light amount distribution of an optical image of the first optical image (second optical image) projected on the exposure subject 6 by the exposure light $L_{15A}$ and the exposure light $L_{15B}$ differs from the light amount distributions of a first optical image $I_{8A}$ and a second optical image $I_{8B}$.

FIG. 34 shows a graph of an integrated light amount in a case where scanning is performed on the exposure subject 6 with the exposure light $L_{15A}$ and the exposure light $L_{15B}$. However, similar to FIG. 31, for easy comparison with the comparative example described above, FIG. 34 shows the integrated light amount at the time of a scanning exposure in a case where the transmittance $T_{max}$ is 100%.

The reference signs i to r on the horizontal axis in FIG. 34 indicate points corresponding to the points a to h in FIG. 32 on the exposure subject 6. However, positions corresponding to the points c' and f' are indicated by reference signs m' and n', respectively. The points j' and q' indicate positions corresponding to the points f' and c' of the light reducer 8a disposed in the second row projection optical system 5B adjacent to the first row projection optical system 5A.

Therefore, each of the section from the point j to the point m and the section from the point n to the point q is the multi-exposure region $A_C$ overlapping the multi-opening regions $r_C$ in a plan view. The section from the point m to the point n is the single exposure region $A_S$ overlapping the single opening regions $r_S$ in a plan view.

In the present embodiment, the light amount correction region $M_2$ irradiated with light transmitted through the light reducer 18a of the light attenuation filter 18 is constituted of a range overlapping the entirety of the single opening region $r_S$ in the X direction and a range overlapping one fourth of the multi-opening regions $r_C$ on both sides in the X direction.

A curve 235 (refer to the solid lines) in FIG. 34 indicates the integrated light amount in the present embodiment, and the curve 233 (refer to one-dot dashed line) indicates the integrated light amount in the comparative example. A curve 236 (refer to the dotted line) indicates the light attenuation amount due to action of each of the light attenuation filters 18.

As indicated by the curve 236, regarding the integrated light amount in the present embodiment, the transmission amount decreases at a uniform ratio in the range of the light amount correction region $M_2$. Therefore, compared to the integrated light amount of the comparative example indicated by the curve 233, the transmission amount entirely decreases in the range of the light amount correction region $M_2$. On the graph, the integrated light amount of the comparative example moves in parallel below. For example, the integrated light amount from the point m to the point n decreases from $q_0$ to Q. Similarly, the light amounts of the region from the point j to the point j', the region from the point m' to the point m, the region from the point n to the point n', and the region from the point q to the point q' decrease to the light amount Q or smaller from the point m to the point n.

Therefore, as indicated by the curve 235, the integrated light amount in the present embodiment indicates Q (here, $q_6<Q<q_0$) in the single exposure region $A_S$ and indicates a light amount distribution oscillating between $q_6$ and Q in the multi-exposure region $A_C$.

Due to the light attenuation filter 18 in the present embodiment, the transmittance $T_{L1}$ and the rate of change in transmittance of the light reducer 18a and the light transmitter 8b are suitably set. Accordingly, the size of the total fluctuation range $Q-q_6$ of the integrated light amount can become smaller than the total fluctuation range $\Delta Q$ of the integrated light amount of the comparative example.

In this manner, in the present embodiment, the total fluctuation range $Q-q_6$ itself of the integrated light amount can be further reduced than that of the comparative example. Moreover, since the extent of unevenness of the exposure amount in the multi-exposure region $A_C$ is also reduced, unevenness of exposure caused by joining of the exposure regions is reduced. Accordingly, for example, a fluctuation or the like of the line width corresponding to the mask pattern P is reduced, and therefore an exposure pattern having higher accuracy can be obtained.

As described above, according to the exposure apparatus 110 of the present embodiment, when a plurality of projection optical systems arranged in a staggered arrangement are used, unevenness of exposure caused by joining of exposure regions can be reduced.

Eleventh Embodiment

An exposure apparatus according to an eleventh embodiment of the present invention will be described.

Figure 35:
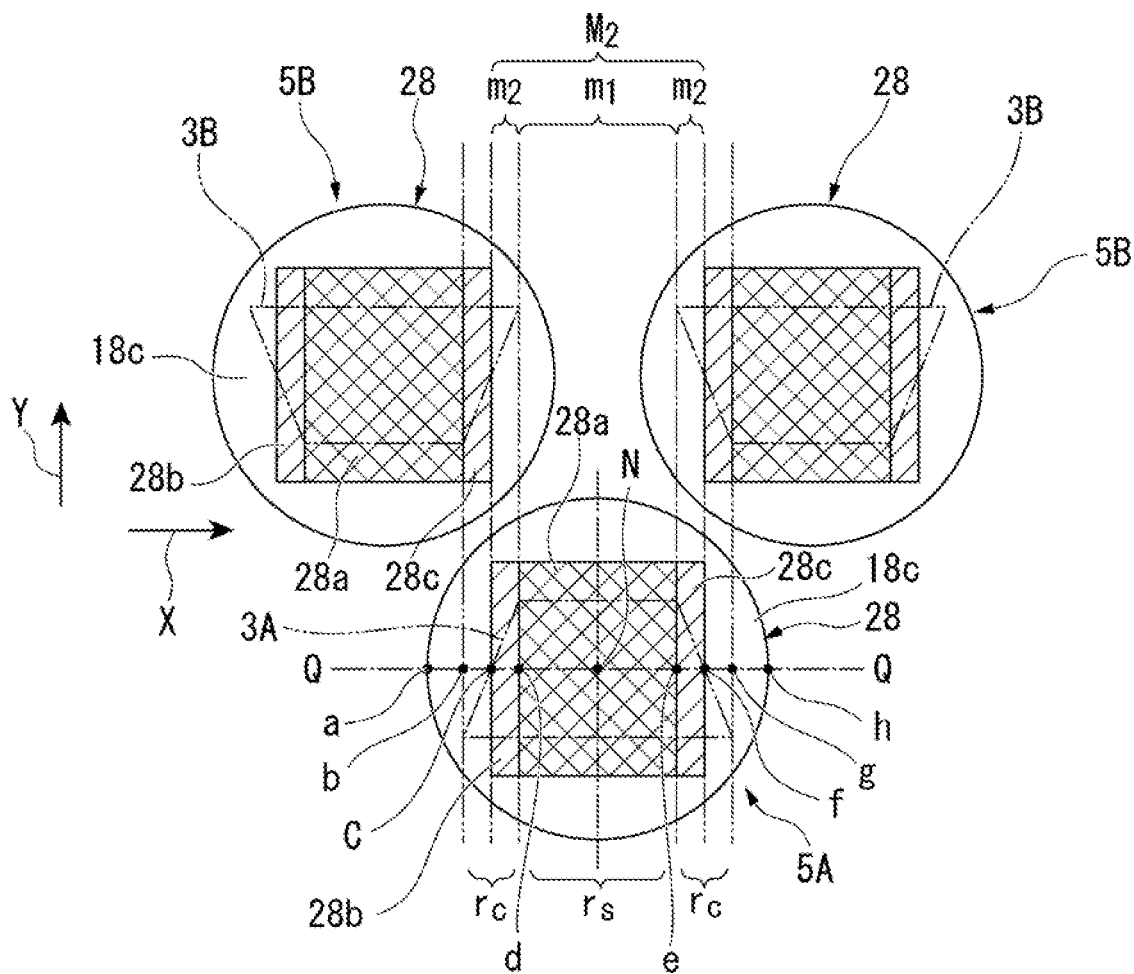
FIG. 35 is a schematic plan view showing an example of the light transmission amount reducer used in an exposure apparatus of an eleventh embodiment of the present invention.
Figure 36:
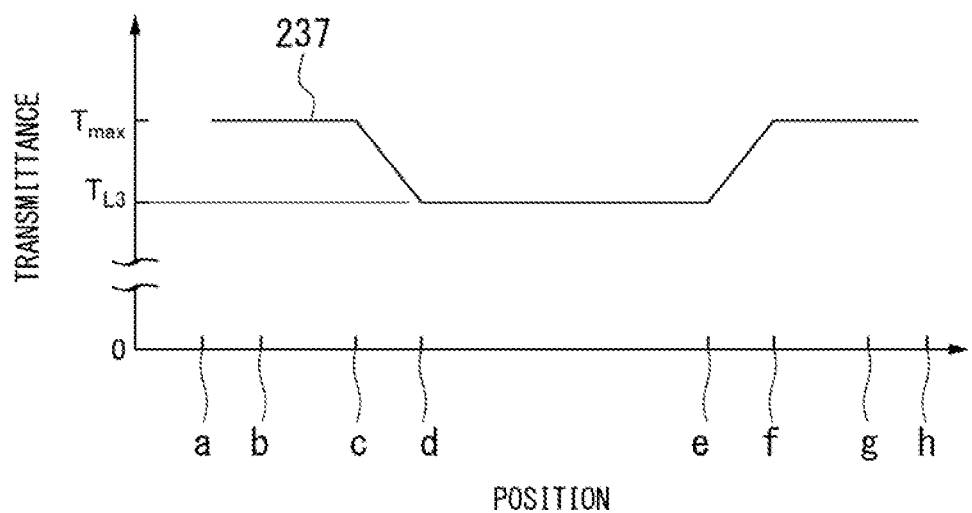
FIG. 36 is a schematic graph showing a transmittance distribution along line Q-Q in FIG. 35.
Figure 37:
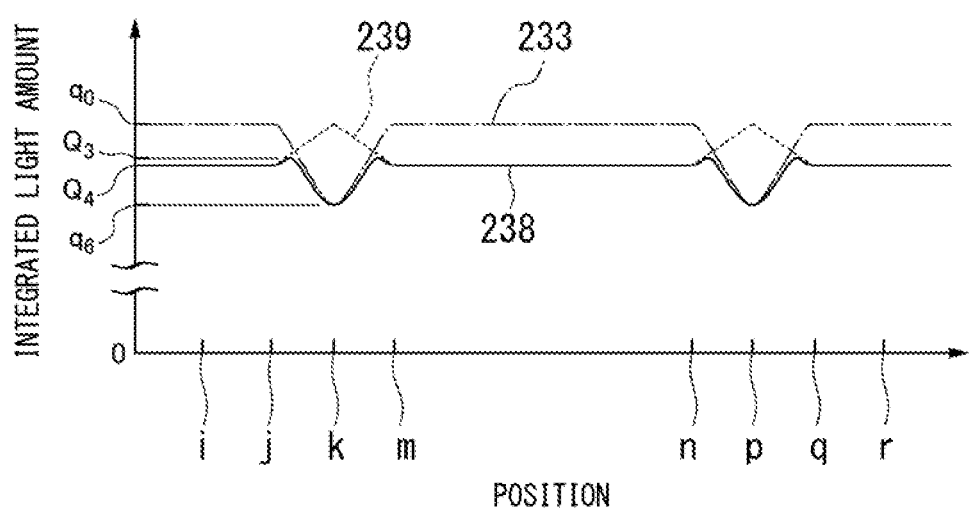
FIG. 37 is a schematic graph describing an integrated light amount in an exposure of the exposure apparatus of the eleventh embodiment of the present invention.

FIG. 35 is a schematic plan view showing an example of the light transmission amount reducer used in the exposure apparatus of the eleventh embodiment of the present invention. FIG. 36 is a schematic graph showing a transmittance distribution along line Q-Q in FIG. 35. In FIG. 36, the horizontal axis of the graph indicates the position in the X direction, and the vertical axis indicates the transmittance. FIG. 37 is a schematic graph describing an integrated light amount in an exposure of the exposure apparatus of the eleventh embodiment of the present invention. In FIG. 37, the horizontal axis of the graph indicates the position in the X direction, and the vertical axis indicates the integrated light amount.

As shown in FIGS. 25 and 26, in place of the projection optical unit 5 of the exposure apparatus 100A of the ninth embodiment, an exposure apparatus 120 of the present embodiment includes a projection optical unit 25.

As shown in FIG. 27, in place of the light attenuation filter 8 of the projection optical unit 5 in the ninth embodiment, the projection optical unit 25 includes a light attenuation filter 28 (light transmission amount reducer).

Hereinafter, points different from the ninth embodiment will be described mainly.

As shown in FIG. 27, similar to the light attenuation filter 8 in the ninth embodiment, the light attenuation filter 28 is disposed in the lower end of the lens barrel 5b in each of the first row projection optical system 5A and the second row projection optical system 5B in the projection optical unit 25. In each of the light attenuation filters 28, a position with respect to the lens 5a is fixed by the filter holder 9c fixed to the lower end of the lens barrel 5b.

The light attenuation filter 28 converts the exposure light $L_{1A}$ ($L_{1B}$) transmitted through the first row projection optical system 5A (second row projection optical system 5B) into exposure light $L_{25A}$ ($L_{25B}$) reduced in at least a portion of the light amount.

The light amount correction region $M_2$ (refer to FIG. 35) similar to that of the tenth embodiment on the exposure subject 6 is irradiated with the exposure light $L_{25A}$ ($L_{25B}$).

As shown in FIG. 35, the light attenuation filter 28 includes a first light reducer 28a (first light transmission amount reducer, that is, a uniform density filter) and a second light reducer 28b (second light transmission amount reducer, that is, a gradient density filter), a third light reducer 28c (second light transmission amount reducer, that is, a gradient density filter), and a light transmitter 18c similar to the light transmitter 8b of the tenth embodiment.

The first light reducer 28a is a part attenuating the exposure light $L_{1A}$ (Liu) transmitted through the field diaphragm 3 and the lens 5a at a uniform transmittance $T_{L3}$ in a first light amount correction region $m_1$ in the first opening 3A (second opening 3B). The first light reducer 28a is formed in a manner similar to that of the light reducer 8a in the ninth embodiment except for a difference in transmittance.

The second light reducer 28b is a part gradually attenuating the exposure light $L_{1A}$ (Liu) transmitted through the field diaphragm 3 and the lens 5a in a range from the transmittance $T_{max}$ to $T_{L3}$ in the second light amount correction region $m_2$ in the first opening 3A (second opening 3B) in the positive direction of the X direction.

The third light reducer 28c is a part gradually attenuating the exposure light $L_{1A}$ ($L_{1B}$) transmitted through the field diaphragm 3 and the lens 5a in a range from the transmittance $T_{max}$ to $T_{L3}$ in the second light amount correction region $m_2$ in the first opening 3A (second opening 3B) in the negative direction of the X direction.

The rate of change in transmittance in the second light reducer 28b and the third light reducer 28c is set based on an experiment or a simulation, for example, in accordance with necessity of correction of the light amount in the light amount correction region $M_2$. The rate of change in transmittance of the second light reducer 28b and the third light reducer 28c may be uniform (linear change) or may change based on a suitable function. The rate of change in transmittance may be monotonous or may be non-monotonous. Moreover, a change in transmittance is not limited to a smooth change. For example, the transmittance may change in a stepped shape.

Due to such a constitution, the light attenuation filter 28 has a transmittance distribution in the X direction as indicated by a curve 237 in FIG. 36.

The reference signs on the horizontal axis in FIG. 36 indicate positions of points of the same reference signs on a line Q-Q disclosed in FIG. 35. Meaning of the point a to the point h is similar to that in the description of the ninth embodiment.

In the curve 237, the point c has the $T_{max}$, the transmittance decreases gradually from the point c toward the point d, and the section from the point d to the point e has the uniform value $T_{L3}$. In the curve 237, the transmittance increases gradually from the point e toward the point f, and the point f has $T_{max}$. The curve 237 exhibits the uniform value $T_{max}$ at positions other than the section.

For example, the light attenuation filter 28 may be manufactured by performing vapor deposition or the like of a thin metal film in parts serving as the first light reducer 28a, the second light reducer 28b, and the third light reducer 28c on a surface of a glass substrate.

Due to the light attenuation filter 28 having such a constitution, the exposure light $L_{1A}$ ($L_{1B}$) transmitted through the field diaphragm 3 and the lens 5a is converted into the exposure light $L_{25A}$ ($L_{25B}$) subjected to light attenuation in accordance with the transmittance of the first light reducer 28a, the second light reducer 28b, the third light reducer 28c, and the light transmitter 18c. The transmittance $T_{L3}$ is selected from a range exceeding 0% to less than 100% such that unevenness of the valid exposure amount (which will be described below) due to the exposure light $L_{25A}$ ($L_{25B}$) can be reduced.

According to the exposure apparatus 120, an exposure is performed in a manner similar to that of the exposure apparatus 100A of the ninth embodiment.

In an exposure operation of the exposure apparatus 120, the exposure light $L_{25A}$ and the exposure light $L_{25B}$ emitted from the projection optical unit 25 is transmitted through the light attenuation filter 28. Therefore, the exposure operation thereof differs from the operation of the exposure apparatus 100A in the following points. The light amount distribution of an optical image of the first optical image (second optical image) projected on the exposure subject 6 by the exposure light $L_{25A}$ and the exposure light $L_{25B}$ differs from the light amount distributions of the first optical image $I_{8A}$ and the second optical image $I_{8B}$.

FIG. 37 shows a graph of an integrated light amount in a case where scanning is performed on the exposure subject 6 with the exposure light $L_{25A}$ and the exposure light $L_{25B}$. However, similar to FIG. 31, for easy comparison with the comparative example described above, FIG. 37 shows the integrated light amount at the time of a scanning exposure in a case where the transmittance $T_{max}$ is 100%.

The reference signs i to r on the horizontal axis in FIG. 37 indicate points corresponding to the points a to h in FIG. 35 on the exposure subject 6.

Therefore, each of the section from the point j to the point m and the section from the point n to the point q is the multi-exposure region $A_C$ overlapping the multi-opening regions $r_C$ in a plan view. The section from the point m to the point n is the single exposure region $A_S$ overlapping the single opening regions $r_S$ in a plan view.

A curve 238 (refer to the solid lines) in FIG. 37 indicates the integrated light amount in the present embodiment, and the curve 233 (refer to one-dot dashed line) indicates the integrated light amount in the comparative example. A curve 239 (refer to the dotted line) indicates the light attenuation amount due to action of each of the light attenuation filters 28.

In the present embodiment, both the single exposure region $A_S$ and the multi-exposure region $A_C$ serve as the light amount correction regions M2. Therefore, compared to the integrated light amount of the comparative example indicated by the curve 233, the integrated light amount in the present embodiment indicated by the curve 238 entirely decreases.

In the present embodiment, the transmittance $T_{L3}$ is set such that the integrated light amount of the first light amount correction region $m_1$ becomes $Q_4$ (here, $q_6<Q_4<q_0$) by the first light reducer 28a.

Therefore, a maximum value $Q_3$ of the integrated light amount of the second light amount correction region $m_2$ by the second light reducer 28b (third light reducer 28c) satisfies $Q_4<Q_3<q_0$. The minimum value for the integrated light amount of the second light amount correction region $m_2$ becomes $q_6$.

As a result, since the total fluctuation range $Q_3-q_6$ of the integrated light amount indicated by the curve 238 becomes smaller (becomes $Q_3-q_6<\Delta Q$) than the fluctuation range $\Delta Q$ of the comparative example, the fluctuation range itself of the integrated light amount is reduced.

Moreover, the value of $Q_4$ which becomes the integrated light amount in a greater part of the single exposure region $A_S$ can be set to a value between $Q_3$ and $q_6$ by suitably setting the transmittance $T_{L3}$. In this case, since the fluctuation range of the integrated light amount $Q_4$ can have a relationship of $(Q_3-q_6)/2(<\Delta Q/2)$, unevenness of exposure caused by joining of the exposure regions is further reduced than that in the ninth embodiment. Accordingly, for example, since a fluctuation in line width of an exposure pattern of the mask pattern P is reduced, it is possible to obtain an exposure pattern in which unevenness is unlikely to be visually recognized in a black matrix of a color filter of a liquid crystal display device produced in accordance with the present invention.

In the tenth embodiment, since the total fluctuation range of the integrated light amount is reduced, a part in which the light amount is further reduced than the lowest integrated light amount in the comparative example is generated. In contrast, according to the light attenuation filter 28 of the present embodiment, the lowest value for the integrated light amount is similar to that of the comparative example. Therefore, according to the present embodiment, a relative decrease amount of the integrated light amount becomes smaller than that in the tenth embodiment.

As described above, according to the exposure apparatus 120 of the present embodiment, when a plurality of projection optical systems arranged in a staggered arrangement are used, unevenness of exposure caused by joining of exposure regions can be reduced.

Modification Example

Next, a specific modification example of the present embodiment in which unevenness of exposure can be further reduced will be described.

Figure 38:
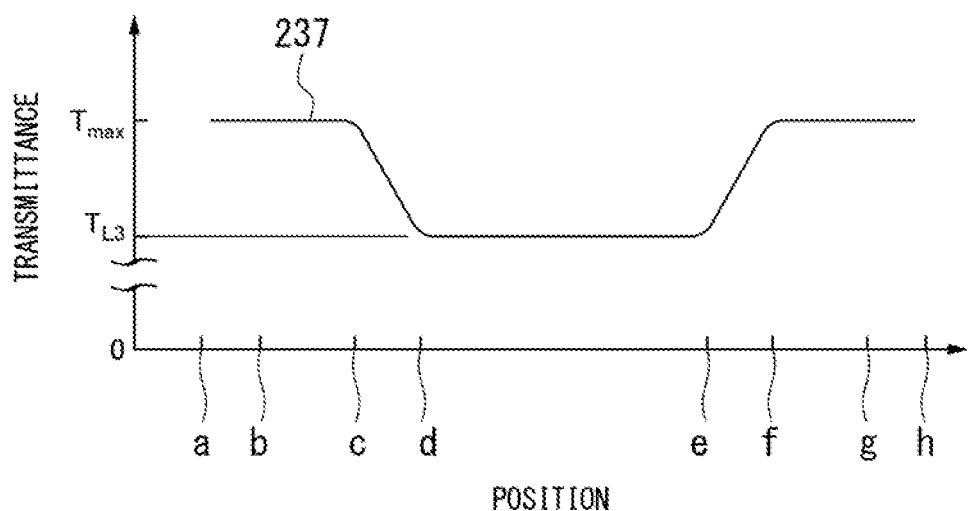
FIG. 38 is a schematic graph showing a transmittance distribution of the light transmission amount reducer of an exposure apparatus in a modification example of the eleventh embodiment of the present invention.
Figure 39:
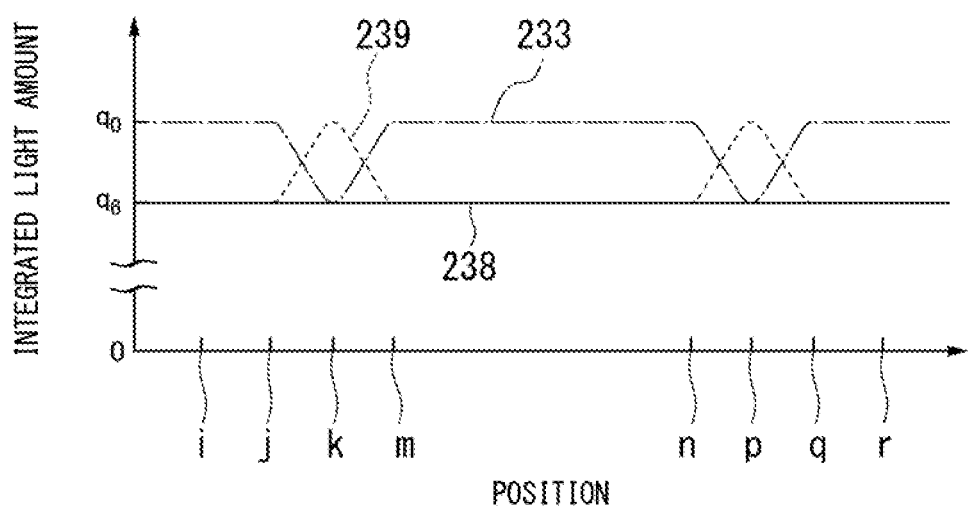
FIG. 39 is a schematic graph describing an integrated light amount in an exposure of the exposure apparatus in the modification example of the eleventh embodiment of the present invention.

FIG. 38 is a schematic graph showing a transmittance distribution of the light transmission amount reducer of an exposure apparatus in a modification example of the eleventh embodiment of the present invention. In FIG. 38, the horizontal axis of the graph indicates the position in the X direction, and the vertical axis indicates the transmittance. FIG. 39 is a schematic graph describing an integrated light amount in an exposure of the exposure apparatus in the modification example of the eleventh embodiment of the present invention. In FIG. 39, the horizontal axis of the graph indicates the position in the X direction, and the vertical axis indicates the integrated light amount.

The present modification example differs from the eleventh embodiment in only set transmittance of the light attenuation filter 28.

As shown in FIG. 38, in the present modification example, the transmittance $T_{L3}$ of the first light reducer 28a has an extent such that the integrated light amount in the single exposure region $A_S$ can be set to $q_6$.

In the present modification example, the transmittance of the second light reducer 28b (third light reducer 28c) is set such that the decrease amount of the valid integrated light amount of the comparative example in the multi-exposure region $A_C$ is offset. That is, the transmittance thereof is set such that the transmittance increases gradually from $T_{L3}$ to $T_{max}$ in a section from the point d toward the point c (from the point e to the point f).

Such an effect of correcting the integrated light amount in the light attenuation filter 28 of the present modification example is indicated by a curve realized by inverting the curve 233 (refer to one-dot dashed line) indicating the integrated light amount of the comparative example in the up-down direction as in the curve 239 (refer to the dotted line) in FIG. 39.

As a result, the valid integrated light amount of exposure light transmitted through the light attenuation filter 28 of the present modification example becomes a uniform value $q_6$ indicated by the curve 238 (refer to the solid lines) in FIG. 39.

In this manner, according to the present modification example, unevenness of exposure can be reduced by optimizing the transmittance distribution of the light attenuation filter 28 with respect to the valid integrated light amount of the comparative example.

In description of each of the embodiments, an example of the case where the light source, the diaphragm, and the projection optical system (which will hereinafter be referred to as a stepper) are fixed, and a scanning exposure is performed by moving the exposure photomask and the exposure target (which will hereinafter be referred to as an exposure object) in the exposure apparatus has been described.

However, regarding a scanning exposure, relative scanning may be performed by relatively moving the stepper and the exposure object in the scanning direction (Y direction, that is, the first direction). Therefore, in the exposure apparatus, the stepper may move in the scanning direction, and the exposure object may be fixed. Moreover, in the exposure apparatus, the stepper and the exposure object may move individually.

In description of each of the embodiments, an example of the case where the first direction and the second direction are orthogonal to each other has been described. However, the first direction and the second direction need only intersect each other in a flat plane, and an intersecting angle is not limited to a right angle.

In description of each of the embodiments, an example of the case where the photomask 1 is moved by the first driver 10 and the exposure subject 6 is moved by the second driver 11 moving the base 7 has been described. However, the photomask 1 and the base 7 may be moved in the scanning direction by one driver.

In description of the first to eighth embodiments, a constitution in which the field diaphragms 3 and 4 manage all the first projection optical systems with one member has been described. In addition, in description of the ninth to eleventh embodiments, a constitution in which the field diaphragms 3 and 4 manage all the projection optical systems with one member has been described. However, in a case of a constitution in which the field diaphragms 3 and 4 does not allow illumination light other than light transmitted through the openings to be incident on the first projection optical systems or the projection optical systems, the field diaphragms 3 and 4 may be constituted of two or more members.

In description of each of the embodiments, an example of the case where the light transmission amount reducer is disposed between the projection optical system and the exposure target has been described. However, the light transmission amount reducer may be disposed at any position as long as it stays between the light source and the exposure target.

In description of the ninth embodiment, an example of the case where the projection optical unit 5 performs an exposure of the entire width of the exposure subject 6 in the X direction has been described. However, if an exposure can be performed by a single photomask 1 with an exposure pattern of the exposure subject 6, the projection optical unit 5 may have a size covering a portion in the X direction. In this case, the exposure subject 6 in its entirety is subjected to an exposure by performing a scanning exposure of the exposure apparatus 100A in the Y direction in the Y direction a plurality of times in a manner of being shifted in the X direction.

Hereinabove, preferable embodiments of the present invention have been described. However, the present invention is not limited to these embodiments. Addition, omission, replacement, and other changes of the constitutions can be made within a range not departing from the gist of the present invention.

In addition, the present invention is not limited by the foregoing description and is limited only by the accompanying claims.

What is claimed is:

1. An exposure apparatus comprising:
a first light source that generates first exposure light;
a diaphragm having a plurality of openings that are formed thereon and arranged in a staggered arrangement with respect to a first axis as a center in a plan view, the plurality of openings being positioned between the first light source and an exposure photomask;
a plurality of first projection optical systems that are disposed while respectively facing the plurality of openings of the diaphragm and individually project an optical image realized by the first exposure light transmitted through each of the plurality of openings on an exposure target;
a second light source that is disposed adjacent to the first light source in a first direction along the first axis and generates second exposure light with which the exposure photomask is irradiated; and
a correction stepper that is disposed on an optical path of the second exposure light between the exposure photomask and the exposure target, wherein
opening widths of the plurality of openings in the first direction are uniform in a second direction along a second axis intersecting the first axis in a plan view,
in the diaphragm, multi-opening regions in which two openings of the plurality of openings are adjacent to each other with a space therebetween in the first direction and single opening regions in which one opening of the plurality of openings opens in the first direction are formed alternately in the second direction, and
the correction stepper irradiates a light amount correction region with the second exposure light so as to limit an irradiation range of the exposure target to be irradiated with the second exposure light transmitted through the exposure photomask, and the light amount correction region is a region extending in the first direction by a width of the multi-opening region in the second direction in a plan view.

2. The exposure apparatus according to claim 1, wherein the correction stepper performs irradiation of the second exposure light such that an integrated light amount of the second exposure light in the first direction in the light amount correction region becomes higher at a center than at both ends of the light amount correction region in the second direction.

3. The exposure apparatus according to claim 1, wherein the correction stepper comprises
   a second projection optical system that projects the second exposure light toward the exposure target, and
   a light transmission amount restrictor that restricts the second exposure light within a range of the light amount correction region between the exposure photomask and the exposure target.

4. The exposure apparatus according to claim 3, wherein the light transmission amount restrictor is disposed between the second projection optical system and the exposure target.

5. The exposure apparatus according to claim 3, wherein the light transmission amount restrictor comprises a light attenuation filter.

6. The exposure apparatus according to claim 3, wherein the light transmission amount restrictor comprises an opening diaphragm.

7. The exposure apparatus according to claim 3, wherein the light transmission amount restrictor comprises a liquid crystal shutter.

8. An exposure method comprising:
preparing a diaphragm having a plurality of openings that are formed thereon and arranged in a staggered arrangement with respect to a first axis as a center in a plan view;
performing relative scanning in a first direction along a first axis with respect to an exposure photomask and an exposure target using first exposure light transmitted through the plurality of openings of the diaphragm, thereby performing a first exposure that projects an optical image of the exposure photomask realized by the first exposure light on the exposure target; and
irradiating the exposure photomask with second exposure light before or after the first exposure and performing relative scanning in the first direction with respect to the exposure photomask and the exposure target using the second exposure light transmitted through the exposure photomask, thereby performing a second exposure that projects an optical image of the exposure photomask realized by the second exposure light on the exposure target, wherein
opening widths of the plurality of openings in the first direction are uniform in a second direction along a second axis intersecting the first axis in a plan view,
in the diaphragm, multi-opening regions in which two openings of the plurality of openings are adjacent to each other with a space therebetween in the first direction and single opening regions in which one opening of the plurality of openings opens in the first direction are formed alternately in the second direction, and
when the second exposure is performed, the exposure target is irradiated with the second exposure light so as to limit a light amount correction region which is a region extending in the first direction by a width of the multi-opening region in the second direction in a plan view.

9. An exposure apparatus comprising:
a light source that generates exposure light;
a diaphragm having a plurality of openings that are formed thereon and arranged in a staggered arrangement with respect to a first axis as a center in a plan view, the plurality of openings being positioned between the light source and an exposure photomask;
a plurality of projection optical systems that are disposed while respectively facing the plurality of openings of the diaphragm and individually project an optical image realized by the exposure light transmitted through each of the plurality of openings on an exposure target; and
a light transmission amount reducer that is disposed on an optical path of the exposure light between the light source and the exposure target, wherein
opening widths of the plurality of openings in a first direction along the first axis are uniform in a second direction along a second axis intersecting the first axis in a plan view,
in the diaphragm, multi-opening regions in which two openings of the plurality of openings are adjacent to each other with a space therebetween in the first direction and single opening regions in which one opening of the plurality of openings opens in the first direction are formed alternately in the second direction,
the light transmission amount reducer comprises:
   a first light transmission amount reducer that reduces the light amount of the exposure light with which first light amount correction regions on the exposure target overlapping at least the single opening regions in a plan view are irradiated; and
   a second light transmission amount reducer that is provided adjacent to the first light transmission amount reducer in the second direction and reduces the light amount of the exposure light with which second light amount correction regions on the exposure target overlapping the multi-opening regions in a plan view are irradiated, and wherein
the light transmission amount reducer reduces a light amount of the exposure light with which light amount correction regions on the exposure target respectively overlapping at least the single opening regions in a plan view are irradiated.

10. The exposure apparatus according to claim 9, wherein the first light transmission amount reducer comprises a uniform density filter that uniformly decreases a transmittance of the exposure light, and
the second light transmission amount reducer comprises a gradient density filter that increases the transmittance of the exposure light while being away from a part adjacent to the first light transmission amount reducer in the second direction.

11. The exposure apparatus according to claim 9, wherein the light transmission amount reducer is disposed between the projection optical systems and the exposure target.

12. An exposure method comprising:
preparing a diaphragm having a plurality of openings that are formed thereon and arranged in a staggered arrangement with respect to a first axis as a center in a plan view; and
performing relative scanning in a first direction along a first axis with respect to an exposure photomask and an exposure target using exposure light transmitted through the plurality of openings of the diaphragm, performing an exposure that projects an optical image of the exposure photomask realized by the exposure light on the exposure target, wherein opening widths of the plurality of openings in the first direction are uniform in a second direction along a second axis intersecting the first axis in a plan view, in the diaphragm, multi-opening regions in which two openings of the plurality of openings are adjacent to each other with a space therebetween in the first direction and single opening regions in which one opening of the plurality of openings opens in the first direction are formed alternately in the second direction, and when the exposure is performed, a light amount of the exposure light with which light amount correction regions on the exposure target respectively overlapping at least the single opening regions in a plan view are irradiated is reduced by a light transmission amount reducer that is disposed on an optical path of the exposure light between a light source generating the exposure light and the exposure target.

* * * * *